United States Patent
Lee et al.

(10) Patent No.: US 11,640,223 B2
(45) Date of Patent: May 2, 2023

(54) SENSING UNIT, DISPLAY DEVICE, AND METHOD OF DRIVING THE DISPLAY DEVICE

(71) Applicant: SAMSUNG DISPLAY CO., LTD., Yongin-si (KR)

(72) Inventors: Choon Hyop Lee, Anyang-si (KR); Kang Won Lee, Seoul (KR); Ga Young Kim, Hwaseong-si (KR); Jang Hui Kim, Suwon-si (KR); A Ra Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/850,892

(22) Filed: Jun. 27, 2022

(65) Prior Publication Data

US 2022/0326813 A1   Oct. 13, 2022

Related U.S. Application Data

(63) Continuation of application No. 16/848,694, filed on Apr. 14, 2020, now Pat. No. 11,372,508.

(30) Foreign Application Priority Data

Sep. 2, 2019   (KR) .................. KR10-2019-0108413

(51) Int. Cl.
  *G06F 3/044*   (2006.01)
  *G06F 3/041*   (2006.01)
  *H01L 27/32*   (2006.01)

(52) U.S. Cl.
  CPC .......... *G06F 3/0446* (2019.05); *G06F 3/0412* (2013.01); *H01L 27/323* (2013.01); *G06F 2203/04112* (2013.01)

(58) Field of Classification Search
  CPC .... G06F 3/0446; G06F 3/0448; G06F 3/0412; G06F 2203/04108; G06F 2203/04111; G06F 2203/04112; H01L 27/323
  See application file for complete search history.

(56) References Cited

U.S. PATENT DOCUMENTS

| | | |
|---|---|---|
| 2015/0160754 A1 * | 6/2015 | Wenzel ............. G06F 3/041662 345/174 |
| 2016/0357317 A1 | 12/2016 | Kim et al. |
| 2017/0255314 A1 | 9/2017 | Choi |
| 2018/0329576 A1 | 11/2018 | Kim et al. |
| 2019/0121463 A1 | 4/2019 | Park et al. |
| 2019/0158643 A1 | 5/2019 | Zhang et al. |
| 2019/0369833 A1 | 12/2019 | Kubo |

FOREIGN PATENT DOCUMENTS

| | | |
|---|---|---|
| JP | WO2011/055534 A1 | 3/2013 |
| KR | 10-2018-0050473 A | 5/2018 |
| KR | 10-2018-0090936 A | 8/2018 |
| KR | 10-2018-0125914 A | 11/2018 |

\* cited by examiner

*Primary Examiner* — Deeprose Subedi
(74) *Attorney, Agent, or Firm* — Lewis Roca Rothgerber Christie LLP

(57) ABSTRACT

A sensing circuit includes: a plurality of sensor electrodes; a first capacitance between the sensor electrodes; a plurality of proximity sensing electrodes electrically isolated from the sensor electrodes; and a second capacitance between at least one of the sensor electrodes and the proximity sensing electrodes. A density of at least one of the proximity sensing electrodes is less than a density of at least one of the sensor electrodes.

20 Claims, 29 Drawing Sheets

SENSING UNIT, DISPLAY DEVICE, AND METHOD OF DRIVING THE DISPLAY DEVICE

CROSS-REFERENCE TO RELATED APPLICATIONS

This application is a continuation of U.S. patent application Ser. No. 16/848,694, filed Apr. 14, 2020, which claims priority to and the benefit of Korean Patent Application No. 10-2019-0108413, filed Sep. 2, 2019, the entire content of both of which is incorporated herein by reference.

BACKGROUND

1. Field

Aspects of example embodiments of the present disclosure relate to a sensing unit (e.g., a sensing circuit or a sensing layer), a display device, and a method of driving the display device.

2. Description of the Related Art

As information society has developed, the demand for display devices for displaying images has increased and diversified. For example, display devices have been applied to a variety of electronic devices, such as a smart phone, a digital camera, a notebook computer, a navigation device, a smart television (TV), and the like. A display device may include a display panel for displaying an image. The display device may include various sensors, for example, such as a proximity sensor for detecting the presence of a user at the front of the display device, an illumination sensor for detecting the illuminance at the front of the display device, an iris sensor for recognizing the user's iris, and/or the like.

As the application of display devices has diversified, the demand for display devices in various designs has increased. For example, for a smartphone, a display device capable of minimizing a non-display area may be desired, and sensors may be disposed at (e.g., in or on) a display area, rather than at (e.g., in or on) the non-display area. In this case, however, the sensors may be partially hidden by metal layers of pixels of a display panel, and as a result, the sensing sensitivity of the sensors may be decreased (e.g., may be lowered).

The above information disclosed in this Background section is for enhancement of understanding of the background of the present disclosure, and therefore, it may contain information that does not constitute prior art.

SUMMARY

One or more example embodiments of the present disclosure are directed to a sensing unit (e.g., a sensing circuit or a sensing layer) capable of improving the sensing sensitivity of sensors disposed at (e.g., in or on) a display area.

One or more example embodiments of the present disclosure are directed to a display device capable of improving the sensing sensitivity of sensors disposed at (e.g., in or on) a display area.

One or more example embodiments of the present disclosure are directed to a method of driving a display device capable of improving the sensing sensitivity of sensors disposed at (e.g., in or on) a display area.

Additional aspects and features of some of the example embodiments of the present disclosure will be set forth in the description which follows, and in part, will become apparent to those skilled in the art from the following description, or may be learned by practicing one or more example embodiments of the present disclosure.

According to one or more example embodiments of the present invention, a sensing circuit includes: a plurality of sensor electrodes; a first capacitance between the sensor electrodes; a plurality of proximity sensing electrodes electrically isolated from the sensor electrodes; and a second capacitance between at least one of the sensor electrodes and the proximity sensing electrodes. A density of at least one of the proximity sensing electrodes is less than a density of at least one of the sensor electrodes.

In an example embodiment, the proximity sensing electrodes and the sensor electrodes may have a mesh structure in a plan view; and a mesh hole size of at least one of the proximity sensing electrodes may be greater than mesh hole sizes of the sensor electrodes.

In an example embodiment, the sensing circuit may further include: dummy patterns electrically isolated from the sensor electrodes and the proximity sensing electrodes, and surrounded by some of the sensor electrodes, and a density of at least one of the proximity sensing electrodes may be smaller than a density of at least one of the dummy patterns.

In an example embodiment, the proximity sensing electrodes and the dummy patterns may have a mesh structure in a plan view; and a mesh hole size of at least one of the proximity sensing electrodes may be greater than mesh hole sizes of the dummy patterns.

In an example embodiment, the sensing circuit may further include: bridges electrically isolated from the sensor electrodes, and connecting adjacent ones of the proximity sensing electrodes in a first direction to each other.

According to one or more example embodiments of the present invention, a sensing circuit includes: a plurality of sensor electrodes; a first capacitance between the sensor electrodes; and dummy patterns electrically isolated from the sensor electrodes, the dummy patterns being electrically floated. A density of at least one of the dummy patterns may be less than a density of at least one of the sensor electrodes.

In an example embodiment, the dummy patterns and the sensor electrodes may have a mesh structure in a plan view; and a mesh hole size of at least one of the dummy patterns may be greater than mesh hole sizes of the sensor electrodes.

In an example embodiment, the sensing circuit may further include: proximity sensing electrodes electrically isolated from the sensor electrodes; and a second capacitance between at least one of the sensor electrodes and the proximity sensing electrodes. A density of at least one of the dummy patterns may be greater than a density of at least one of the proximity sensing electrodes.

In an example embodiment, the dummy patterns and the proximity sensing electrodes may have a mesh structure in a plan view, and a mesh hole size of at least one of the dummy patterns may be greater than mesh hole sizes of the proximity sensing electrodes.

In an example embodiment, the at least one of the dummy patterns is located between the proximity sensing electrodes that are adjacent to one another in a first direction.

In an example embodiment, the sensing circuit may further include: bridges electrically isolated from the sensor electrodes, and connecting adjacent ones of the proximity sensing electrodes in the first direction to each other.

In an example embodiment, the bridges may bypass the dummy patterns.

In an example embodiment, the sensing circuit may have a mesh structure in a plan view; and a distance between the bridges and the sensor electrodes may be greater than a maximum length of mesh holes of each of the sensor electrodes.

According to one or more example embodiments of the present invention, a sensing circuit includes: a plurality of sensor electrodes; a first capacitance between the sensor electrodes; a plurality of proximity sensing electrodes electrically isolated from the sensor electrodes; a second capacitance between at least one of the sensor electrodes and the proximity sensing electrodes; and bridges electrically isolated from the sensor electrodes, and connecting adjacent ones of the proximity sensing electrodes in a first direction to each other. The sensing circuit may have an empty space surrounded by one of the sensor electrodes.

In an example embodiment, the bridges may extend across the empty space.

In an example embodiment, the bridges may bypass the empty space.

In an example embodiment, the sensing circuit may have a mesh structure in a plan view, and a distance between the bridges and the sensor electrodes may be greater than a maximum length of mesh holes of each of the sensor electrodes.

According to one or more example embodiments, a display device includes: a display circuit on a first surface of a substrate, the display circuit including a main display area and a sub-display area; a sensing circuit on the display circuit, the sensing circuit including a first sensing area overlapping with the main display area, and a second sensing area overlapping with the sub-display area; and a sensor on a second surface of the substrate opposite to the first surface of the substrate. The second sensing area includes sensor electrodes, proximity sensing electrodes, and dummy patterns, the proximity sensing electrodes and the dummy patterns being surrounded by the sensor electrodes, and the sensor overlaps with at least one of the proximity sensing electrodes and/or at least one of the dummy patterns.

In an example embodiment, a density of at least one of the proximity sensing electrodes may be smaller than a density of at least one of the sensor electrodes.

In an example embodiment, the proximity sensing electrodes and the sensor electrodes may have a mesh structure in a plan view, and a mesh hole size of at least one of the proximity sensing electrodes may be greater than mesh hole sizes of the sensor electrodes.

In an example embodiment, a density of at least one of the proximity sensing electrodes may be smaller than a density of at least one of the dummy patterns.

In an example embodiment, the proximity sensing electrodes and the dummy patterns may have a mesh structure in a plan view, and a mesh hole size of at least one of the proximity sensing electrodes may be greater than mesh hole sizes of the dummy patterns.

In an example embodiment, a density of at least one of the dummy patterns may be smaller than a density of at least one of the sensor electrodes.

In an example embodiment, the dummy patterns and the sensor electrodes may have a mesh structure in a plan view, and a mesh hole size of at least one of the dummy patterns may be greater than mesh hole sizes of the sensor electrodes.

In an example embodiment, the display device may further include: bridges electrically isolated from the sensor electrodes, and connecting adjacent ones of the proximity sensing electrodes in a first direction to each other, and the bridges may not overlap with the sensor.

In an example embodiment, the first sensing area may include sensor electrodes and dummy patterns.

According to one or more example embodiments of the present invention, a method of driving a display device includes: determining, by a proximity sensor, whether an object is within a proximity of a top surface of a display panel, the display panel being turned off in response to the proximity sensor determining that the object is within the proximity of the top surface of the display panel; determining, by the proximity sensor, that the object is not within the proximity of the top surface of the display panel; determining, by a sensing circuit of the display panel, whether the object is within the proximity of the top surface of the display panel according to a mutual capacitance between driving electrodes and proximity sensing electrodes of the sensing circuit, in response to the proximity sensor determining that the object is not within the proximity of the top surface of the display panel; determining, by the sensing circuit, that the object is within the proximity of the top surface of the display panel according to the mutual capacitance; and turning off the display panel in response to the sensing circuit determining that the object is within the proximity of the top surface of the display panel according to the mutual capacitance.

According to one or more of the aforementioned and other example embodiments of the present disclosure, because a sub-display area may include transmissive parts, sensors that overlap with the sub-display area may receive light from the top of a display panel through the transmissive parts. Thus, even when the sensors are disposed at the bottom of the display panel, the sensing capabilities of the sensors may be prevented or substantially prevented from decreasing.

According to some example embodiments, a proximity sensor electrode or a dummy pattern that overlaps with a sensor may be formed to have a smaller density than a proximity sensor electrode or a dummy pattern that does not overlap with the sensor. The proximity sensor electrode or the dummy pattern that overlaps with the sensor may be formed to have a smaller density than driving electrodes and/or sensing electrodes. Accordingly, the transmittance of a sensing unit (e.g., a sensing circuit or a sensing layer) of a display panel that overlaps with the sensor may be enhanced, and as a result, the degradation of the sensing capability of the sensing unit may be prevented or reduced, even when the sensor is disposed at the bottom of the display panel.

According to some example embodiments, the presence of a proximity input from a user may be detected by applying a sensing driving signal to a plurality of columns of driving electrodes concurrently (e.g., simultaneously or at the same time), and sensing the voltages charged in a mutual capacitance via a plurality of rows of proximity sensing electrodes. Accordingly, even when one of the proximity sensing electrodes is omitted or the density of one of the proximity sensing electrodes is reduced, the degradation of the performance of proximity sensing may be prevented or reduced.

According to some example embodiments, a sensing area may overlap with a sensor and may include an empty space surrounded (e.g., around a periphery thereof) by a sensor electrode. Accordingly, the transmittance of the sensing unit of the display panel may be enhanced, and as a result, the degradation of the sensing capability of the sensing unit may be prevented or reduced, even when the sensor is disposed at the bottom of the display panel.

According to some example embodiments, the presence of an object within the proximity of the top surface of a display device may be detected not only by using a proximity sensor, but also by using the sensing unit of the display panel. Accordingly, the degradation of the sensing capability of the proximity sensor may be compensated for by the sensing unit of the display panel.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
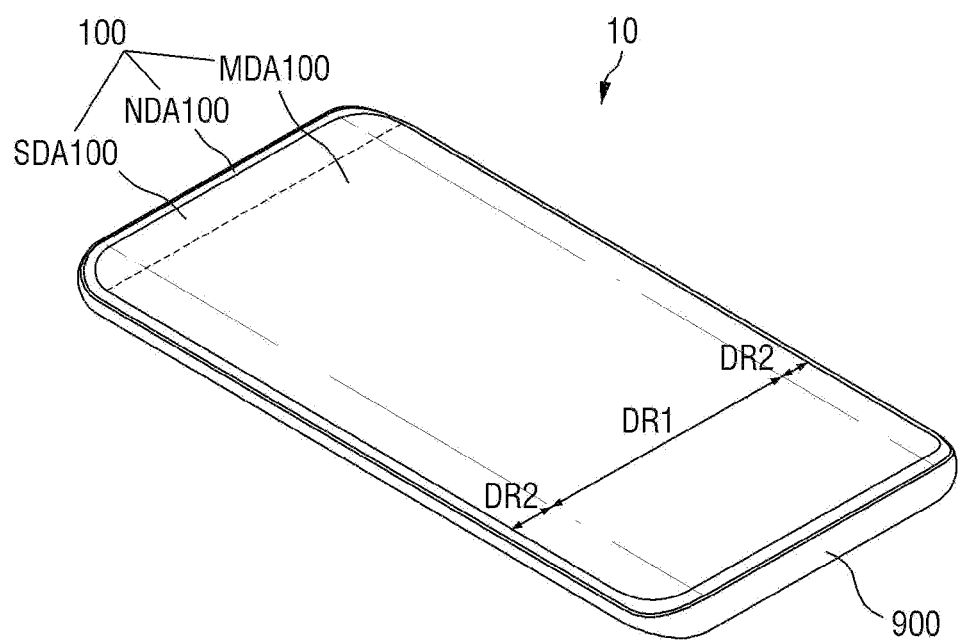
FIG. 1 is a perspective view of a display device according to an embodiment of the present disclosure.

In the following description, for the purposes of explanation, various specific details are set forth in order to provide a thorough understanding of the various example embodiments or implementations of the present invention. As used herein "embodiments" and "implementations" may be interchangeable words that are non-limiting examples of devices or methods employing one or more of the aspects and features of the example embodiments disclosed herein. It is apparent, however, that various example embodiments may be practiced without these specific details or with one or more equivalent arrangements. Further, various example embodiments may be different from each other, but are not necessarily exclusive unless otherwise specified. For example, specific shapes, configurations, and/or characteristics of an example embodiment may be used or implemented with those of another example embodiment without departing from the spirit and scope of the present invention.

Unless otherwise specified, the illustrated example embodiments are to be understood as providing example features of varying detail of some example embodiments in which the present invention may be implemented in practice. Therefore, unless otherwise specified, the features, components, modules, layers, films, panels, regions, aspects, and/or the like (hereinafter individually or collectively referred to as "elements") of the various example embodiments may be otherwise combined, separated, interchanged, and/or rearranged with each other, or with other embodiments, without departing from the spirit and scope of the present invention.

As used herein, cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, and/or the like of the elements, unless otherwise specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed at the same or substantially at the same time, or may be performed in an order opposite to the described order. Also, like reference numerals denote like elements throughout.

When an element, such as a layer, is referred to as being "on," "connected to," or "coupled to" another element or layer, it may be directly on, connected to, or coupled to the other element or layer or one or more intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connections, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for example, XYZ, XYY, YZ, and ZZ. As used herein, the term "and/or" includes any and all combinations of one or more of the associated listed items.

Although the terms "first," "second," etc., may be used herein to describe various types of elements, these elements should not be limited by these terms. These terms are used to distinguish one element from another element. Thus, a first element discussed below could be termed a second element without departing from the spirit and scope of the present disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Various example embodiments are described herein with reference to sectional and/or exploded illustrations that are schematic illustrations of some example embodiments and/or intermediate structures. As such, variations from the shapes of the illustrations resulting from, for example, manufacturing techniques and/or tolerances, are to be expected. Thus, example embodiments disclosed herein should not be construed as limited to the particular illustrated shapes of regions, but are to include variations in shapes that result from, for example, a manufacturing process. In this regard, regions illustrated in the drawings may be schematic in nature, and the shapes of these regions may not reflect the actual shapes of regions of a device, and as such, are not necessarily intended to be limiting.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and/or the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein, and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the spirit and scope of the present invention. Further, the blocks, units, and/or modules of some example embodiments may be physically combined into more complex blocks, units, and/or modules without departing from the spirit and scope of the present invention.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
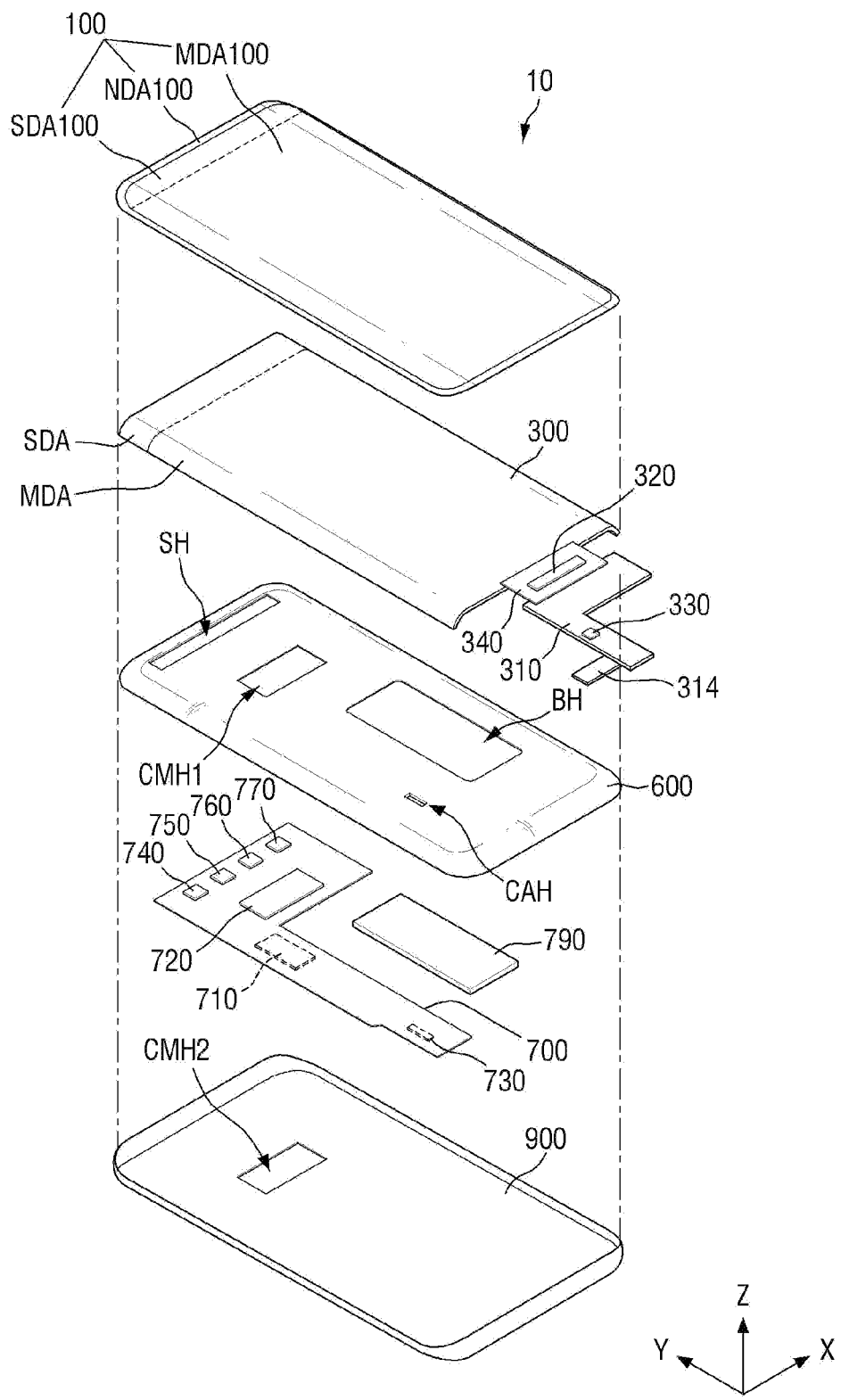
FIG. 2 is an exploded perspective view of the display device of FIG. 1.

FIG. 1 is a perspective view of a display device according to an embodiment of the present disclosure. FIG. 2 is an exploded perspective view of the display device of FIG. 1.

Referring to FIGS. 1 and 2, a display device 10 includes a cover window 100, a display panel 300, a display circuit board 310, a display driving unit (e.g., a display driver) 320, a flexible film 340, a bracket 600, a main circuit board 700, sensors 740, 750, 760, and 770, and a lower cover 900.

As used herein, the terms "above", "top", and "top surface" may denote a direction in which the cover window 100 is disposed with respect to the display panel 300 (e.g., a Z-axis direction), and the terms "below", "bottom", and "bottom surface" may denote a direction in which the bracket 600 is disposed with respect to the display panel 300 (e.g., a direction opposite to the Z-axis direction). Also, as used herein, the terms "right", "left", "upper", and "lower" may denote directions when viewed from above the display panel 300. For example, the term "right" may denote an X-axis direction, the term "left" may denote a direction opposite to the X-axis direction, the term "upper" may denote a Y-axis direction, and the term "lower" may denote a direction opposite to the Y-axis direction.

The display device 10 may be a device for displaying a moving image and/or a still image. The display device 10 may be used for a portable electronic device, for example, such as a mobile phone, a smartphone, a tablet personal computer (PC), a smart watch, a watch phone, a mobile communication terminal, an electronic notebook, an electronic book, a portable multimedia player (PMP), a navigation device, an ultra-mobile PC (UMPC), and/or the like, as well as for various other suitable devices and/or products, for example, such as a television (TV), a notebook computer, a monitor, a billboard, an Internet-of-Things (IoT) device, and/or the like.

The display device 10 may have a rectangular shape in a plan view. As used herein, a plan view may refer to a view from a plane that is parallel to or substantially parallel to (e.g., normal to) a top surface of the relevant device, component, element, or layer (e.g., the display device 10). For example, the display device 10 may have a rectangular shape having a pair of short sides extending in a first direction (e.g., the X-axis direction), and a pair of long sides extending in a second direction (e.g., the Y-axis direction). As illustrated in FIGS. 1 and 2, the display device 10 may have corners where the short sides and the long sides of the display device 10 converge (e.g., meet), and the corners may be rounded to have a curvature (e.g., a predetermined curvature) or may be right-angled. However, the shape of the display device 10 is not limited thereto, and the display device 10 may be formed to have various suitable shapes, for example, such as various other polygonal shapes, a circular shape, an elliptical shape, and/or the like.

The display device 10 may include a first region DR1, and a plurality of second regions DR2. The first region DR1 may be disposed between the second regions DR2. For example, the first region DR1 may be formed to be flat, and the second regions DR2 may extend from left and right sides of the first region DR1. The second regions DR2 may be formed to be flat or may be formed to be curved. In a case where the second regions DR2 are formed to be flat, an angle formed between the first region DR1 and a corresponding one of the second regions DR2 may be an obtuse angle. In a case where the second regions DR2 are formed to be curved, the second regions DR2 may have a uniform or variable curvature.

FIG. 1 illustrates that the second regions DR2 extend from the left and right sides of the first region DR1, but the present disclosure is not limited thereto. For example, the second regions DR2 may extend from only one of the left and right sides of the first region DR1. In another example, the second regions DR2 may extend from the upper and lower sides of the first region DR1, in addition to or instead of extending from the left and right sides of the first region DR1. For convenience, the second regions DR2 will be described hereinafter as being disposed on the left and right sides of the display device 10.

The cover window 100 may be disposed on the display panel 300 to cover the top surface of the display panel 300. Accordingly, the cover window 100 may protect the top surface of the display panel 300.

The cover window 100 may be disposed at (e.g., in or on) the first region DR1 and at (e.g., in or on) the second regions DR2. The cover window 100 may include first and second transmissive parts MDA100 and SDA100, which correspond to the display panel 300, and a light-blocking part NDA100, which corresponds to an area (e.g., a peripheral area) other than the display panel 300. The second transmissive part SDA100 may be disposed at (e.g., on) one side of the first transmissive part MDA100, for example, at (e.g., on) the upper side of the first transmissive part MDA100, as illustrated in FIGS. 1 and 2. The first and second transmissive parts MDA100 and SDA100 may be disposed at (e.g., in or on) the first region DR1 and at (e.g., in or on) the second regions DR2. The light-blocking part NDA100 may be formed to be opaque. The light-blocking part NDA100 may include a decorative layer that may be viewed (e.g., may be seen) by a user when no image is displayed.

The display panel 300 may be disposed below the cover window 100. The display panel 300 may be disposed at (e.g., in or on) the first region DR1 and at (e.g., in or on) the second regions DR2. Accordingly, an image displayed by the display panel 300 may be viewed at (e.g., in or on) the first region DR1, as well as at (e.g., in or on) the second regions DR2. In other words, an image displayed by the display panel 300 may be viewed at (e.g., in or on) the top surface of the display device 10 through the cover window 100, as well as at (e.g., in or on) the left and right edges of the display device 10 through the cover window 100.

The display panel 300 may include a main display area MDA and a sub-display area SDA. The main display area MDA may be disposed to overlap with the first transmissive part MDA100 of the cover window 100. The sub-display area SDA may be disposed to overlap with the second transmissive part SDA100 of the cover window 100. The sub-display area SDA may be disposed at (e.g., on) one side of the main display area MDA, for example, at (e.g., on) the upper side of the main display area MDA as illustrated in FIG. 2, but the present disclosure is not limited thereto. For example, the sub-display area SDA may be disposed adjacent to corners of the display panel 300, and may be surrounded (e.g., around a periphery thereof or partially around a periphery thereof) by the main display area MDA. FIG. 2 illustrates that the display panel 300 includes a single sub-display area SDA, but the present disclosure is not limited thereto. For example, the display panel 300 may include a plurality of (e.g., may include multiple) sub-display areas SDA.

The display panel 300 may be a light-emitting display panel including light-emitting elements. For example, the display panel 300 may be an organic light-emitting diode (OLED) display panel using OLEDs, a micro-light-emitting diode (AED) display panel using μLEDs, a quantum-dot light-emitting diode (QLED) display panel using QLEDs, an inorganic light-emitting diode (ILED) display panel including an inorganic semiconductor, and/or the like. For convenience, the display panel 300 will be described hereinafter as being an OLED display panel.

One end of the display circuit board 310 may be connected to (e.g., may be attached to) one side of the display panel 300. The display circuit board 310 may be a flexible printed circuit board (FPCB), a rigid printed circuit board (PCB), a hybrid PCB, and/or the like.

The display driving unit 320 receives control signals and power supply voltages via the display circuit board 310, and generates and/or outputs signals and voltages for driving the display panel 300. The display driving unit 320 may be formed as an integrated circuit (IC) to be connected to (e.g., to be attached on or mounted on) the flexible film 340 in a chip-on-film (COF) manner, or to be connected to (e.g., to be attached on or mounted on) the display panel 300 in a chip-on-glass (COG) manner, a chip-on-plastic (COP) manner, or through ultrasonic bonding, but the present disclosure is not limited thereto.

A sensing driving unit (e.g., a sensing driver) 330 may be disposed on the display circuit board 310. The sensing driving unit 330 may be formed as an IC, and may be connected to (e.g., may be attached on or mounted on) the top surface of the display circuit board 310. The sensing driving unit 330 may be electrically connected to touch electrodes of a touch sensor layer of the display panel 300 via the display circuit board 310. The sensing driving unit 330 may output touch data, which includes coordinates of a touch input from the user. For example, the sensing driving unit 330 may apply touch driving signals to some of the touch electrodes (e.g., driving electrodes) of the touch sensor layer, and may detect charge variations in the capacitance between the driving electrodes and other touch electrodes (e.g., sensor electrodes) of the touch sensor layer to output the touch data. A power supply unit (e.g., a power supply) may be further disposed on the display circuit board 310. The power supply unit may provide display driving voltages for driving the display driving unit 320.

Figure 3A:
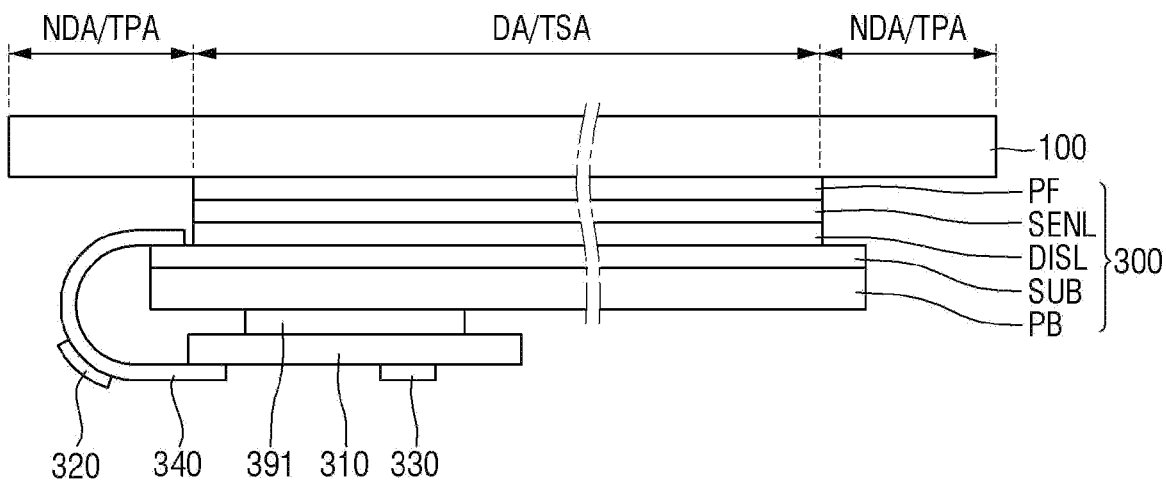
FIGS. 3A-3B are side views illustrating a display panel and a display driving unit of the display device of FIG. 1.

In some embodiments, the flexible film 340 may be a film that is flexible, bendable, foldable, and/or the like. For example, in some embodiments, the flexible film 340 may be bent, such that the display circuit board 310 is disposed below the display panel 300 when the flexible film 340 is bent. In this case, a top surface of the display circuit board 310 may face a direction (e.g., the direction opposite to the Z-axis direction) towards a bottom surface of the display device 10 (e.g., towards the bracket 600 relative to the display panel 300). For example, as illustrated in FIG. 3A, which will be described in more detail below, one side of the flexible film 340 may extend from below the display panel 300 to be connected to (e.g., to be attached on) the top surface of the display panel 300 via an anisotropic conductive film (ACF). The other side of the flexible film 340 may extend from above the display circuit board 310 to be connected to (e.g., to be attached on) the top surface of the display circuit board 310 via an ACF. The display driving unit 320 may be connected to (e.g., attached on or mounted on) the flexible film 340 in a COF manner.

Figure 3B:
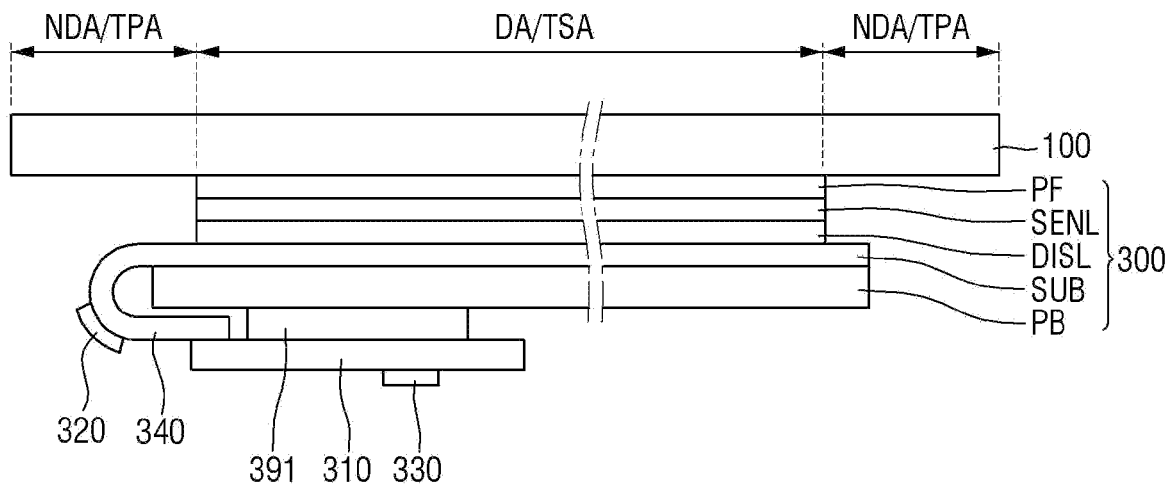

In other embodiments, the flexible film 340 may be omitted (e.g., may not be provided), and the display circuit board 310 may be directly connected to (e.g., directly attached on) one side of the display panel 300. In this case, as illustrated in FIG. 3B, which will be described in more detail below, one side of the display panel 300 may be bent towards the bottom surface of the display panel 300, and the display circuit board 310 may be connected to (e.g., attached on) the one side of the display panel. The display driving unit 320 may be connected to (e.g., attached on or mounted on) the one side of the display panel 300 in a COP manner or through ultrasonic bonding.

The bracket 600 may be disposed below the display panel 300. The bracket 600 may include a plastic, a metal, or a combination thereof. The bracket 600 may have a first camera hole CMH1 in which a first camera sensor 720 is inserted, a cable hole CAH in which a cable 314 that is connected to the display circuit board 310 extends (e.g., passes) through, and sensor holes SH at (e.g., in) which the sensors 740, 750, 760, and 770 are disposed. However, the present disclosure is not limited thereto. For example, in another embodiment, the sensor holes SH may be omitted from (e.g., may not be provided in) the bracket 600, and in this case, the bracket 600 may be formed to not overlap with the sub-display area SDA of the display panel 300.

The main circuit board 700 and a battery 790 may be disposed below the bracket 600. The main circuit board 700 may be a PCB or an FPCB.

The main circuit board 700 may include a main processor 710, the first camera sensor 720, a main connector 730, and the sensors 740, 750, 760, and 770. The first camera sensor 720 may be disposed on both the top and bottom surfaces of the main circuit board 700, the main processor 710 may be disposed on the bottom surface of the main circuit board 700, and the main connector 730 may be disposed on the bottom surface of the main circuit board 700. The sensors 740, 750, 760, and 770 may be disposed on the top surface of the main circuit board 700.

The main processor 710 may control various functions (e.g., all functions) of the display device 10. For example, the main processor 710 may output digital video data to the display driving unit 320 via the display circuit board 310, such that the display panel 300 displays an image. Further, the main processor 710 may receive touch data from the sensing driving unit 330, may determine the coordinates of a touch input from the user, and may execute an application corresponding to an icon displayed at (e.g., selected by) the coordinates of the touch input.

The main processor 710 may control the display device 10 in accordance with sensor signals received from the sensors 740, 750, 760, and 770. For example, the main processor 710 may determine whether an object is within (e.g., is present within or located within) a proximity of the top surface of the display device 10 according to (e.g., based on) a proximity sensor signal received from a proximity sensor 740. During a call mode in which the user engages in a call using the display device 10, the main processor 710 may control the display panel 300 to not display an image, and may further control the display device 10 to recognize touch inputs entered by the user, for example, when an object is detected within the proximity of the top surface of the display device 10.

The main processor 710 may determine a brightness (e.g., a brightness amount or level) at the top surface of the display device 10 in accordance with an illumination sensor signal received from an illumination sensor 750. The main processor 710 may control the luminance of an image displayed by the display panel 10 according to (e.g., based on) the brightness at the top surface of the display device 10.

The main processor 710 may determine whether an iris image received from the user is the same or substantially the same as an iris image stored (e.g., stored in advance or ahead of time) in a memory, in accordance with an iris sensor signal received from an iris sensor 760. When the iris image from the user is the same or substantially the same as the iris image stored in the memory, the main processor 710 may unlock the display device 10, and may display a home screen on the display panel 300.

The first camera sensor 720 may process a still image and/or a moving image obtained by (e.g., captured by) an image sensor, and may output the processed image to the main processor 710. The first camera sensor 720 may include (e.g., may be) a complementary metal-oxide-semiconductor (CMOS) image sensor or a charge-coupled device (CCD) image sensor. Because the first camera sensor 720 may be exposed at the bottom surface of the lower cover 900 through a second camera hole CMH2, the first camera sensor 720 may capture an image of an object or a background from the bottom (e.g., a rear or the bottom surface) of the display device 10.

The cable 314, which extends (e.g., passes) through the cable hole CAH of the bracket 600, may be connected to the main connector 730. As a result, the main circuit board 700 may be electrically connected to the display circuit board 310.

The sensors 740, 750, 760, and 770 may include the proximity sensor 740, the illumination sensor 750, the iris sensor 760, and a second camera sensor 770. However, the present disclosure is not limited thereto, and the sensors 740, 750, 760, and 770 may include any suitable kinds of sensors as would be known to those skilled in the art.

The proximity sensor 740 may be a sensor for determining whether an object is within (e.g., is present within or located within) the proximity of the top surface of the display device 10. For example, the proximity sensor 740 may include a light source that outputs light, and a light receiver that receives light reflected from an object. The proximity sensor 740 may determine whether an object is within the proximity of the top surface of the display device 10 according to (e.g., based on) the amount of light reflected from the object. Because the proximity sensor 740 may be disposed to overlap with the sensor holes SH, the sub-display area SDA of the display panel 300, and the second transmissive part SDA100 of the cover window 100 in the thickness direction of the display panel 300 (e.g., the Z-axis direction), the proximity sensor 740 may generate a proximity sensor signal in accordance with the presence of an object within the proximity of the top surface of the display device 10, and may output the proximity sensor signal to the main processor 710.

The illumination sensor 750 may be a sensor for detecting the brightness (e.g., the brightness amount or the brightness level) at the top surface of the display device 10. For example, the illumination sensor 750 may include a resistor in which a resistance varies in accordance with the brightness of incident light (e.g., light incident thereon). In this case, the illumination sensor 750 may determine the brightness at the top surface of the display device 10 according to (e.g., based on) a variation in the resistance of the resistor caused by the brightness of the incident light. Because the illumination sensor 750 is disposed to overlap with the sensor holes SH, the sub-display area SDA of the display panel 300, and the second transmissive part SDA100 of the cover window 100 in the thickness direction of the display panel 300 (e.g., the Z-axis direction), the illumination sensor 750 may generate an illumination sensor signal in accordance with the brightness at the top surface of the display device 10, and may output the illumination sensor signal to the main processor 710.

The iris sensor 760 may be a sensor for determining whether an image of the user's iris is the same or substantially the same as the iris image stored (e.g., stored in advance or ahead of time) in the memory. For example, the iris sensor 760 may generate an iris sensor signal in accordance with whether the image of the user's iris is the same or substantially the same as the iris image stored in the memory, and may output the iris sensor signal to the main processor 710.

The second camera sensor 770 may process a still image and/or a moving image obtained by (e.g., captured by) an image sensor, and may output the processed image to the main processor 710. For example, the second camera sensor 770 may include (e.g., may be) a CMOS image sensor or a CCD image sensor. The number of pixels of the second camera sensor 770 may be less than (e.g., smaller than) the number of pixels of the first camera sensor 720, and the size of the second camera sensor 770 may be smaller than the size of the first camera sensor 720. Because the second camera sensor 770 may be disposed to overlap with the sensor holes SH, the sub-display area SDA of the display panel 300, and the second transmissive part SDA100 of the cover window 100 in the thickness direction of the display panel 300 (e.g., the Z-axis direction), the second camera sensor 770 may capture an image of an object or a background from the top (e.g., a front or the top surface) of the display device 10.

The battery 790 may be disposed to not overlap with the main circuit board 700 in a third direction (e.g., the thickness direction or the Z-axis direction). The battery 790 may overlap with a battery hole BH of the bracket 600.

A mobile communication module, which may exchange wireless signals with at least one of a base station, an external terminal, and a server via a mobile communication network, may be further provided on the main circuit board 700. For example, the wireless signals may include various kinds of data associated with the transmission/reception of audio signals, video call signals, text/multimedia messages, and/or the like.

The lower cover 900 may be disposed below the main circuit board 700 and the battery 790. The lower cover 900 may be connected to (e.g., attached to or fastened to) the bracket 600. The lower cover 900 may form a bottom exterior (e.g., a rear exterior or the rear) of the display device 10. The lower cover 900 may include a plastic, a metal, or a combination thereof.

The second camera hole CMH2, through which the bottom surface of the first camera sensor 720 is exposed, may be formed in the lower cover 900. However, the present disclosure is not limited thereto, and the locations of the first camera sensor 720 and the first and second camera holes CMH1 and CMH2 corresponding to the first camera sensor 720 are not limited to those shown in FIG. 2.

FIGS. 3A and 3B are side views illustrating the display panel and the display driving unit of the display device of FIG. 1.

Referring to FIGS. 3A and 3B, the display panel 300 may include a substrate SUB, a display unit (e.g., a display circuit or a display layer) DISL, a sensing unit (e.g., a sensing circuit or a sensing layer) SENL, a polarizing film PF, and a panel lower cover PB.

The substrate SUB may be formed of an insulating material, for example, such as glass, quartz, a polymer resin, and/or the like. The substrate SUB may be a rigid substrate, for example, as illustrated in FIG. 3A, or may be a flexible substrate that is bendable, foldable, and/or rollable, for example, as illustrated in FIG. 3B.

The display unit DISL may be disposed on the substrate SUB. The display unit DISL may include a plurality of pixels, and may be a layer that displays an image.

The display unit DISL may include a thin-film transistor (TFT) layer in which a plurality of TFTs are formed, a light-emitting element layer in which light-emitting elements that emit light are formed, and an encapsulation layer which may encapsulate the light-emitting element layer.

The display unit DISL may be divided into a display area DA and a non-display area NDA. The display area DA may be an area at (e.g., in or on) which the pixels are disposed to display an image. The non-display area NDA may be an area at (e.g., in or on) which no image is displayed. The non-display area NDA may be disposed to surround (e.g., around a periphery of) the display area DA. Scan lines, data lines, and power lines, which are connected to the pixels, may be disposed at (e.g., in or on) the display area DA, in addition to the pixels. A scan driving unit (e.g., a scan driver) for applying scan signals to the scan lines, and fan-out lines for connecting the data lines and the display driving unit 320 may be disposed at (e.g., in or on) the non-display area NDA.

The sensing unit SENL may be disposed on the display unit DISL. The sensing unit SENL may include sensor electrodes, and may be a layer for detecting a touch input from the user. The sensing unit SENL may include a sensing area TSA and a sensing peripheral area TPA. The sensing area TSA may be an area at (e.g., in or on) which the sensor electrodes are disposed to detect the touch input from the user. The sensing peripheral area TPA may be an area at (e.g., in or on) which the sensor electrodes are not disposed, and may surround (e.g., around a periphery of) the sensing area TSA.

The sensing area TSA of the sensing unit SENL may overlap with the display area DA of the display unit DISL. The sensing peripheral area TPA of the sensing unit SENL may overlap with the non-display area NDA of the display unit DISL.

The polarizing film PF may be disposed on the sensing unit SENL to prevent or substantially prevent the visibility of an image displayed by the display unit DISL from being decreased (e.g., from being lowered) by the reflection of external light. The polarizing film PF may include a linear polarizing plate and a retardation film, for example, such as a quarter-wave (λ/4) plate. The retardation film may be disposed on the sensing unit SENL, and the linear polarizing plate may be disposed on the retardation film.

The cover window 100 may be disposed on the polarizing film PF. The cover window 100 may be connected to (e.g., attached on) the polarizing film PF via a transparent adhesive member, for example, such as an optically clear adhesive (OCA).

A panel bottom cover PB may be disposed below the display panel 300. The panel bottom cover PB may be connected to (e.g., may be attached to) the bottom surface of the display panel 300 via an adhesive member. For example, the adhesive member may be a pressure sensitive adhesive (PSA). The panel bottom cover PB may include a light-absorbing member for absorbing external light (e.g., light incident from the outside), a buffer member for absorbing an external shock, and a heat dissipation member for dissipating (e.g., for efficiently releasing) heat generated by the display panel 300.

The light-absorbing member may be disposed below the display panel 300. The light-absorbing member blocks or reduces the transmission of light, and thus, prevents or substantially prevents elements disposed therebelow, such as the display circuit board 310, from being visible from above the display panel 300. The light-absorbing member may include a light-absorbing material, for example, such as a black pigment, a black dye, and/or the like.

The buffer member may be disposed below the light-absorbing member. The buffer member absorbs external shock, and thus, prevents or substantially prevents the display panel 300 from being broken or damaged by the external shock. The buffer member may be formed as a single-layer or a multi-layered film. For example, the buffer member may be formed of a polymer resin, for example, such as polyurethane, polycarbonate, polypropylene, polyethylene, and/or the like, or may be formed of an elastic material, for example, such as a foamed sponge obtained from rubber, a urethane-based material, an acrylic material, and/or the like.

The heat dissipation member may be disposed below the buffer member.

The heat dissipation member may include a first heat dissipation layer including graphite or carbon nanotubes, and a second heat dissipation layer formed as a thin film using a metal capable of blocking electromagnetic waves and/or having excellent thermal conductivity, for example, such as copper, nickel, ferrite, silver, and/or the like.

As illustrated in FIG. 3A, in some embodiments, the flexible film 340 may be disposed at (e.g., in or on) the non-display area NDA on one side of the display panel 300. For example, the flexible film 340 may be disposed at (e.g., in or on) the non-display area NDA on a lower side of the display panel 300. The flexible film 340 may be bent towards the bottom of the display panel 300, and may be connected to (e.g., may be attached to) one side of the display circuit board 310, which may be disposed on the bottom surface of the panel bottom cover PB. The display circuit board 310 may be connected to (e.g., may be attached on and/or fixed to) the bottom surface of the panel bottom cover PB via a first adhesive member 391. For example, the first adhesive member 391 may be a PSA.

As illustrated in FIG. 3B, in other embodiments, the flexible film 340 may be omitted (e.g., may not be provided), and in this case, one side of the substrate SUB may be bent towards the bottom of the display panel 300. The side of the substrate SUB that is bent towards the bottom of the display panel 300 may be connected to (e.g., may be attached to) the display circuit board 310, which may be disposed on the bottom surface of the panel bottom cover PB.

As illustrated in FIGS. 3A and 3B, the sensing unit SENL may be disposed directly on the display unit DISL. Thus, the thickness of the display device 10 may be reduced as compared to a case where a separate touch panel including the sensing unit SENL is attached on the display unit DISL.

Figure 4:
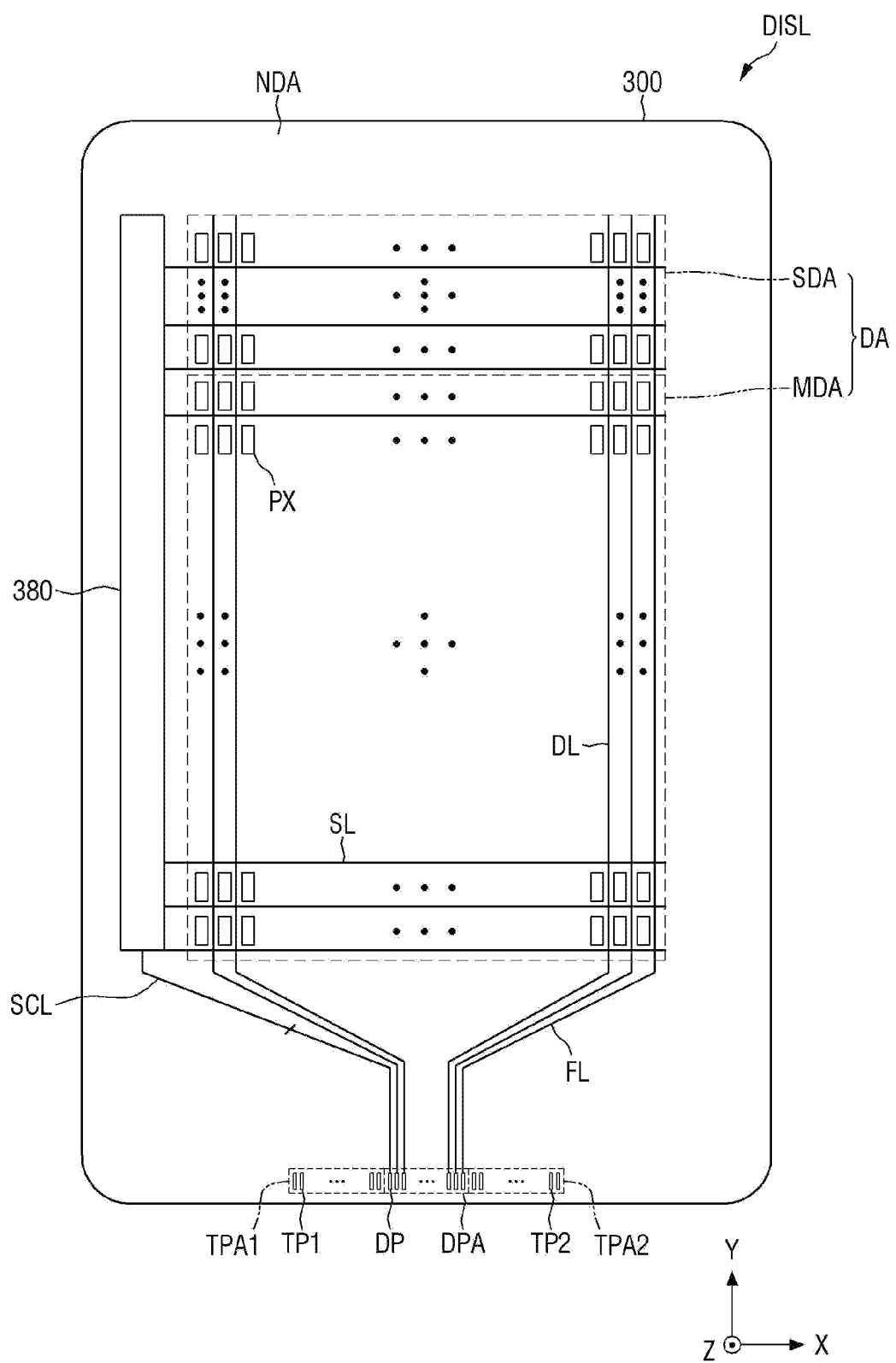
FIG. 4 is a plan view illustrating elements associated with the display unit of FIG. 3A.

FIG. 4 is a plan view illustrating elements associated with the display unit of FIG. 3A.

Referring to FIG. 4, the display unit DISL may include a main display area MDA including a plurality of subpixels PX, a sub-display area SDA including a plurality of subpixels PX and transmissive parts, and a non-display area NDA that does not include subpixels PX. For example, the subpixels PX, scan lines SL, and data lines DL may be disposed at (e.g., in or on) the main display area MDA and the sub-display area SDA. The scan lines SL may be formed to be parallel to one another and may extend in the first direction (e.g., the X-axis direction). The data lines DL may be formed to be parallel to one another and may extend in the second direction (e.g., the Y-axis direction) crossing the first direction (e.g., the X-axis direction). The scan lines SL may be connected to a scan driving unit (e.g., a scan driver) 380 at (e.g., in or on) the non-display area NDA. The data lines DL may be connected to display pads DP via fan-out lines FL at (e.g., in or on) the non-display area NDA.

Each of the subpixels PX may be connected to at least one of the scan lines SL, and to one of the data lines DL. Each of the subpixels PX may include a plurality of TFTs, a light-emitting element, and a capacitor. The plurality of TFTs may include a driving transistor and at least one switching transistor. In response to the scan signals received from the scan lines SL, the subpixels PX may receive data voltages from the data lines DL, and may emit light by supplying driving currents to the light-emitting elements of the subpixels PX in accordance with the data voltages applied to the gate electrodes of the driving transistors of the subpixels PX.

The non-display area NDA may be an entire area of the display unit DISL, except for the display area DA including the main display area MDA and the sub-display area SDA. The scan driving unit 380, scan control lines SCL, the fan-out lines FL, and sensing pads TP1 and TP2 may be disposed at (e.g., in or on) the non-display area NDA. The scan driving unit 380 applies scan signals to the scan lines SL, and the fan-out lines FL connect the data lines DL and the display pads DP to each other. The sensing pads TP1 and TP2 may be connected to sensing lines.

The scan driving unit 380 may be connected to the display pads DP via the scan control lines SCL, and thus, may receive scan control signals from the display driving unit 320, which is disposed on the display circuit board 310. The scan driving unit 380 generates scan signals in accordance with the scan control signals, and provides the scan signals to the scan lines SL. The subpixels PX to which data voltages are to be provided may be selected by the scan signals from the scan driving unit 380, and the data voltages may be provided to the selected subpixels PX. The scan driving unit 380 is illustrated as being formed at (e.g., in or on) the non-display area NDA, and at (e.g., on) one side of the display area DA, for example, on the left side of the display area DA, but the present disclosure is not limited thereto. For example, in another embodiment, a plurality of scan driving units 380 may be provided at (e.g., in or on) the non-display area NDA, and the scan driving units 380 may be at (e.g., on) opposite sides of the display area DA, for example, on the left side and the right side of the display area DA, respectively.

The display panel 300 may include the display pads DP, which are connected to the data lines DL (e.g., via the fan lines FL) and the scan control lines SCL, and the sensing pads TP1 and TP2, which are connected to the sensing lines. A display pad area DPA, at (e.g., in or on) which the display pads DP are disposed, may be disposed between a first sensing pad area TPA1 and a second sensing pad area TPA2. The first sensing pad area TPA1 may include first sensing pads TP1 disposed thereon, and the second sensing pad area TPA2 may include second sensing pads TP2 disposed thereon. As illustrated in FIG. 4, the display pad area DPA may be disposed at (e.g., in or on) the middle (e.g., a central portion) of one side (e.g., a lower side) of the display panel 300, the first sensing pad area TPA1 may be disposed at (e.g., in or on) the left side of the display pad area DPA, and the second sensing pad area TPA2 may be disposed at (e.g., in or on) the right side of the display pad area DPA.

Figure 5:
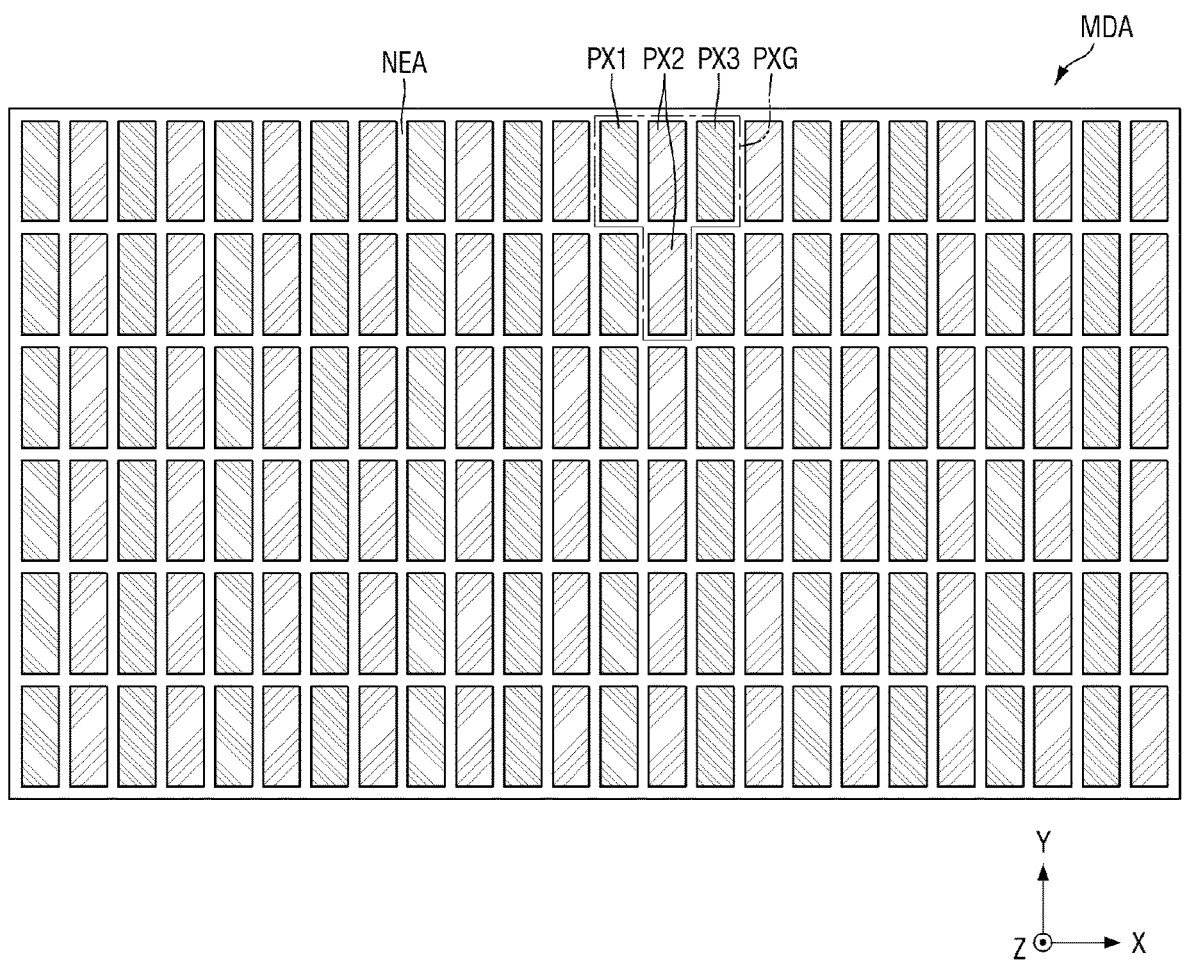
FIG. 5 is a plan view illustrating pixels at the main display area of FIG. 4.
Figure 6:
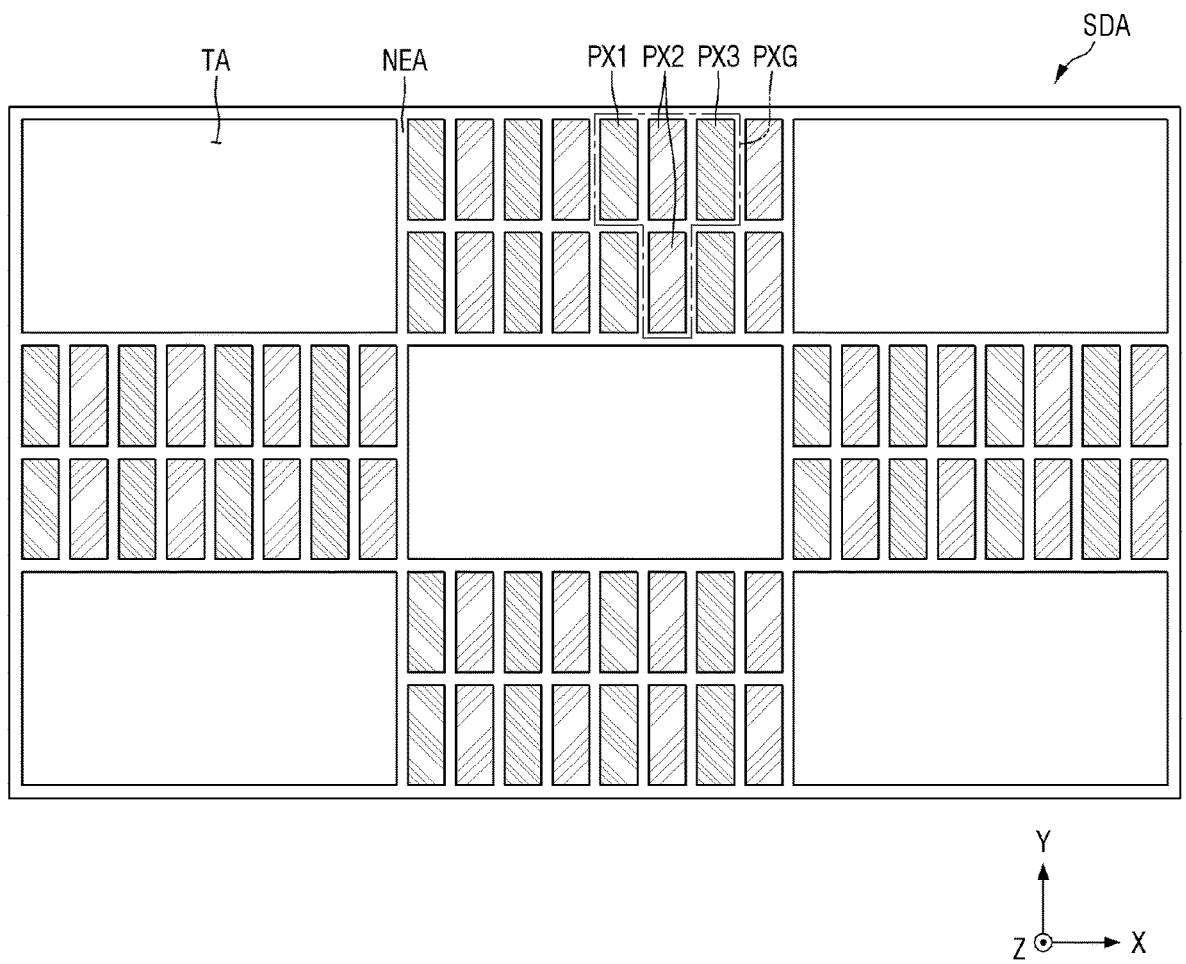
FIG. 6 is a plan view illustrating pixels at the sub-display area of FIG. 4.

FIG. 5 is a plan view illustrating pixels at (e.g., in or on) the main display area of FIG. 4. FIG. 6 is a plan view illustrating pixels at (e.g., in or on) the sub-display area of FIG. 4.

Referring to FIGS. 5 and 6, the main display area MDA may include a plurality of subpixels PX1, PX2, and PX3, and a non-emission part NEA. The sub-display area SDA may include a plurality of subpixels PX1, PX2, and PX3, a non-emission part NEA, and transmissive parts TA.

In the main display area MDA and the sub-display area SDA, a first subpixel PX1, two second subpixels PX2, and a third subpixel PX3 may be defined as forming a pixel PXG. Each of the first subpixel PX1, the second subpixels PX2, and the third subpixel PX3 may include a light-emitting element that emits light. The light-emitting element may be an OLED including an organic light-emitting layer, a micro light-emitting diode (microLED), a quantum-dot light-emitting diode (QLED) including a quantum-dot light-emitting layer, an inorganic light-emitting diode (LED) including an inorganic semiconductor, and/or the like.

The first subpixel PX1 may include a first emission area that emits light of a first color, the second subpixels PX2 may include second emission areas that emit light of a second color, and the third subpixel PX3 may include a third emission area that emits light of a third color. For example, the first, second, and third colors may be a red color, a green color, and a blue color, respectively, but the present disclosure is not limited thereto. In another example, the first subpixel PX1, the second subpixels PX2, and the third subpixel PX3 may emit light of the same or substantially the same color.

FIGS. 5 and 6 illustrate that the subpixels PX1, PX2, and PX3 are formed as having a rectangular shape having a pair of short sides extending in the first direction (e.g., the X-axis direction) and a pair of long sides extending in the second direction (e.g., the Y-axis direction), but the present disclosure is not limited thereto.

The non-emission part NEA may be an area at (e.g., in or on) which the subpixels PX1, PX2, and PX3 are not disposed. A driving unit (e.g., a pixel driver or a pixel driving layer) may be disposed at (e.g., in or on) the non-emission part NEA. The driving unit may include lines connected to the subpixels PX1, PX2, and PX3, and TFTs for driving the subpixels PX1, PX2, and PX3.

The non-emission part NEA may be disposed between the subpixels PX1, PX2, and PX3 at (e.g., in or on) the main display area MDA. The non-emission part NEA may be disposed between the subpixels PX1, PX2, and PX3, and between the subpixels PX1, PX2, and PX3 and the transmissive parts TA at (e.g., in or on) the sub-display area SDA.

The transmissive parts TA may be areas that transmit incident light therethrough. Due to the transmissive parts TA, an object or a background at the bottom (e.g., a bottom surface or a rear) of the display panel 300 may be viewed from the top surface of the display panel 300.

The transmissive parts TA (e.g., each of the transmissive parts TA) may be surrounded (e.g., around a periphery thereof) by the non-emission part NEA. The transmissive parts TA (e.g., each of the transmissive parts TA) may be surrounded (e.g., at least partially around a periphery thereof) by the subpixels PX1, PX2, and PX3. FIG. 6 illustrates that the transmissive parts TA have a rectangular shape in a plan view, but the present disclosure is not limited thereto. For example, in another embodiment, the transmissive parts TA may have another suitable quadrangular shape other than a rectangular shape, a suitable polygonal shape other than a quadrangular shape, a circular shape, an elliptical shape, an amorphous shape, and/or the like.

As illustrated in FIG. 6, because the sub-display area SDA includes the transmissive parts TA, the sensors 740, 750, 760, and 770, which may overlap with the sub-display area SDA in the third direction (e.g., the thickness direction or the Z-axis direction), may receive light from the top surface of the display panel 300 through the transmissive parts TA. Accordingly, even when the sensors 740, 750, 760, and 770 are disposed below (e.g., at the bottom of) the display panel 300, a decrease in the sensing capabilities of the sensors 740, 750, 760, and 770 may be prevented or reduced.

Figure 7:
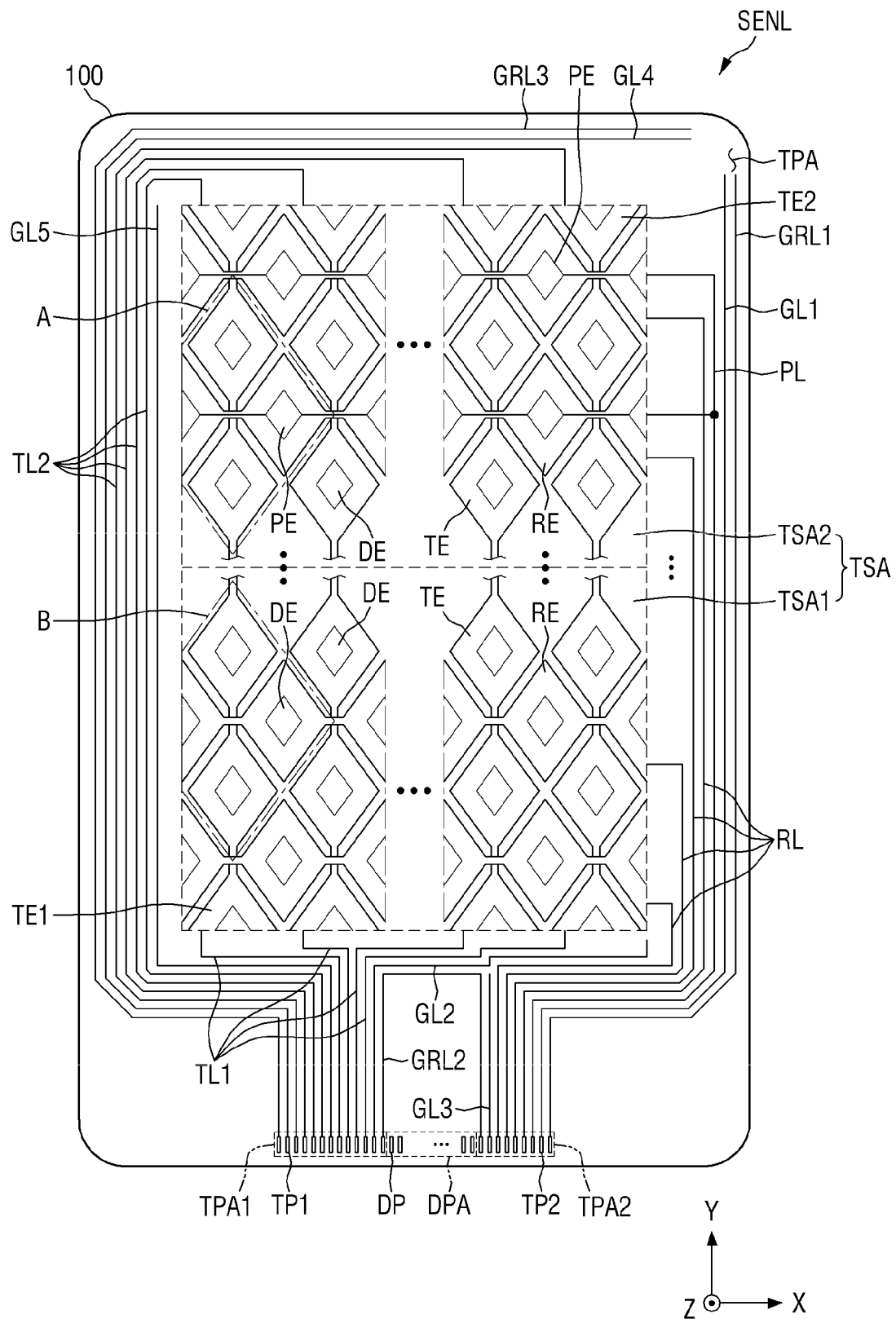
FIG. 7 is a plan view illustrating elements associated with the sensing unit of FIG. 3A.

FIG. 7 is a plan view illustrating elements associated with the sensing unit (e.g., the sensing circuit or the sensing layer) of FIG. 3A.

Referring to FIG. 7, the sensing unit SENL includes two kinds of sensor electrodes, for example, driving electrodes TE and sensing electrodes RE. The sensing unit SENL may be driven in a two-layer mutual capacitance manner by applying driving signals to the driving electrodes TE, and sensing voltages charged in the mutual capacitance (e.g., between the driving electrodes TE and the sensing electrodes RE) through the sensing electrodes RE, but the present disclosure is not limited thereto. For example, in other embodiments, the sensing unit SENL may be driven in a one-layer mutual capacitance manner, or a self-capacitance manner.

For convenience, FIG. 7 illustrates the sensor electrodes TE and RE, proximity sensing electrodes PE, dummy patterns DE, sensing lines TL1, TL2, RL, and PL, the sensing pads TP1 and TP2, first through fifth guard lines GL1 through GL5, and first through third ground lines GRL1 through GRL3, but the present disclosure is not limited thereto.

The sensing unit SENL includes the sensing area TSA, which is for sensing a touch input from the user, and the sensing peripheral area TPA, which is disposed at (e.g., in or on) the periphery of the sensing area TSA. The sensing area TSA may overlap with the display area DA of the display unit DISL, and the sensing peripheral area TPA may overlap with the non-display area NDA of the display unit DISL. The sensing area TSA may include a first sensing area TSA1, which overlaps with the main display area MDA of the display unit DISL, and a second sensing area TSA2, which overlaps with the sub-display area SDA of the display area DA.

The second sensing area TSA2 may include the sensor electrodes TE and RE, proximity sensing electrodes PE, and dummy patterns DE. The proximity sensing electrodes PE and the dummy patterns DE may be surrounded (e.g., around a periphery thereof) by the sensor electrodes TE and RE. The sensor electrodes TE and RE may include the driving electrodes TE and the sensing electrodes RE. Either the driving electrodes TE or the sensing electrodes RE may surround (e.g., around a periphery of) the proximity sensing electrodes PE, and the others from among the driving electrodes TE and the sensing electrodes RE may surround (e.g., around a periphery of) the dummy patterns DE. In other words, the proximity sensing electrodes PE may be surrounded (e.g., around a periphery thereof) by the driving electrodes TE or the sensing electrodes RE, and the dummy patterns DE may be surrounded (e.g., around a periphery thereof) by the others of the driving electrodes TE and the sensing electrodes RE that do not surround (e.g., around a periphery of) the proximity sensing electrodes PE. For example, as illustrated in FIG. 7, the proximity sensing electrodes PE may be surrounded (e.g., around a periphery thereof) by the sensing electrodes RE, and the dummy patterns DE may be surrounded (e.g., around a periphery thereof) by the driving electrodes TE. In another example, when the proximity sensing electrodes PE are surrounded (e.g., around a periphery thereof) by the driving electrodes TE, the dummy patterns DE may be surrounded (e.g., around a periphery thereof) by the sensing electrodes RE.

The dummy patterns DE may be electrically floated. In other words, no voltages may be applied to the dummy patterns DE.

The first sensing area TSA1 may include sensor electrodes TE and RE, and dummy patterns DE surrounded by the sensor electrodes TE and RE. The dummy patterns DE may be surrounded by driving electrodes TE or sensing electrodes RE. For example, in some embodiments, in the first sensing area TSA1, some of the dummy patterns DE may be surrounded by the driving electrodes TE, and others of the dummy patterns DE may be surrounded by the sensing electrodes RE. The dummy patterns DE may be electrically floated. In other words, no voltages may be applied to the dummy patterns DE.

FIG. 7 illustrates that the driving electrodes TE and the sensing electrodes RE have a rhombus shape in a plan view, but the present disclosure is not limited thereto.

The sensing electrodes RE may be arranged along the first direction (e.g., the X-axis direction) and may be electrically connected to each other. The driving electrodes TE may be arranged along the second direction (e.g., the Y-axis direction) crossing the first direction (e.g., the X-axis direction) and may be electrically connected to each other. The driving electrodes TE may be electrically isolated from the sensing electrodes RE. The driving electrodes TE may be disposed to be spaced apart from the sensing electrodes RE. The dummy patterns DE may be electrically floated. In order to electrically isolate the driving electrodes TE from the sensing electrodes RE at crossing areas therebetween, the driving electrodes TE, which are adjacent to one another in the second direction (e.g., the Y-axis direction), may be connected to one another via first bridges BE1, and the sensing electrodes RE, which are adjacent to one another in the first direction (e.g., the X-axis direction), may be connected to one another via second bridges BE2.

The dummy patterns DE may be electrically isolated from the driving electrodes TE and the sensing electrodes RE. The driving electrodes TE, the sensing electrodes RE, and the dummy patterns DE may be disposed to be spaced apart from one another. The dummy patterns DE may be electrically floated.

Figure 13:
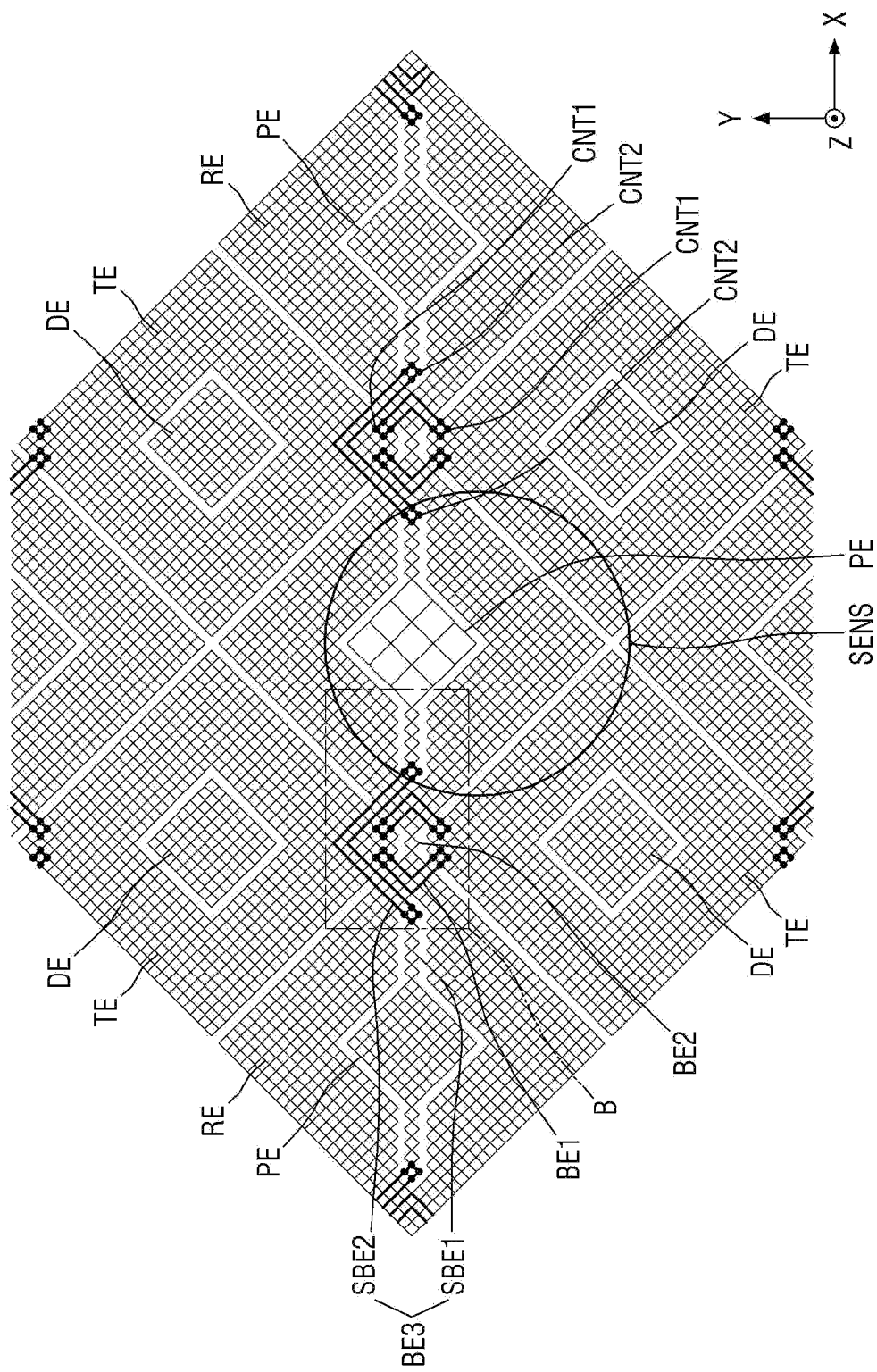
FIG. 13 is a plan view illustrating exemplary driving electrodes, exemplary sensing electrodes, exemplary proximity sensing electrodes, and exemplary dummy patterns at the second sensing area of FIG. 7.

The proximity sensing electrodes PE may be electrically isolated from the driving electrodes TE and the sensing electrodes RE. The driving electrodes TE, the sensing electrodes RE, and the proximity sensing electrodes PE may be disposed to be spaced apart from one another. The proximity sensing electrodes PE may be arranged along the first direction (e.g., the X-axis direction), and may be parallel to one another. In order to electrically isolate the proximity sensing electrodes PE from the driving electrodes TE and the sensing electrodes RE, pairs of adjacent proximity sensing electrodes PE in the first direction (e.g., the X-axis direction) may be connected to one another via third bridges BE3, for example, as illustrated in FIG. 13.

Due to the proximity sensing electrodes PE and the dummy patterns DE, parasitic capacitance between a second electrode 173 of a light-emitting element layer EML and the driving electrodes TE may decrease, and parasitic capacitance between the second electrode 173 of the light-emitting element layer EML and the sensing electrodes RE may decrease. As the parasitic capacitance decreases, mutual capacitance between the driving electrodes TE and the sensing electrodes RE may be enhanced, and a speed of charging the mutual capacitance may be enhanced. However, because the areas of the driving electrodes TE and the sensing electrodes RE may decrease due to the presence of the proximity sensing electrodes PE and the dummy patterns DE, the mutual capacitance may also decrease. In this case, voltages that are charged in the mutual capacitance may be affected (e.g., may be easily affected) by noise. Accordingly, the sizes of the proximity sensing electrodes PE and the dummy patterns DE may be determined (e.g., may be set) in consideration of the parasitic capacitance and the mutual capacitance.

The sensing lines TL1, TL2, RL, and PL may be disposed at (e.g., in or on) the sensing peripheral area TPA. The sensing lines TL1, TL2, RL, and PL may include input sensing lines RL connected to the sensing electrodes RE, first driving lines TL1 and second driving lines TL2 connected to the driving electrodes TE, and proximity sensing lines PI connected to the proximity sensing electrodes PE.

The sensing electrodes RE disposed at (e.g., in or on) one side (e.g., the right side in FIG. 7) of the sensing area TSA may be connected to the input sensing lines RL. For example, the sensing electrodes RE arranged farthest to the right on the sensing area TSA may be connected to the input sensing lines RL. The input sensing lines RL may be connected to the second sensing pads TP2. Accordingly, the sensing driving unit 330 may be electrically connected to the sensing electrodes RE.

Driving electrodes TE disposed at (e.g., in or on) another side (e.g., the lower side in FIG. 7) of the sensing area TSA may be connected to the first driving lines TL1, and driving electrodes TE disposed at (e.g., in or on) an opposite side (e.g., the upper side in FIG. 7) of the other side of the sensing area TSA may be connected to the second driving lines TL2. For example, as illustrated in FIG. 7, lowermost driving electrodes TE1 may be connected to the first driving lines TL1, and uppermost driving electrodes TE2 may be connected to the second driving lines TL2. The second driving lines TL2 may be connected to the uppermost driving electrodes TE2 at (e.g., in or on) the upper side of the sensing area TSA, and may extend in the second direction (e.g., the Y-axis direction) on the sensing peripheral area TPA at the left side of the sensing area TSA. The first driving lines TL1 and the second driving lines TL2 may be connected to the first sensing pads TP1. Accordingly, the sensing driving unit 330 may be electrically connected to the driving electrodes TE. Because the driving electrodes TE are connected to the driving lines TL1 and TL2 at (e.g., in or on) opposite sides of the sensing area TSA to receive a sensing driving signal TD, a difference between a sensing driving voltage applied to the uppermost driving electrodes TE2 and a sensing driving voltage applied to the lower most driving electrodes TE1 due to RC delays in the sensing driving signal TD may be prevented or reduced.

The proximity sensing electrodes PE at (e.g., in or on) the second sensing area TSA2 may be connected to the proximity sensing lines PL. The proximity sensing electrodes PE at (e.g., in or on) a plurality of rows may be connected to the proximity sensing lines PL. The proximity sensing lines PL may be connected to the second sensing pads TP2. Accordingly, the sensing driving unit 330 may be electrically connected to the proximity sensing electrodes PE.

The first guard line GL1 may be disposed at (e.g., in or on) the outside (e.g., to the right in FIG. 7) of an outermost input sensing line RL. The first ground line GRL1 may be disposed at (e.g., in or on) the outside (e.g., to the right in FIG. 7) of the first guard line GL1. As illustrated in FIG. 7, the first guard line GL1 may be disposed at (e.g., in or on) the right side of a rightmost input sensing line RL, and the first ground line GRL1 may be disposed at (e.g., in or on) the right side of the first guard line GL1.

The second guard line GL2 may be disposed between an innermost input sensing line RL and an innermost first driving line TL1. As illustrated in FIG. 7, the innermost input sensing line RL may be the leftmost input sensing line RL, and the innermost first driving line TL1 may be the rightmost first driving line TL1. The second guard line GL2 may also be disposed between the innermost first driving line TL1 and the second ground line GRL2.

The third guard line GL3 may be disposed between the innermost input sensing line RL and the second ground line GRL2. The second ground line GRL2 may be connected to a rightmost first sensing pad TP1 and a leftmost second sensing pad TP2.

The fourth guard line GL4 may be disposed at (e.g., in or on) the outside (e.g., the left side in FIG. 7) of an outermost second driving line TL2. As illustrated in FIG. 7, the fourth guard line GL4 may be disposed at (e.g., in or on) the left side of the outermost second driving line TL2.

The third ground line GRL3 may be disposed at (e.g., in or on) the outside (e.g., the left side in FIG. 7) of the fourth guard line GL4. As illustrated in FIG. 7, the fourth guard line GL4 may be disposed at (e.g., in or on) the left side and the upper side of the outermost second driving line TL2, and the third ground line GRL3 may be disposed at (e.g., in or on) the left side and the upper side of the fourth guard line GL4.

The fifth guard line GL5 may be disposed at (e.g., in or on) the inside (e.g., the right side in FIG. 7) of an innermost second driving line TL2. As illustrated in FIG. 7, the fifth guard line GL5 may be disposed between the innermost second driving line TL2 and the sensing electrodes RE.

Ground voltages may be applied to the first through third ground lines GRL1 through GRL3. The ground voltages may also be applied to the first through fifth guard lines GL1 through GL5.

As illustrated in FIG. 7, pairs of adjacent driving electrodes TE (e.g., adjacent in the second direction or the Y-axis direction) are electrically connected to one another, and pairs of adjacent sensing electrodes RE (e.g., adjacent in the second direction or the Y-axis direction) are electrically isolated from each other. Also, pairs of adjacent driving electrodes TE (e.g., adjacent in the first direction or the X-axis direction) are electrically isolated from each other, and pairs of adjacent sensing electrodes RE (e.g., adjacent in the first direction or the X-axis direction) are electrically connected to each other. Accordingly, mutual capacitance may be formed at (e.g., in or on) regions adjacent to the driving electrodes TE and the sensing electrodes RE.

As illustrated in FIG. 7, because the first guard line GL1 is disposed between the outermost input sensing line RL and the first ground line GRL1, the first guard line GL1 may minimize or reduce the influence of voltage variations in the first ground line GRL1 on the outermost input sensing line RL. Because the second guard line GL2 is disposed between the innermost input sensing line RL and the innermost first driving line TL1, the second guard line GL2 may minimize or reduce the influence of voltage variations in the innermost first driving line TL1 on the innermost input sensing line RL. Because the third guard line GL3 is disposed between the innermost input sensing line RL and the second ground line GRL2, the third guard line GL3 may minimize or reduce the influence of voltage variations in the second ground line GRL2 on the innermost input sensing line RL. Because the fourth guard line GL4 is disposed between the outermost second driving line TL2 and the third ground line GRL3, the fourth guard line GL4 may minimize or reduce the influence of voltage variations in the third ground line GRL3 on the outermost second driving line TL2. Because the fifth guard line GL5 is disposed between the innermost second driving line TL2 and the sensor electrodes TE and RE, the fifth guard line GL5 may minimize or reduce the influence of voltage variations in the innermost second driving line TL2 on the sensor electrodes TE and RE.

Figure 8:
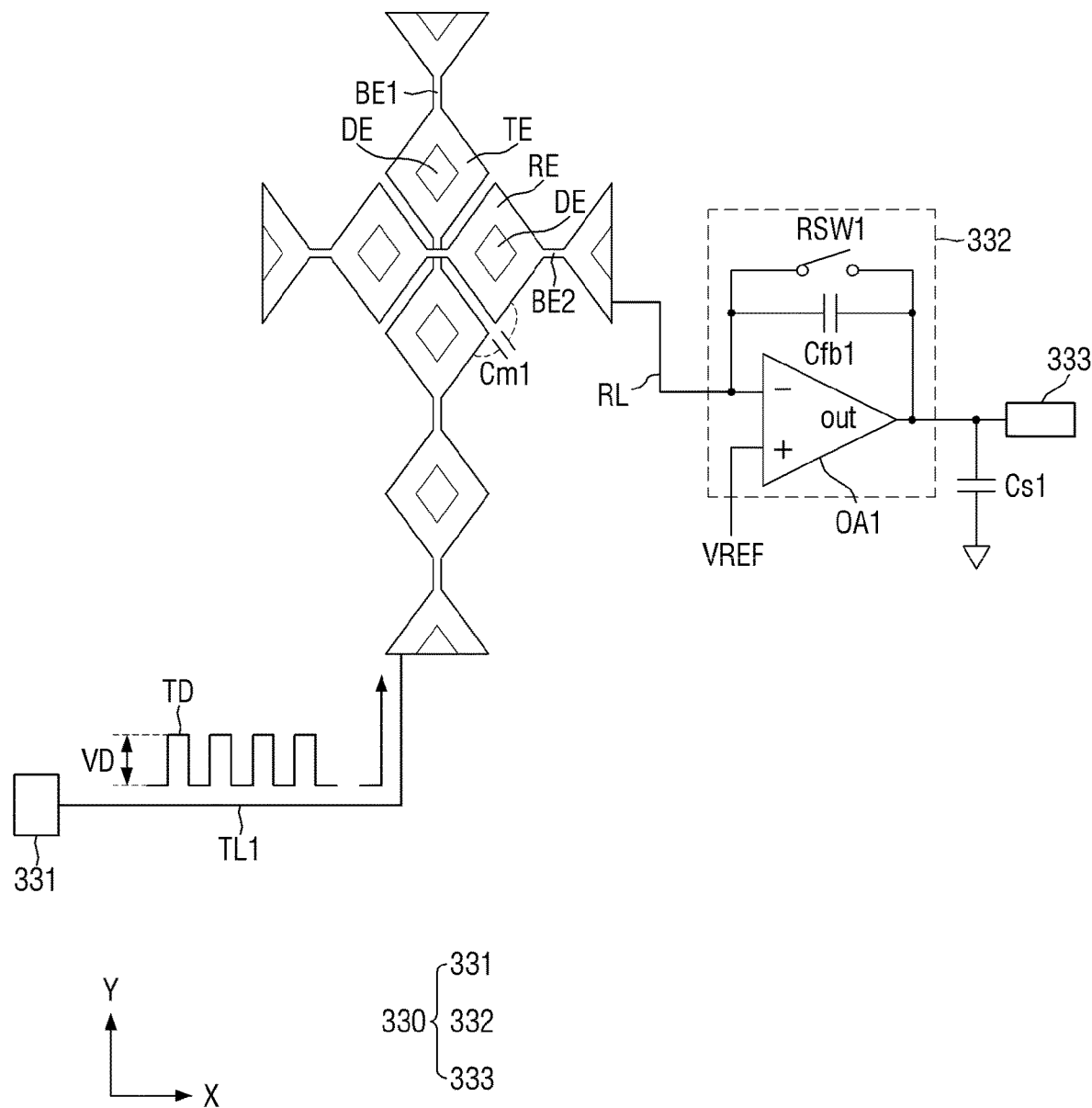
FIG. 8 illustrates an exemplary sensing driving unit connected to driving electrodes and sensing electrodes at the first sensing area of FIG. 7.

FIG. 8 illustrates an exemplary sensing driving unit (e.g., a sensing driver) connected to driving electrodes and sensing electrodes at (e.g., in or on) the first sensing area of FIG. 7.

For convenience, FIG. 8 illustrates one column of driving electrodes TE at (e.g., in or on) the first sensing area TSA1 that are electrically connected to one another in the second direction (e.g., the Y-axis direction), and one row of sensing electrodes RE at (e.g., in or on) the first sensing area TSA1 that are electrically connected to one another in the first direction (e.g., the X-axis direction).

Referring to FIG. 8, the sensing driving unit (e.g., the sensing driver) 330 may include a driving signal output part (e.g., a driving signal generator) 331, a first sensing part (e.g., a first sensing circuit) 332, and a first analog-to-digital conversion part (e.g., a first analog-to-digital converter) 333.

The driving signal output part 331 may output the sensing driving signal TD to the driving electrodes TE via the first driving lines TL1 and via the second driving lines TL2. The sensing driving signal TD may include a plurality of pulses.

The driving signal output part 331 may output the sensing driving signal TD to the driving lines TL1 and TL2 in a defined (e.g., a predefined) order. For example, referring to FIG. 7, the driving signal output part 331 may output the sensing driving signal TD to the driving electrodes TE in a sequential order from a column (e.g., a first column) of driving electrodes TE adjacent to the left side of the sensing area TSA to a column (e.g., a last column) of driving electrodes TE adjacent to the right side of the sensing area TSA.

The first sensing part 332 senses a voltage charged in a first mutual capacitance Cm1 via an input sensing line RL connected to the sensing electrodes RE. The first mutual capacitance Cm1 may be formed between the driving electrodes TE and the sensing electrodes RE.

The first sensing part 332 may include a first operational amplifier OA1, a first feedback capacitor Cfb1, and a first reset switch RSW1. The first operational amplifier OA1 may include a first input terminal "−", a second input terminal "+", and an output terminal "out". The first input terminal "−" of the first operational amplifier OA1 may be connected to the input sensing line RL, the second input terminal (+) of the first operational amplifier OA1 may receive an initialization voltage VREF, and the output terminal "out" of the first operational amplifier OA1 may be connected to a first storage capacitor Cs1. The first storage capacitor Cs1 may be connected between the output terminal "out" of the first operational amplifier OA1 and ground (e.g., a ground source) to store an output voltage Vout1 of the first operational amplifier OA1. The first feedback capacitor Cfb1 and the first reset switch RSW1 may be connected in parallel between the first input terminal "−" and the output terminal "out" of the first operational amplifier OA1. The first reset switch RSW1 controls the connection of ends (e.g., both ends) of the first feedback capacitor Cfb1. For example, when the first reset switch RSW1 is turned on so that the ends of the first feedback capacitor Cfb1 are connected to each other, the first feedback capacitor Cfb1 may be reset.

The output voltage Vout1 of the first operational amplifier OA1 may be defined by Equation (1) below.

$$Vout1 = \frac{Cm1 \times Vt1}{Cfb1} \qquad \text{[Equation 1]}$$

Referring to Equation (1), Vout1 refers to the output voltage of the first operational amplifier OA1, Cm1 refers to the first mutual capacitance, Cfb1 refers to the capacitance of the first feedback capacitor Cfb1, and Vt1 refers to the voltage charged in the first mutual capacitance Cm1.

The first analog-to-digital conversion part 333 may convert the output voltage Vout1 stored in the first storage capacitor Cs1 into first digital data, and may output the first digital data. The first analog-to-digital conversion part 333 may output the first digital data to the main processor 710 as touch sensing data.

As described above with reference to FIG. 8, at (e.g., in or on) the first sensing area TSA1, the presence of a touch input from the user may be detected by sensing the voltage that is charged in the first mutual capacitance Cm1.

Figure 9:
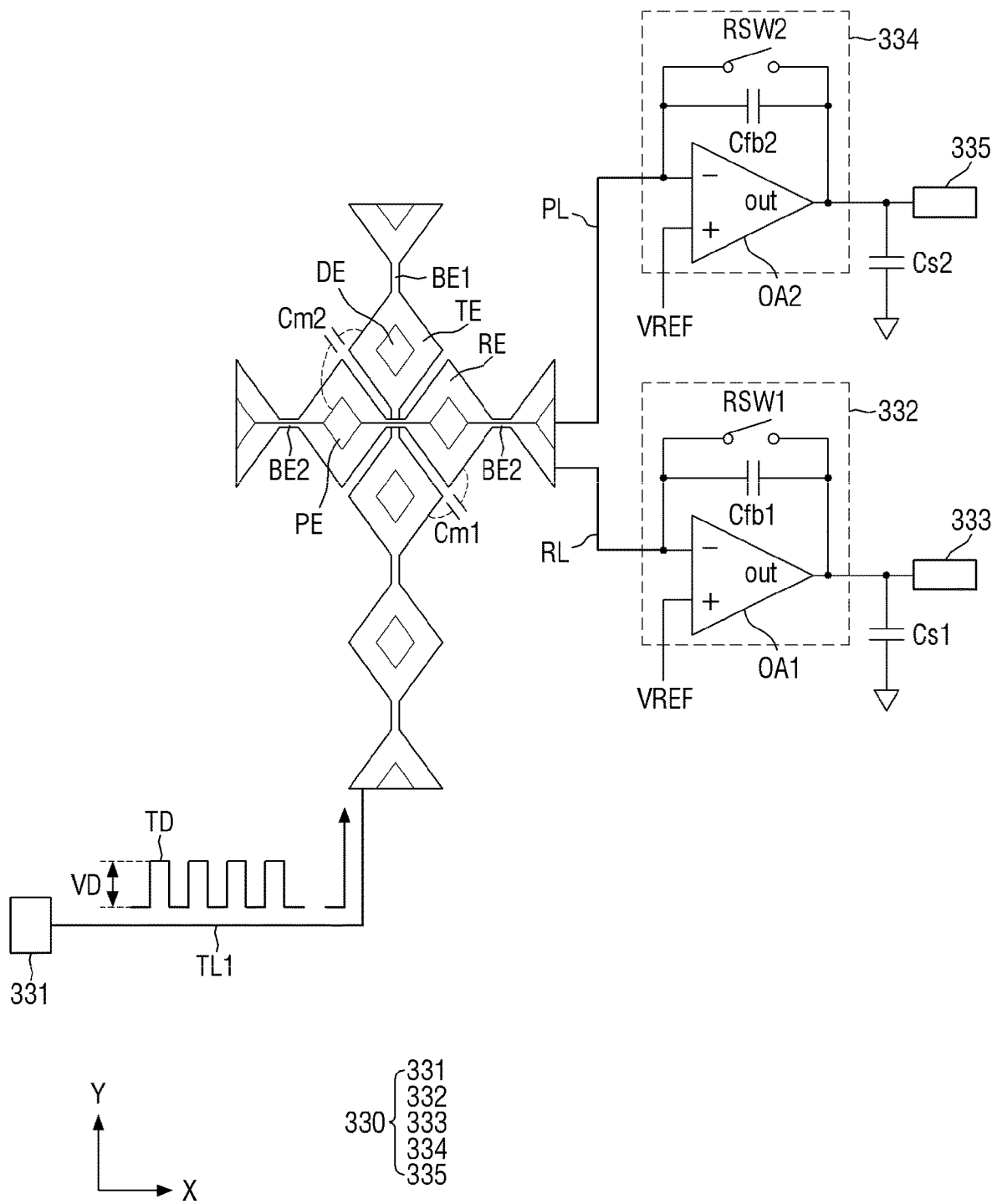
FIG. 9 illustrates an exemplary sensing driving unit connected to driving electrodes, sensing electrodes, and proximity sensing electrodes at the second sensing area of FIG. 7.

FIG. 9 illustrates an exemplary sensing driving unit (e.g., a sensing driver) connected to driving electrodes, sensing electrodes, and proximity sensing electrodes at (e.g., in or on) the second sensing area of FIG. 7.

For convenience, FIG. 9 illustrates one column of driving electrodes TE at (e.g., in or on) the second sensing area TSA2 that are electrically connected to one another in the second direction (e.g., the Y-axis direction), one row of sensing electrodes RE at (e.g., in or on) the second sensing area TSA2 that are electrically connected to one another in the first direction (e.g., the X-axis direction), and one row of proximity sensing electrodes PE at (e.g., in or on) the second sensing area TSA2 that are electrically connected to one another in the first direction (e.g., the X-axis direction).

Referring to FIG. 9, the sensing driving unit (e.g., the sensing driver) 330 may include a driving signal output part (e.g., a driving signal generator) 331, a first sensing part (e.g., a first sensing circuit) 332, a first analog-to-digital conversion part (e.g., a first analog-to-digital converter) 333, a second sensing part (e.g., a second sensing circuit) 334, and a second analog-to-digital conversion part (e.g., a second analog-to-digital converter) 335. The driving signal output part 331, the first sensing part 332, and the first analog-to-digital conversion part 333 may be the same or substantially the same as their respective counterparts described with reference to FIG. 8. Accordingly, redundant description thereof may not be repeated.

The second sensing part 334 senses a voltage charged in a second mutual capacitance Cm2 via a proximity sensing line PL connected to the proximity sensing electrodes PE. The second sensing part 334 may include a second operational amplifier OA2, a second feedback capacitor Cfb2, and a second reset switch RSW2. The second operational amplifier OA2 may include a first input terminal "−", a second input terminal "+", and an output terminal "out". The first input terminal "−" of the second operational amplifier OA2 may be connected to the proximity sensing line PL, an initialization voltage VREF may be provided to the second input terminal (+) of the second operational amplifier OA2, and the output terminal "out" of the second operational amplifier OA2 may be connected to a second storage capacitor Cs2. The second storage capacitor Cs2 may be connected between the output terminal "out" of the second operational amplifier OA2 and ground (e.g., a ground source) to store an output voltage Vout2 of the second operational amplifier OA2. The second feedback capacitor Cfb2 and the second reset switch RSW2 may be connected in parallel between the first input terminal "−" and the output terminal "out" of the second operational amplifier OA2. The second reset switch RSW2 controls the connection of ends (e.g., both ends) of the second feedback capacitor Cfb2. For example, when the second reset switch RSW2 is turned on so that the ends of the second feedback capacitor Cfb2 are connected to each other, the second feedback capacitor Cfb2 may be reset.

The output voltage Vout2 of the second operational amplifier OA2 may be defined by Equation (2) below.

$$Vout2 = \frac{Cm2 \times Vt2}{Cfb2}$$ [Equation 2]

Referring to Equation (2), Vout2 refers to the output voltage of the second operational amplifier OA2, Cm2 refers to the second mutual capacitance, Cfb2 refers to the capacitance of the second feedback capacitor Cfb2, and Vt2 refers to the voltage charged in the second mutual capacitance Cm2.

The second analog-to-digital conversion part 335 may convert the output voltage Vout2 stored in the second storage capacitor Cs2 into second digital data, and may output the second digital data. The second analog-to-digital conversion part 335 may output the second digital data to the main processor 710 as proximity sensing data.

As described above with reference to FIG. 9, at (e.g., in or on) the second sensing area TSA2, the presence of a touch input from the user may be detected by sensing the voltage charged in the first mutual capacitance Cm1, and the presence of a proximity input from the user may be detected by sensing the voltage charged in the second mutual capacitance Cm2.

Because the presence of a proximity input from the user may be detected by applying the sensing driving signal TD to a plurality of columns of the driving electrodes TE concurrently (e.g., simultaneously or at the same time), and sensing the voltage charged in the second mutual capacitance Cm2 via a plurality of rows of the proximity sensing electrodes PE, the second mutual capacitance Cm2 may be greater than the first mutual capacitance Cm1.

Figure 10:
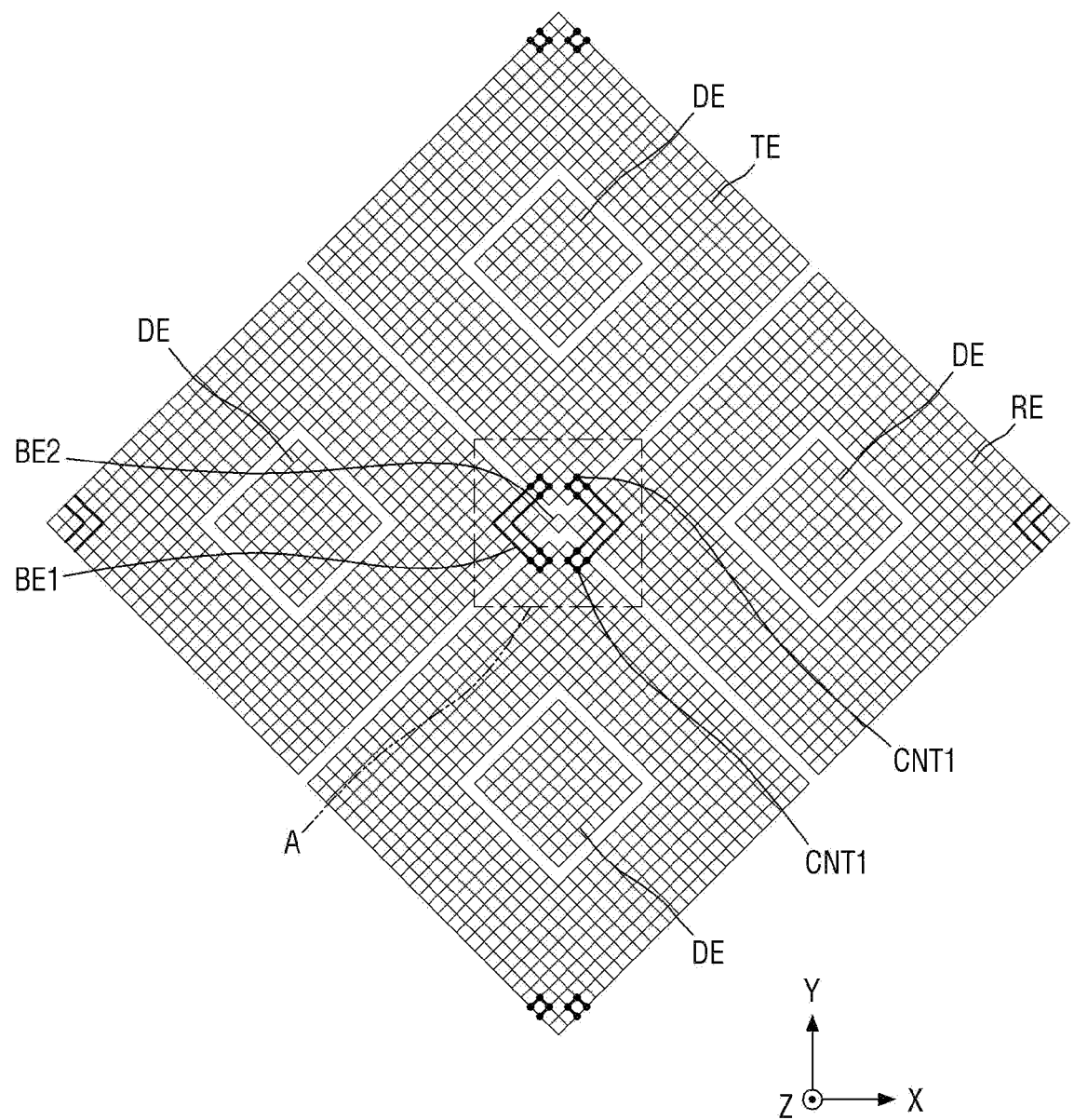
FIG. 10 is a plan view illustrating exemplary driving electrodes, exemplary sensing electrodes, and exemplary dummy patterns at the first sensing area of FIG. 7.

FIG. 10 is a plan view illustrating exemplary driving electrodes, exemplary sensing electrodes, and exemplary dummy patterns at the first sensing area of FIG. 7.

For convenience, FIG. 10 illustrates one pair of adjacent sensing electrodes RE (e.g., adjacent in the first direction or the X-axis direction) and one pair of adjacent driving electrodes TE (e.g., adjacent in the second direction or the Y-axis direction).

Referring to FIG. 10, the driving electrodes TE, the sensing electrodes RE, and the dummy patterns DE may have a quadrangular shape in a plan view, but the present disclosure is not limited thereto. In an embodiment, the driving electrodes TE, the sensing electrodes RE, and the dummy patterns DE may have a mesh structure or a fishnet structure in a plan view. In this case, the driving electrodes TE, the sensing electrodes RE, the dummy patterns DE, a plurality of first bridges BE1, and a second bridge BE2 may have the same or substantially the same mesh hole size as each other.

The sensing electrodes RE may be arranged in the first direction (e.g., the X-axis direction, and may be electrically connected to each other. The driving electrodes TE may be arranged in the second direction (e.g., the Y-axis direction), and may be electrically connected to each other. The dummy patterns DE may be disposed to be surrounded (e.g., around a periphery thereof) by the driving electrodes TE or the sensing electrodes RE. The driving electrodes TE, the sensing electrodes RE, and the dummy patterns DE may be electrically isolated from each other. The driving electrodes TE, the sensing electrodes RE, and the dummy patterns DE may be disposed to be spaced apart from one another.

In order for the sensing electrodes RE and the driving electrodes TE to be electrically isolated from each other at the crossing regions therebetween, the driving electrodes TE, which are adjacent to each other in the second direction (e.g., the Y-axis direction), may be connected to each other via the first bridges BE1, and the sensing electrodes RE, which are adjacent to each other in the first direction (e.g., the X-axis direction), may be connected to each other via the second bridge BE2. The first bridges BE1 may be formed at (e.g., in or on) a different layer from that of the driving electrodes TE, and may be connected to the driving electrodes TE via first contact holes CNT1. For example, the first bridges BE1 may be disposed on a second buffer film BF2 (e.g., see FIG. 12), and the driving electrodes TE may be disposed on a first sensor insulating film TINS1 (e.g., see FIG. 12).

The first bridges BE1 may include at least one bent portion (e.g., may be formed to be bent at least once). FIG. 10 illustrates that the first bridges BE1 are bent in the shape of angle brackets e.g., "<" and ">"), but the shape of the first bridges BE1 is not limited thereto. Because the driving electrodes TE, which are adjacent to each other in the second direction (e.g., the Y-axis direction), are connected to each other by a plurality of first bridges BE1, the driving electrodes TE may be stably connected to each other even if one of the first bridges BE1 is short-circuited. FIG. 10 illustrates that the driving electrodes TE are connected to each other by two first bridges BE1, but the number of first bridges BE1 is not limited thereto.

The second bridge BE2 may be formed at (e.g., in or on) the same layer as that of the sensing electrodes RE, and may extend from the sensing electrode (e.g., may extend from between adjacent ones of the sensing electrodes) RE. The sensing electrodes RE and the second bridge BE2 may include (e.g., may be formed of) the same or substantially the same material. For example, the sensing electrodes RE and the second bridge BE2 may be disposed on the first sensor insulating film TINS1 (e.g., see FIG. 12).

The dummy patterns DE may be disposed on the first sensor insulating film TINS1, and may be spaced apart from the driving electrodes TE and the sensing electrodes RE.

As described above with reference to FIG. 10, the first bridges BE1 may be disposed on the second buffer film BF2, and the driving electrodes TE, the sensing electrodes RE, the dummy patterns DE, and the second bridge BE2 may be disposed on the first sensor insulating film TINS1. Accordingly, the driving electrodes TE and the sensing electrodes RE may be electrically isolated from each other at the crossing regions therebetween, the sensing electrodes RE may be electrically connected to each other in the first direction (e.g., the X-axis direction), and the driving electrodes TE may be electrically connected to each other in the second direction (e.g., the Y-axis direction).

Figure 11A:
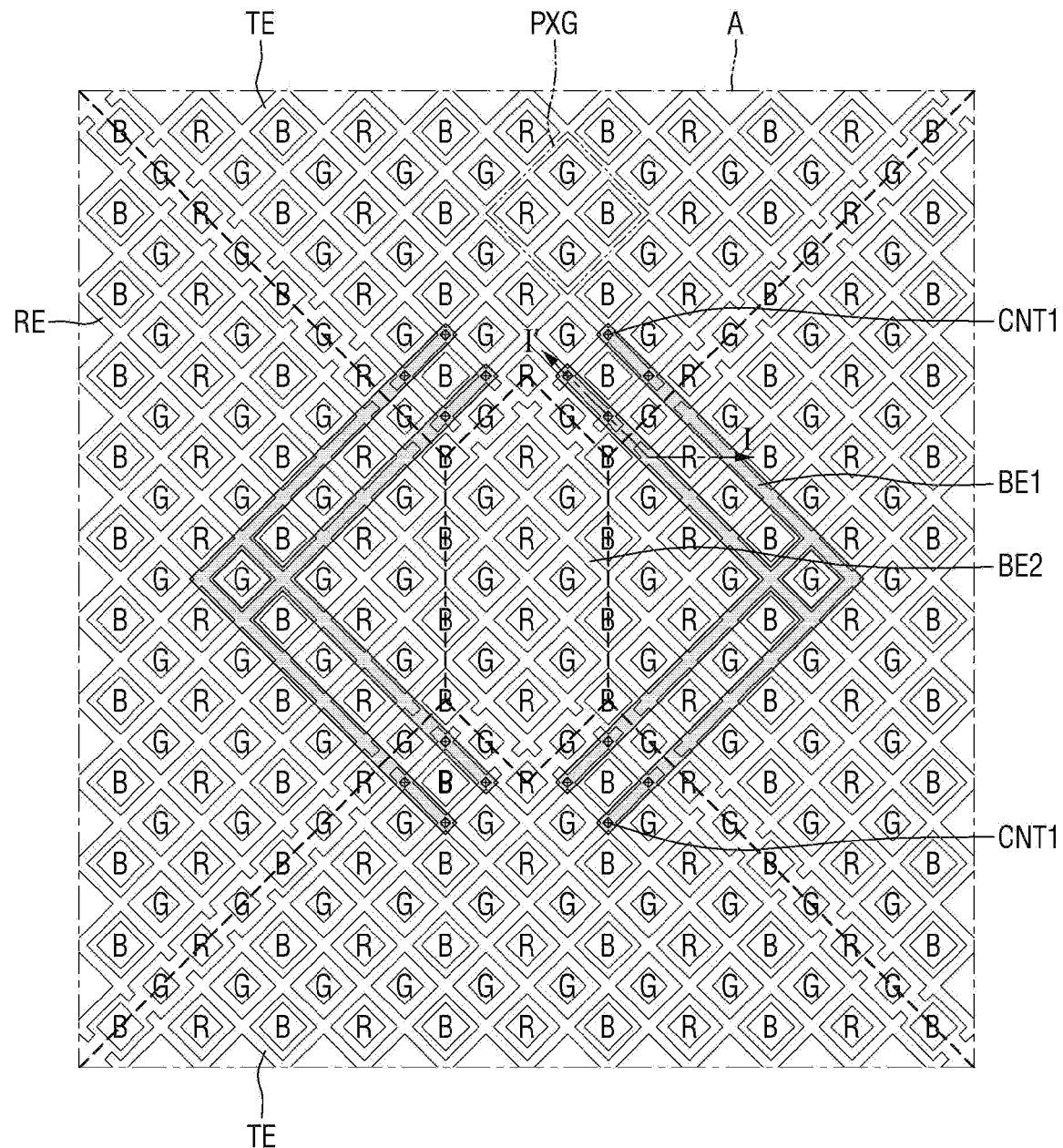
FIG. 11A is an enlarged plan view of the area A of FIG. 10.

FIG. 11A is an enlarged plan view of the area A of FIG. 10.

Referring to FIG. 11A, the driving electrodes TE, the sensing electrodes RE, the plurality of first bridges BE1, and the second bridge BE2 may be formed to have a mesh structure or a fishnet structure in in a plan view. The dummy patterns DE may also be formed to have a mesh or a fishnet structure in a plan view. In a case where the sensing unit (e.g., the sensing circuit or the sensing layer) SENL including the driving electrodes TE and the sensing electrodes RE is formed directly on a thin-film encapsulation layer TFEL (e.g., see FIG. 12), a large parasitic capacitance may be formed between the second electrode 173 of the light-emitting element layer EML and the driving electrodes TE (or the sensing electrodes RE) of the sensing unit SENL because the second electrode 173 of the light-emitting element layer EML may be too close to the driving electrodes TE and the sensing electrodes RE of the sensing unit SENL. Because the parasitic capacitance may be proportional to the overlapping area of the second electrode 173 of the light-emitting element layer EML and the driving electrodes TE (or the sensing electrodes RE) of the sensing unit SENL, the driving electrodes TE and the sensing electrodes RE of the sensing unit SENL may be formed to have a mesh structure or a fishnet structure in a plan view.

Because the driving electrodes TE, the sensing electrodes RE, the dummy patterns DE, and the second bridge BE2 may be formed at (e.g., in or on) the same layer as each other, the driving electrodes TE, the sensing electrodes RE, the dummy patterns DE, and the second bridge BE2 may be disposed to be spaced apart from one another. In this case, gaps or openings may be formed between the driving electrodes TE and the sensing electrodes RE, between the driving electrodes TE and the second bridge BE2, between the driving electrodes TE and the dummy patterns DE, and between the sensing electrodes RE and the dummy patterns DE. For convenience, in FIG. 11A, the boundaries between the driving electrodes TE and the sensing electrodes RE, between the driving electrodes TE and the second bridge BE2, between the driving electrodes TE and the dummy patterns DE, and between the sensing electrodes RE and the dummy patterns DE are indicated with dotted lines.

The first bridges BE1 may be connected to the driving electrodes TE via the first contact holes CNT1. A first end of each of a pair of corresponding first bridges BE1 may be connected to one from among a pair of adjacent driving electrodes TE (e.g., adjacent in the second direction or the Y-axis direction) via first contact holes CNT1, and a second end of each of the pair of corresponding first bridges BE1 may be connected to the other from among the pair of adjacent driving electrodes TE via other first contact holes CNT1. As shown in FIG. 11A, the first bridges BE1 may overlap with the driving electrodes TE and the sensing electrodes RE, but the present disclosure is not limited thereto. In another embodiment, the first bridges BE1 may overlap with the second bridge BE2, instead of overlapping with the sensing electrodes RE. In still another embodiment, the first bridges BE1 may overlap with the sensing electrodes RE and the second bridge BE2. Because the first bridges BE1 are formed at (e.g., in or on) a different layer from that of the driving electrodes TE, the first bridges BE1 may not be short-circuited from the sensing electrodes RE and/or the second bridge BE2, even if the first bridges BE1 overlap with the sensing electrodes RE and/or the second bridge BE2.

The second bridge BE2 may be disposed between the sensing electrodes RE. The second bridge BE2 may be formed at (e.g., in or on) the same layer as that of the sensing electrodes RE, and may extend from both of the sensing electrodes RE. Thus, the second bridge BE2 may be connected to the sensing electrodes RE without using contact holes.

Emission areas R, G, and B of subpixels include first emission areas R to emit light of a first color, second emission areas G to emit light of a second color, and third emission areas B to emit light of a third color. The first, second, and third colors may be a red color, a green color, and a blue color, respectively. FIG. 11A illustrates that the first emission areas R correspond to (e.g., may be) the emission areas of first subpixels PX1, the second emission areas G correspond to (e.g., may be) the emission areas of second subpixels PX2, and the third emission areas B correspond to (e.g., may be) the emission areas of third subpixels PX3, but the present disclosure is not limited thereto. As shown in FIG. 11A, each of the first emission areas R, the second emission areas G, and the third emission areas B may have a quadrangular shape in a plan view, but the present disclosure is not limited thereto. For example, in other example embodiments, the first emission areas R, the second emission areas G, and the third emission areas B may have any suitable shape in a plan view, for example, such as a polygonal shape other than a quadrangular shape, a circular shape, an elliptical shape, and/or the like. While FIG. 11A illustrates that the third emission areas B have the largest size (e.g., the largest area in a plan view), and that the second emission areas G have the smallest size (e.g., the smallest area in a plan view), the present disclosure is not limited thereto.

Figure 11B:
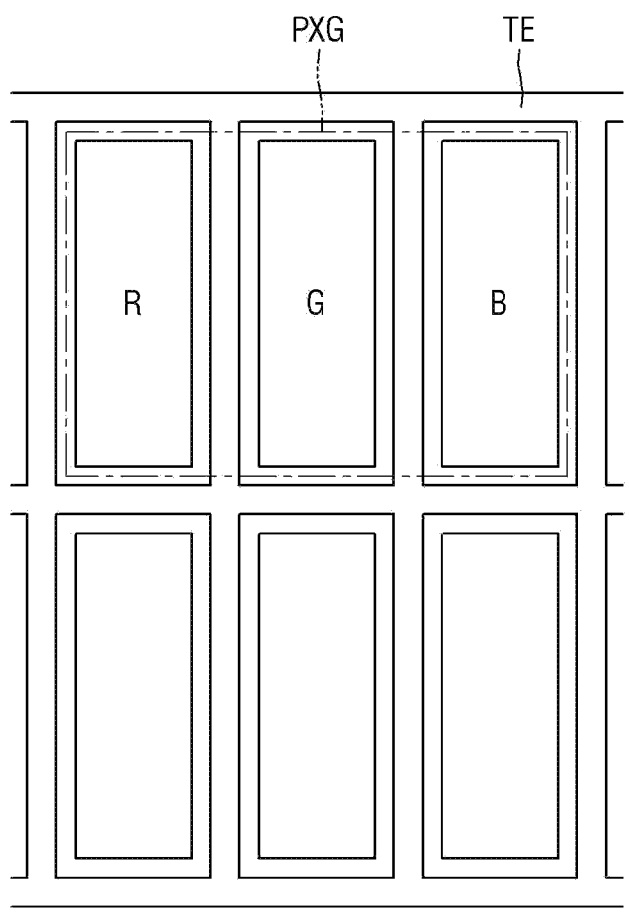
FIGS. 11B and 11C illustrate an arrangement of subpixels.
Figure 11C:
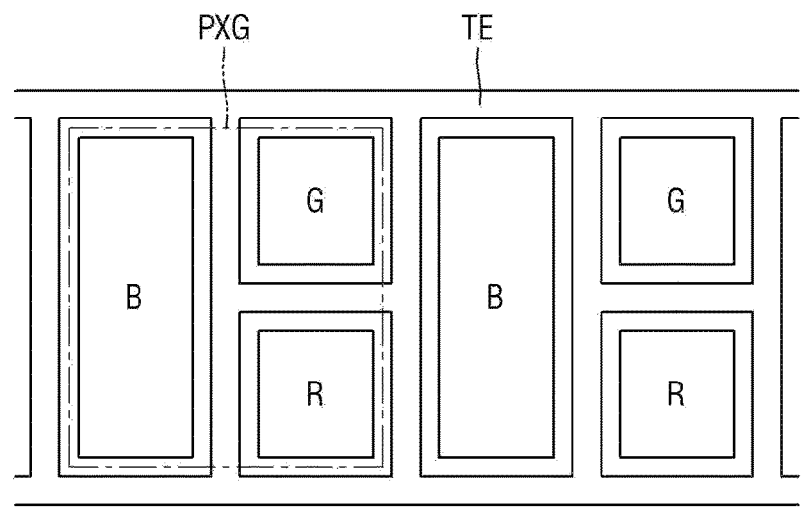

A pixel PXG may refer to a group of subpixels that may represent a grayscale (e.g., a grayscale level). FIG. 11A illustrates that a single pixel PXG includes one first emission area R, two second emission areas G, and one third emission area B, and that the first emission area R, the second emission areas G, and the third emission area B are arranged to form a diamond shape or rhombus shape in a plan view. However, the present disclosure is not limited thereto. For example, in an embodiment illustrated in FIG. 11B, a pixel PXG may include one first emission area R, one second emission area G, and one third emission area B, and the first, second, and third emission areas R, G, and B may be arranged in a stripe fashion (e.g., in a line) along the first direction (e.g., the X-axis direction). In another example, in an embodiment illustrated in FIG. 11C, a pixel PXG may include one first emission area R, one second emission area G, and one third emission area B, and the third emission area B may extend more (e.g., may extend longer) in the second direction (e.g., the Y-axis direction) than in the first direction (e.g., the X-axis direction), the third emission area B may extend more (e.g., may extend longer) in the second direction than each of the first and second emission areas R and G, and the first and second emission areas R and G may be disposed at one side (e.g., in the first direction or the X-axis direction) of the third emission area B. In this case, each of the first and second emission areas R and G may have a square shape or substantially a square shape in a plan view, or each of the first and second emission areas R and G may extend more (e.g., may extend longer) in the first direction (e.g., the X-axis direction) than in the second direction (e.g., the Y-axis direction) in the plan view.

Because the driving electrodes TE, the sensing electrodes RE, the dummy patterns DE, the plurality of first bridges BE1, and the second bridge BE2 may be formed to have a mesh structure or a fishnet structure in a plan view, the emission areas R, G, and B may not overlap with the driving electrodes TE, the sensing electrodes RE, the dummy patterns DE, the first bridges BE1, and the second bridge BE2. Accordingly, light emitted from the emission areas R, G, and B may be prevented or substantially prevented from being blocked by the driving electrodes TE, the sensing electrodes RE, the dummy patterns DE, the first bridges BE1, and/or the second bridge BE2, and as a result, a decrease in the brightness of the light emitted from the emission areas R, G, and B may be prevented or reduced.

Figure 12:
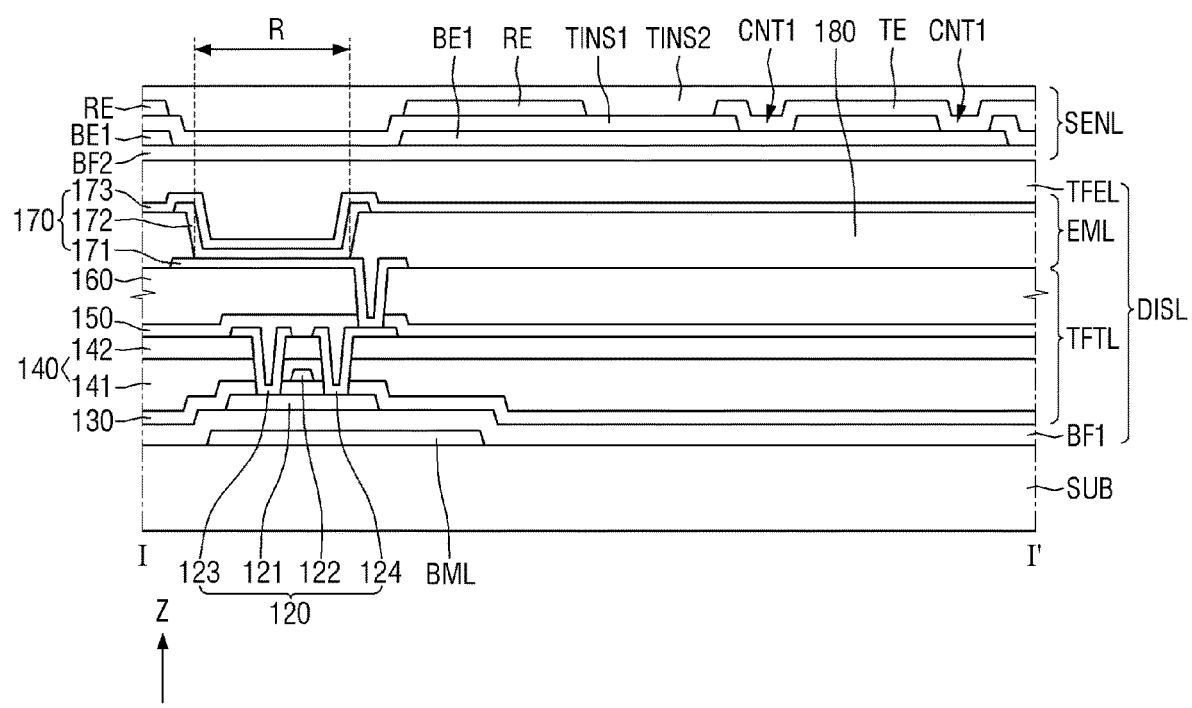
FIG. 12 is a cross-sectional view taken along the line I-I' of FIG. 11A.

FIG. 12 is a cross-sectional view taken along the line I-I' of FIG. 11A.

In more detail, FIG. 12 illustrates the connection structure between the driving electrodes TE and the first bridges BE1 of the sensing unit (e.g., the sensing circuit or the sensing layer) SENL.

Referring to FIG. 12, the display unit DISL, which includes a first buffer film BF1, a TFT layer TFTL, a light-emitting element layer EML, and the thin-film encapsulation layer TFEL, is formed on the substrate SUB. The TFT layer TFTL may include a TFT 120, a gate insulating film 130, an interlayer insulating film 140, a passivation film 150, and a planarization film 160.

A light-blocking layer BML may be formed on a surface of the substrate SUB. The light-blocking layer BML may be a layer for blocking light incident upon an active layer 121, and may overlap with the active layer 121. The light-blocking layer BML may be formed as a single-layer film or a multi-layered film including molybdenum (Mo), aluminum (Al), chromium (Cr), gold (Au), titanium (Ti), nickel (Ni), neodymium (Nd), copper (Cu), and/or an alloy thereof.

The first buffer film BF1 may be formed on the light-blocking layer BML. The first buffer film BF1 may be formed on the surface of the substrate SUB to protect the TFT 120 and an organic light-emitting layer 172 of the light-emitting element layer EML from moisture and/or the like that may penetrate the substrate SUB. The first buffer film BF1 may include a plurality of inorganic films that are alternately stacked on one another. For example, the first buffer film BF1 may be formed as a multilayered film in which one or more inorganic films selected from among a silicon nitride layer, a silicon oxynitride layer, a silicon oxide layer, a titanium oxide layer, and an aluminum oxide layer are alternately stacked on one another. However, the present disclosure is not limited thereto, and the first buffer film BF1 may be omitted (e.g., may not be provided).

The TFT layer TFTL, which includes the TFT 120, is formed on the first buffer film BF1. The TFT 120 includes the active layer 121, a gate electrode 122, a source electrode 123, and a drain electrode 124. FIG. 12 illustrates that the TFT 120 has a top-gate structure in which the gate electrode 122 is disposed above the active layer 121, but the present disclosure is not limited thereto. For example, in other embodiments, the TFT 120 may be formed to have a bottom-gate structure in which the gate electrode 122 is disposed below the active layer 121, or a double-gate structure in which the gate electrode (e.g., including a plurality of gate electrodes) 122 is disposed both above and below the active layer 121.

The active layer 121 is formed on the first buffer film BF1. The active layer 121 may include polycrystalline silicon, monocrystalline silicon, low-temperature polycrystalline silicon, amorphous silicon, or an oxide semiconductor. For example, the oxide semiconductor may include a binary compound (ABx), a ternary compound (ABxCy), or a quaternary compound (ABxCyDz), including (e.g., containing), for example, indium (In), zinc (Zn), gallium (Ga), tin (Sn), Ti, Al, hafnium (Hf), zirconium (Zr), and/or magnesium (Mg). For example, the active layer 121 may include indium tin zinc oxide (ITZO) or indium gallium zinc oxide (IGZO). A light-blocking layer for blocking external light incident upon the active layer 121 may be formed between the first buffer film BF1 and the active layer 121.

The gate insulating film 130 may be formed on the active layer 121. The gate insulating film 130 may be formed as an inorganic film, for example, such as a silicon nitride layer, a silicon oxynitride layer, a silicon oxide layer, a titanium oxide layer, or an aluminum oxide layer. FIG. 12 illustrates that the gate insulating film 130 is formed at (e.g., in or on) an overlapping area of the gate insulating film 130 and the gate electrode 122, as well as formed at (e.g., in or on) a non-overlapping area other than the overlapping area, but the present disclosure is not limited thereto. For example, in another embodiment, the gate insulating film 130 may be formed at (e.g., in or on) the overlapping area of the gate insulating film 130 and the gate electrode 122, and may not be formed at (e.g., may be omitted from) the non-overlapping area.

The gate electrode 122 and a scan line may be formed on the gate insulating film 130. The gate electrode 122 and the scan line may be formed as a single-layer film or multi-layered films including Mo, Al, Cr, Au, Ti, Ni, Nd, Cu, and/or an alloy thereof.

The interlayer insulating film 140 may be formed on the gate electrode 122 and the scan line. The interlayer insulating film 140 may include first and second interlayer insulating films 141 and 142. The first and second interlayer insulating films 141 and 142 may be formed as, for example, silicon nitride layers, silicon oxynitride layers, silicon oxide layers, titanium oxide layers, or aluminum oxide layers.

Source and drain electrodes 123 and 124 may be formed on the interlayer insulating film 140. The source and drain electrodes 123 and 124 may be connected to the active layer 121 through contact holes that penetrate (e.g., that extend through) the gate insulating film 130 and the interlayer insulating film 140. The source and drain electrodes 123 and 124 may be formed as a single-layer film or multi-layered films including Mo, Al, Cr, Au, Ti, Ni, Nd, Cu, and/or an alloy thereof.

The passivation film 150 may be formed on the source and drain electrodes 123 and 124 to insulate the TFT 120. The passivation film 150 may be formed as an inorganic film, for example, such as a silicon nitride layer, a silicon oxynitride layer, a silicon oxide layer, a titanium oxide layer, or an aluminum oxide layer.

The planarization film 160 may be formed on the passivation film 150 to planarize a height difference generated by the TFT 120. The planarization film 160 may be formed as an organic film including, for example, an acrylic resin, an epoxy resin, a phenolic resin, a polyamide resin, or a polyimide resin.

The light-emitting element layer EML is formed on the TFT layer TFTL. The light-emitting element layer EML includes a light-emitting element 170 and a pixel-defining film 180.

The light-emitting element 170 and the pixel-defining film 180 are formed on the planarization film 160. The light-emitting element 170 may include a first electrode 171, the organic light-emitting layer 172, and the second electrode 173.

The first electrode 171 may be formed on the planarization film 160. FIG. 12 illustrates that the first electrode 171 is connected to the drain electrode 124 of the TFT 120 via a contact hole that penetrates (e.g., that extends through) the passivation film 150 and the planarization film 160, but the present disclosure is not limited thereto. For example, the first electrode 171 may be connected to the source electrode 123 of the TFT 120 via a contact hole that penetrates (e.g., that extends through) the passivation film 150 and the planarization film 160.

In a top-emission structure where light is emitted in a direction from the organic light-emitting layer 172 towards the second electrode 173, the first electrode 171 may be formed of a metallic material having a high reflectance, for example, such as a stack of Al and Ti (e.g., Ti/Al/Ti), a stack of Al and indium tin oxide (ITO) (e.g., ITO/Al/ITO), a silver-palladium-copper (APC) alloy, or a stack of an APC alloy and ITO (e.g., ITO/APC/ITO). In another embodiment, the first electrode 171 may be formed as a single layer including Mo, Ti, Cu, or Al.

In a bottom-emission structure where light is emitted in a direction from the organic light-emitting layer 172 towards the first electrode 171, the first electrode 171 may be formed of a transparent conductive oxide (TCO) material, for example, such as ITO or indium zinc oxide (IZO), that may transmit light therethrough, or a translucent metallic material, for example, such as Mg, Ag, or an alloy thereof. In the case where the first electrode 171 is formed of the translucent metallic material, the emission efficiency of the light-emitting element layer EML may be improved due to a micro-cavity effect.

The pixel-defining film 180 may be formed on the planarization film 160 to define (e.g., to expose) the first electrode 171, and thus, to define, for example, a first emission area R. The pixel-defining film 180 may be formed to cover edges of the first electrode 171. The pixel-defining film 180 may be formed as an organic film including, for example, an acrylic resin, an epoxy resin, a phenolic resin, a polyamide resin, or a polyimide resin.

The first emission area R refers to an area in which the first electrode 171, the organic light-emitting layer 172, and the second electrode 173 are sequentially stacked on one another so that holes from the first electrode 171 and electrons from the second electrode 173 may be combined together to emit light. Second and third light-emitting areas G and B may be formed in the same or substantially the same manner as that of the first emission area R shown in FIG. 12.

The organic light-emitting layer 172 is formed on the first electrode 171 and the pixel-defining film 180. The organic light-emitting layer 172 may include an organic material, and may emit light having a suitable or desired color (e.g., having a predetermined color). For example, the organic light-emitting layer 172 may include a hole transport layer, an organic material layer, and an electron transport layer. In this example, the organic light-emitting layer 172 of the first emission area R may emit red colored light, an organic light-emitting layer 172 of a second emission area G may emit green colored light, and an organic light-emitting layer 172 of a third emission area B may emit blue colored light.

In another example, the organic light-emitting layers 172 of the first, second, and third emission areas R, G, and B may be formed as single-layer films, and may emit white light, ultraviolet (UV) light, or blue light. In this example, the first, second, and third emission areas R, G, and B may overlap with red, green, and blue color filter layers, respectively. The red, green, and blue filter layers may transmit red light, green light, and blue light, respectively, therethrough. The red, green, and blue color filter layers may be disposed on the thin-film encapsulation layer TFEL. The first, second, and third emission areas R, G, and B may also overlap with red, green, and blue wavelength conversion layers, respectively. The red, green, and blue wavelength conversion layers may convert UV light or blue light into red light, green light, and blue light, respectively. The red, green, and blue wavelength conversion layers may be disposed on the thin-film encapsulation layer TFEL. For example, the red wavelength conversion layer may be disposed between the thin-film encapsulation layer TFEL and the red color filter layer, the green wavelength conversion layer may be disposed between the thin-film encapsulation layer TFEL and the green color filter layer, and the blue wavelength conversion layer may be disposed between the thin-film encapsulation layer TFEL and the blue color filter layer.

The second electrode 173 is formed on the organic light-emitting layer 172. The second electrode 173 may be formed to cover the organic light-emitting layer 172. The second electrode 173 may be a common layer (e.g., a common electrode) formed in common for all of the pixels PXG. A capping layer may be formed on the second electrode 173.

In the top-emission structure, the second electrode 173 may be formed of a TCO material, for example, such as ITO or IZO, that may transmit light therethrough, or a translucent metallic material, for example, such as Mg, Ag, or an alloy thereof. In a case where the second electrode 173 is formed of the translucent metallic material, the emission efficiency of the light-emitting element layer EML may be improved due to a micro-cavity effect.

In the bottom-emission structure, the second electrode 173 may be formed of a metallic material having a high reflectance, for example, such as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO). In another example, the second electrode 173 may be formed as a single layer including Mo, Ti, Cu, Al, or ITO.

The thin-film encapsulation layer TFEL is formed on the light-emitting element layer EML. The thin-film encapsulation layer TFEL is disposed on the second electrode 173. The thin-film encapsulation layer TFEL may include at least one inorganic film for preventing or substantially preventing the penetration of oxygen, moisture, and/or the like into the organic light-emitting layer 172 and the second electrode 173. The thin-film encapsulation layer TFEL may also include at least one organic film for protecting the light-emitting element layer EML from foreign materials, for example, such as dust. For example, the thin-film encapsulation layer TFEL may include a first inorganic film disposed on the second electrode 173, an organic film disposed on the first inorganic film, and a second inorganic film disposed on the organic film. The first and second inorganic films may be formed as silicon nitride layers, silicon oxynitride layers, silicon oxide layers, titanium oxide layers, or aluminum oxide layers, but the present disclosure is not limited thereto. The organic film may be formed of an acrylic resin, an epoxy resin, a phenolic resin, a polyamide resin, or a polyimide resin, but the present disclosure is not limited thereto.

The sensing unit (e.g., the sensing circuit or the sensing layer) SENL is formed on the thin-film encapsulation layer TFEL. The sensing unit SENL may include driving electrodes TE, sensing electrodes RE, proximity sensing electrodes PE, dummy patterns DE, bridges (e.g., BE1, BE2, and BE3), first driving lines TL1, second driving lines TL2, input sensing lines RL, proximity sensing lines PL, the first through fifth guard lines GL1 through GL5, and the first through third ground lines GRL1 through GRL3. For convenience, FIG. 12 illustrates a connection structure between the driving electrodes TE and the first bridges BE1 of the sensing unit SENL.

The second buffer film BF2 may be formed on the thin-film encapsulation layer TFEL. The second buffer film BF2 may be formed as a multilayered film in which one or more inorganic films selected from among a silicon nitride layer, a silicon oxynitride layer, a silicon oxide layer, a titanium oxide layer, and an aluminum oxide layer are alternately stacked.

The first bridges BE1 may be formed on the second buffer film BF2. The first bridges BE1 may be formed of, for example, a stack of Al and Ti (e.g., Ti/Al/Ti), a stack of Al and ITO (e.g., ITO/Al/ITO), an APC alloy, or a stack of an APC alloy and ITO (e.g., ITO/APC/ITO), but the present disclosure is not limited thereto. For example, in another embodiment, the first bridges BE1 may be formed as single layers of Mo, Ti, Cu, Al, or ITO.

The first sensor insulating film TINS1 is formed on the first bridges BE1. The first sensor insulating film TINS1 may be formed as an inorganic film, for example, such as a silicon nitride layer, a silicon oxynitride layer, a silicon oxide layer, a titanium oxide layer, or an aluminum oxide layer. In another embodiment, the first sensor insulating film TINS1 may be formed as an organic film including, for example, an acrylic resin, an epoxy resin, a phenolic resin, a polyamide resin, or a polyimide resin.

Driving electrodes TE and sensing electrodes RE may be formed on the first sensor insulating film TINS1, and may be spaced apart from each other on the first sensor insulating film TINS1. The driving electrodes TE and the sensing electrodes RE may be formed of, for example, a stack of Al and Ti (e.g., Ti/Al/Ti), a stack of Al and ITO (e.g., ITO/Al/ITO), an APC alloy, or a stack of an APC alloy and ITO (e.g., ITO/APC/ITO), but the present disclosure is not limited thereto. In another example embodiment, the driving electrodes TE and the sensing electrodes RE may be formed as single layers of Mo, Ti, Cu, Al, or ITO. The driving electrodes TE and the sensing electrodes RE may be formed at (e.g., in or on) the same layer, and may include the same or substantially the same material, as that of the dummy patterns DE, second bridges BE2, the first driving lines TL1, the second driving lines TL2, the input sensing lines RL, the first through fifth guard lines GL1 through GL5, and the first through third ground lines GRL1 through GRL3 of the sensing unit SENL, but the present disclosure is not limited thereto.

The first contact holes CNT1 may be formed to penetrate (e.g., to extend through) the first sensor insulating film TINS1, and thus, the first contact holes CNT1 may expose the first bridges BE1. The driving electrodes TE may be connected to the first bridges BE1 through the first contact holes CNT1.

A second sensing insulating film TINS2 is formed on the driving electrodes TE and the sensing electrodes RE. The second sensing insulating film TINS2 may planarize height differences generated by the driving electrodes TE, the sensing electrodes RE, and the first bridges BE1. The second sensing insulating film TINS2 may be formed as an organic film including, for example, an acrylic resin, an epoxy resin, a phenolic resin, a polyamide resin, or a polyimide resin.

According to the embodiment of FIG. 12, the first bridges BE1, which connect a pair of adjacent driving electrodes TE (e.g., adjacent in the second direction or the Y-axis direction) to each other, may be disposed on the second buffer film BF2, and the sensing electrodes RE and the second bridges BE2 may be disposed on the first sensor insulating film TINS1. Accordingly, the driving electrodes TE and the sensing electrodes RE may be electrically isolated from each other at the crossing regions therebetween, the sensing electrodes RE may be electrically connected to each other in the first direction (e.g., the X-axis direction), and the driving electrodes TE may be electrically connected to each other in the second direction (e.g., the Y-axis direction).

FIG. 13 is a plan view illustrating exemplary driving electrodes, exemplary sensing electrodes, exemplary proximity sensing electrodes, and exemplary dummy patterns at (e.g., in or on) the second sensing area of FIG. 7.

For convenience, FIG. 13 illustrates one row of three adjacent sensing electrodes RE (e.g., adjacent in the first direction or the X-axis direction) at (e.g., in or on) the second sensing area TSA2, and two columns of adjacent driving electrodes TE (e.g., adjacent in the second direction or the Y-axis direction) at (e.g., in or on) the second sensing area TSA2.

The driving electrodes TE, the sensing electrodes RE, the first bridges BE1, and the second bridges BE2 shown in FIG. 13 are the same or substantially the same as their respective counterparts described with reference to FIG. 10, and thus, redundant description thereof may not be repeated.

Referring to FIG. 13, the proximity sensing electrodes PE may be arranged along the first direction (e.g., the X-axis direction), and may be electrically connected to each other. The driving electrodes TE may be arranged along the second direction (e.g., the Y-axis direction), and may be electrically connected to each other. The proximity sensing electrodes PE may be surrounded (e.g., around a periphery thereof) by the sensing electrodes RE, and the dummy patterns DE. The proximity sensing electrodes may be electrically isolated from the sensing electrodes RE. The proximity sensing electrodes PE may be disposed to be spaced apart from the sensing electrodes RE. The dummy patterns DE may be electrically isolated from the driving electrodes TE. The dummy patterns DE may be disposed to be spaced apart from the driving electrodes TE.

In order for the proximity sensing electrodes PE and the driving electrodes TE to be electrically isolated from each other at the crossing regions therebetween, the driving electrodes TE, which are adjacent to one another in the second direction (e.g., the Y-axis direction), may be connected to each other via the first bridges BE1, and the proximity sensing electrodes PE, which are adjacent to one another in the first direction (e.g., the X-axis direction), may be connected to each other via third bridges BE3.

Figure 14A:
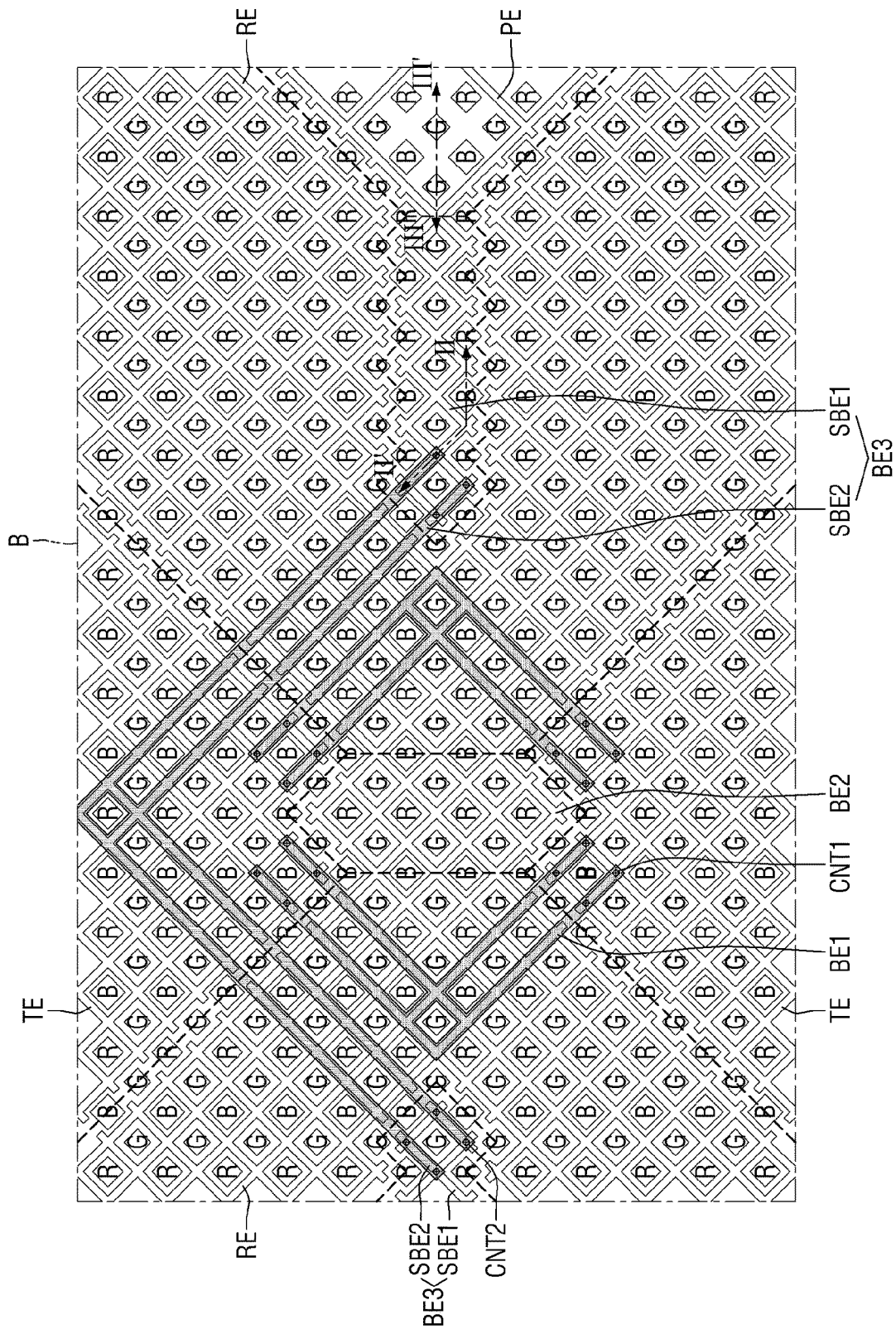
FIGS. 14A and 14B are enlarged plan views of the area B of FIG. 13.

Referring to FIG. 14A, which will be described in more detail below, the third bridges BE3 may include first sub-bridges SBE1, which are disposed at (e.g., in or on) the same layer as that of the proximity sensing electrodes PE, and second sub-bridges SBE2, which are connected to the first sub-bridges SBE1 via second contact holes CNT2. The first sub-bridges SBE1 may be electrically isolated from the sensing electrodes RE, and may be disposed to be spaced apart from the sensing electrodes RE. For example, referring to FIGS. 14A, 15, and 16, the second sub-bridges SBE2 may be disposed on the second buffer film BF2, and the proximity sensing electrodes PE and the first sub-bridges SBE1 may be disposed on the first sensor insulating film TINS1.

The second sub-bridges SBE2 may include at least one bent portion (e.g., may be formed to be bent at least once). FIG. 13 illustrates that the second sub-bridges SBE2 are bent in the shape of angle brackets (e.g., "<" and ">"), but the shape of the second sub-bridges SBE2 is not limited thereto. FIG. 13 illustrates that two of the first sub-bridges SBE1 are connected to each other by a single second sub-bridge SBE2, but the present disclosure is not limited thereto, and two of the first sub-bridges SBE1 may be connected to each other by any suitable number of second sub-bridges SBE2.

Figure 14B:
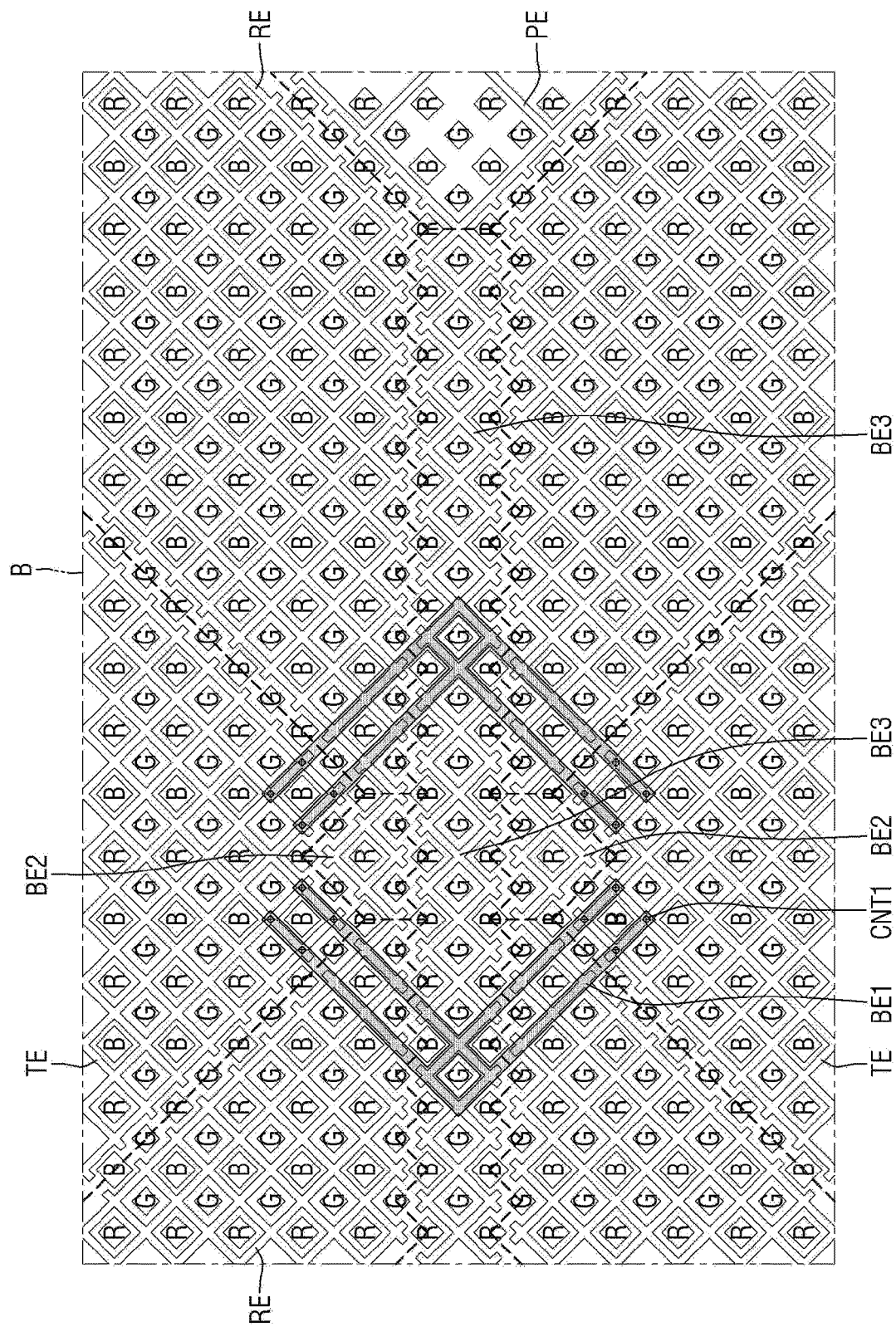

Referring to FIG. 14B, which will be described in more detail below, in another example embodiment, the third bridges BE3 may be formed at (e.g., in or on) the same layer, and may include the same or substantially the same material, as that of the proximity sensing electrodes PE, and may extend from the proximity sensing electrodes PE. In this case, the third bridges BE3 may be electrically isolated from the sensing electrodes RE and the second bridges BE2, and may be disposed to be spaced apart from the sensing electrodes RE and the second bridges BE2. The third bridges BE3 may be disposed on the first sensor insulating film TINS1.

The proximity sensing electrodes PE and the dummy patterns DE may have a quadrangular shape in a plan view, but the present disclosure is not limited thereto. The proximity sensing electrodes PE may have a mesh structure or a fishnet structure in a plan view.

At (e.g., in or on) the second sensing area TSA2, the density of the proximity sensing electrodes PE that do not overlap with a sensor SENS may be greater than (e.g., may be larger than) the density of a proximity sensing electrode PE that overlaps with the sensor SENS. In other words, the density of the proximity sensing electrode PE that overlaps with the sensor SENS may be less than (e.g., may be smaller than) the density of the proximity sensing electrodes PE that do not overlap with the sensor SENS. For example, at (e.g., in or on) the second sensing area TSA2, the mesh hole size of the proximity sensing electrode PE that overlaps with the sensor SENS may be greater than (e.g., may be larger than) the mesh hole size of the proximity sensing electrodes PE that do not overlap with the sensor SENS. In this case, at (e.g., in or on) the second sensing area TSA2, the density of the proximity sensing electrode PE that overlaps with the sensor SENS may be less than (e.g., may be smaller than) the density of the dummy patterns DE. For example, at (e.g., in or on) the second sensing area TSA2, the mesh hole size of the proximity sensing electrode PE that overlaps with the sensor SENS may be greater than (e.g., may be larger than) the mesh hole size of the dummy patterns DE. Further, at (e.g., in or on) the second sensing area TSA2, the density of the proximity sensing electrode PE that overlaps with the sensor SENS may be less than (e.g., may be smaller than) the density of the driving electrodes TE and the density of the sensing electrodes RE. For example, at (e.g., in or on) the second sensing area TSA2, the mesh hole size of the proximity sensing electrode PE that overlaps with the sensor SENS may be greater than (e.g., may be larger than) the mesh hole sizes of the driving electrodes TE and the sensing electrodes RE. Accordingly, because the transmittance of the sensing unit SENL of the display panel 300 that overlaps with the sensor SENS may be enhanced, the degradation of the sensing capability of the sensing unit SENL may be prevented or reduced, even when the sensor SENS is disposed at the bottom of the display panel 300. The sensor SENS may be one from among the sensors 740, 750, 760, and 770, which are disposed on the main circuit board 700 of FIG. 2, but the present disclosure is not limited thereto. For example, in an embodiment, the sensor SENS may be a sensor that senses light at the top surface of the display panel 300.

As described above with reference to FIG. 9, in order to detect a proximity input from the user, the sensing driving signal TD is applied to a plurality of columns of the driving electrodes TE concurrently (e.g., simultaneously or at the same time), and the voltage charged in the second mutual capacitance Cm2 may be detected via a plurality of rows of the proximity sensing electrodes PE. Thus, the second mutual capacitance Cm2 may be greater than the first mutual capacitance Cm1. Accordingly, even when the density of one of the proximity sensing electrodes PE is reduced, the degradation of the performance of proximity sensing may be prevented or reduced.

According to another embodiment of the present disclosure, at (e.g., in or on) the second sensing area TSA2, the proximity sensing electrodes PE may have the same or substantially the same density as each other. For example, at (e.g., in or on) the second sensing area TSA2, the proximity sensing electrodes PE may have the same or substantially the same mesh hole size as each other (e.g., irrespective of whether or not the proximity sensing electrode PE overlaps with the sensor SENS). In this example, at (e.g., in or on) the second sensing area TSA2, the density of the proximity sensing electrodes PE may be less than (e.g., may be smaller than) the density of the dummy patterns DE. For example, at (e.g., in or on) the second sensing area TSA2, the mesh hole size of the proximity sensing electrodes PE may be greater than (e.g., may be larger than) the mesh hole size of the dummy patterns DE. Further, at (e.g., in or on) the second sensing area TSA2, the density of the proximity sensing electrodes PE may be less than (e.g., may be smaller than) the density of the driving electrodes TE and the density of the sensing electrodes RE. For example, at (e.g., in or on) the second sensing area TSA2, the mesh hole size of the proximity sensing electrodes PE may be greater than (e.g., may be larger than) the mesh hole sizes of the driving electrodes TE and the sensing electrodes RE.

According to another example embodiment of the present disclosure, at (e.g., in or on) the second sensing area TSA2, the density of the proximity sensing electrodes PE may be the same or substantially the same as the density of the dummy patterns DE. For example, at (e.g., in or on) the second sensing area TSA2, the mesh hole size of the proximity sensing electrodes PE may be the same or substantially the same as the mesh hole size of the dummy patterns DE. In this example, at (e.g., in or on) the second sensing area TSA2, each of the density of the proximity sensing electrodes PE and the density of the dummy pattern DE may be less than (e.g., may be smaller than) the density of the driving electrodes TE and the density of the sensing electrodes RE. For example, at (e.g., in or on) the second sensing area TSA2, the mesh hole sizes of the proximity sensing electrodes PE and the dummy patterns DE may be greater than (e.g., may be larger than) the mesh hole sizes of the driving electrodes TE and the sensing electrodes RE.

As illustrated in FIG. 13, because the density of the proximity sensing electrode PE that overlaps with the sensor SENS is less than (e.g., is smaller than) the density of the driving electrodes TE and/or the density of the sensing electrodes RE, the transmittance of the sensing unit SENL of the display panel 300 that overlaps with the sensor SENS may be enhanced, and as a result, the degradation of the sensing capability of the sensing unit SENL may be prevented or reduced, even when the sensor SENS is disposed at the bottom of the display panel 300.

FIG. 14A is an enlarged plan view of the area B of FIG. 13.

The driving electrodes TE, the sensing electrodes RE, the first bridges BE1, and the second bridge BE2 of FIG. 14A may be the same or substantially the same as their respective counterparts described above with reference to FIG. 11A, and thus, redundant description thereof may not be repeated.

Referring to FIG. 14A, the proximity sensing electrodes PE and the first and second sub-bridges SBE1 and SBE2 of the third bridges BE3 may be formed to have a mesh structure or a fishnet structure in a plan view. In the case where the sensing unit SENL, which includes the proximity sensing electrodes PE, is formed directly on the thin-film encapsulation layer TFEL (e.g., as illustrated in FIG. 12), a large parasitic capacitance may be formed between the second electrode 173 of the light-emitting element layer EML and the proximity sensing electrodes PE of the sensing unit SENL, because the second electrode 173 of the light-emitting element layer EML may be too close to the proximity sensing electrodes PE of the sensing unit SENL. Because the parasitic capacitance may be proportional to the overlapping area of the second electrode 173 of the light-emitting element layer EML and the proximity sensing electrodes PE of the sensing unit SENL, the proximity sensing electrodes PE of the sensing unit SENL may be formed to have a mesh structure or a fishnet structure in a plan view.

Because the proximity sensing electrodes PE, the first sub-bridges SBE1, and the second sub-bridges SBE2 may be formed to have the mesh structure or the fishnet structure in the plan view, the emission areas R, G, and B may not overlap with the proximity sensing electrodes PE, the first sub-bridges SBE1, and the second sub-bridges SBE2. Accordingly, light emitted from the emission areas R, G, and B may be prevented or substantially prevented from being blocked by the proximity sensing electrodes PE, the first sub-bridges SBE1, and the second sub-bridges SBE2, and as a result, the decrease of the brightness of the light may be prevented or reduced.

Because the proximity sensing electrodes PE and the first sub-bridges SBE1 may be formed at (e.g., in or on) the same layer as that of the driving electrodes TE, the sensing electrodes RE, and the second bridges BE2, the proximity sensing electrodes PE and the first sub-bridges SBE1 may be disposed to be spaced apart from the driving electrodes TE, the sensing electrodes RE, and the second bridges BE2. In this case, gaps or openings may be formed between the driving electrodes TE and the sensing electrodes RE, and between the first sub-bridges SBE1 and the sensing electrodes RE. For convenience, the boundaries between the driving electrodes TE and the sensing electrodes RE, between the driving electrodes TE and the second bridges BE2, between the sensing electrodes RE and the second bridges BE2, between the proximity sensing electrodes PE and the sensing electrodes RE, between the first sub-bridges SBE1 and the sensing electrodes RE, and between the proximity sensing electrodes PE and the first sub-bridges SBE1 are indicated in FIG. 14A with dotted lines.

The first bridges BE1 may be formed at (e.g., in or on) the same layer as that of the proximity sensing electrodes PE, and may extend from the proximity sensing electrodes PE. Thus, the first bridges BE1 may be connected to the proximity sensing electrodes PE without using contact holes.

The second sub-bridges SBE2 may be connected to the first sub-bridges SBE1 via the second contact holes CNT2. A first end of a corresponding second sub-bridge SBE2 may be connected to one from among a pair of adjacent first sub-bridges SBE1 (e.g., adjacent in the first direction or the X-axis direction) via second contact holes CNT2, and a second end of the corresponding second sub-bridge SBE2 may be connected to the other from among the pair of adjacent first sub-bridges SBE1 via other second contact holes CNT2. The second sub-bridges SBE2 may overlap with the driving electrodes TE and the sensing electrodes RE. Because the second sub-bridges SBE2 may be formed at (e.g., in or on) a different layer from that of the driving electrodes TE and the sensing electrodes RE, the second sub-bridges SBE2 may not be short-circuited from the driving electrodes TE and the sensing electrodes RE, even when the second sub-bridges SBE2 overlap with the driving electrodes and the sensing electrodes RE.

FIG. 14B is an enlarged plan view of the area B of FIG. 13.

The embodiment of FIG. 14B may be different from the embodiment of FIG. 14A in that the third bridges BE3 in FIG. 14B may be formed at (e.g., in or on) the same layer, and may include the same or substantially the same material, as that of the proximity sensing electrodes PE.

Referring to FIG. 14B, the third bridges BE3 may extend from the proximity sensing electrodes PE. The third bridges BE3 may connect adjacent ones of the proximity sensing electrodes PE to one another. A first end of a corresponding third bridge BE3 may be connected to one from among a pair of adjacent proximity sensing electrodes PE (e.g., adjacent in the first direction or the X-axis direction), and a second end of the corresponding third bridge BE3 may be connected to the other from among the pair of adjacent proximity sensing electrodes PE.

The third bridges BE3 may be electrically isolated from the sensing electrodes RE and the second bridges BE2, and may be disposed to be spaced apart from the sensing electrodes RE and the second bridges BE2. Because the third bridges BE3 may be formed at (e.g., in or on) the same layer, and may include the same or substantially the same material, as that of the proximity sensing electrodes PE, the third bridges BE3 may be disposed on the first sensor insulating film TINS1 (e.g., see FIG. 12).

Figure 15:
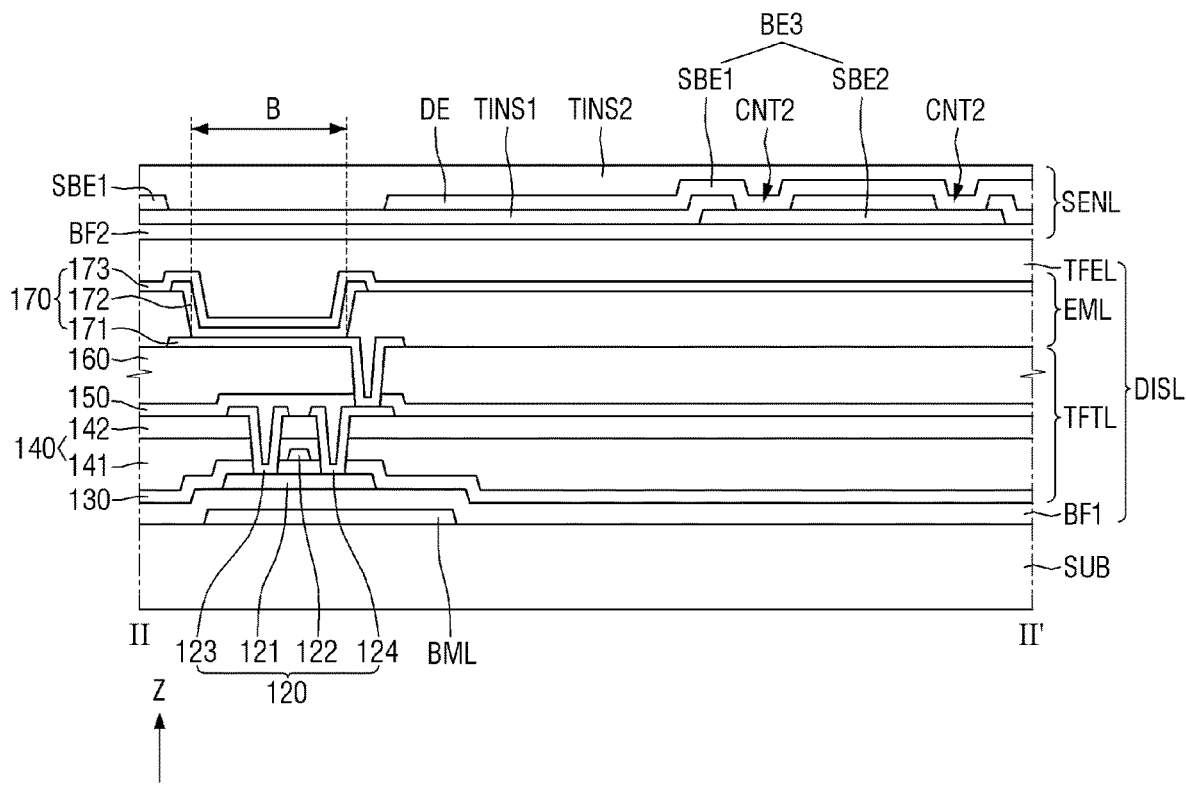
FIG. 15 is a cross-sectional view taken along the line II-II' of FIG. 14A.
Figure 16:
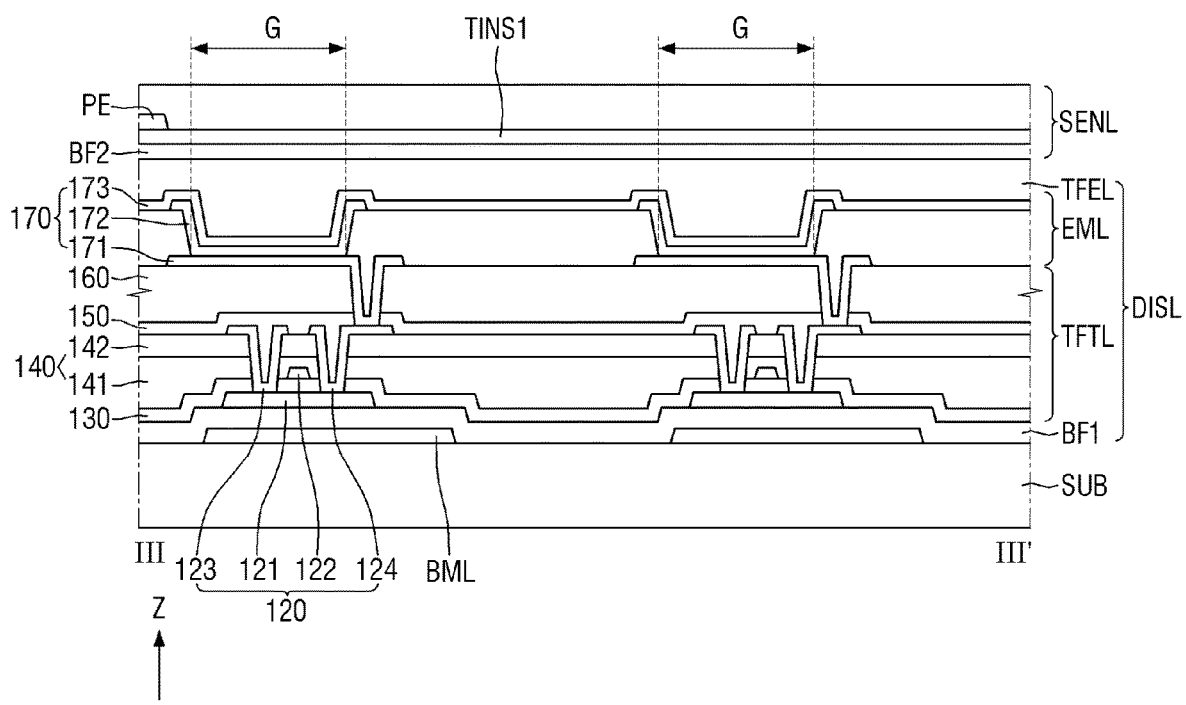
FIG. 16 is a cross-sectional view taken along the line III-III' of FIG. 14A.

FIG. 15 is a cross-sectional view taken along the line II-II' of FIG. 14A. FIG. 16 is a cross-sectional view taken along the line III-III' of FIG. 14A.

A display unit (e.g., a display circuit or a display layer) DISL of FIGS. 15 and 16 is the same or substantially the same as its counterpart described with reference to FIG. 12, and thus, redundant description thereof may not be repeated.

Referring to FIGS. 15 and 16, the second sub-bridges SBE2 of the third bridges BE3 may be formed on the second buffer film BF2. The second sub-bridges SBE2 may be formed at (e.g., in or on) the same layer, and may include the same material, as that of the first bridges BE1 described with reference to FIG. 12. The second sub-bridges SBE2 may be formed of, for example, a stack of Al and Ti (e.g., Ti/Al/Ti), a stack of Al and ITO (e.g., ITO/Al/ITO), an APC alloy, or a stack of an APC alloy and ITO (e.g., ITO/APC/ITO), but the present disclosure is not limited thereto. In another embodiment, the second sub-bridges SBE2 may be formed as single layers of Mo, Ti, Cu, Al, or ITO.

The first sensor insulating film TINS1 may be formed on the second sub-bridges SBE2. The proximity sensing electrodes PE and the first sub-bridges SBE1 of the third bridges BE3 may be formed on the first sensor insulating film TINS1. The proximity sensing electrodes PE and the first sub-bridges SBE1 may be formed at (e.g., in or on) the same layer, and may include the same material, as that of the driving electrodes TE and the sensing electrodes RE. The proximity sensing electrodes PE and the first sub-bridges SBE1 may be formed of, for example, a stack of Al and Ti (e.g., Ti/Al/Ti), a stack of Al and ITO (e.g., ITO/Al/ITO), an APC alloy, or a stack of an APC alloy and ITO (e.g., ITO/APC/ITO), but the present disclosure is not limited thereto. In another embodiment, the proximity sensing electrodes PE and the first sub-bridges SBE1 may be formed as single layers of Mo, Ti, Cu, Al, or ITO.

Second contact holes CNT2 may be formed to penetrate (e.g., to extend through) the first sensor insulating film TINS1, and thus, the second sub-bridges SBE2 may be exposed through the second contact holes CNT2. The first sub-bridges SBE1 may be connected to the second sub-bridges SBE2 through the second contact holes CNT2.

A second sensing insulating film TINS2 is formed on the proximity sensing electrodes PE and the first sub-bridges SBE1. The second sensing insulating film TINS2 may planarize height differences generated by the proximity sensing electrodes PE and the first sub-bridges SBE1.

According to the embodiment of FIGS. 15 and 16, the second sub-bridges SBE2 of the third bridges BE3, which connect the proximity sensing electrodes PE that are adjacent in the first direction (e.g., the X-axis direction) to each other, may be disposed on the second buffer film BF2, and the proximity sensing electrodes PE and the first sub-bridges SBE1 may be disposed on the first sensor insulating film TINS1. Therefore, the third bridges BE3 and the driving electrodes TE may be electrically isolated from each other at the crossing regions therebetween.

Figure 17:
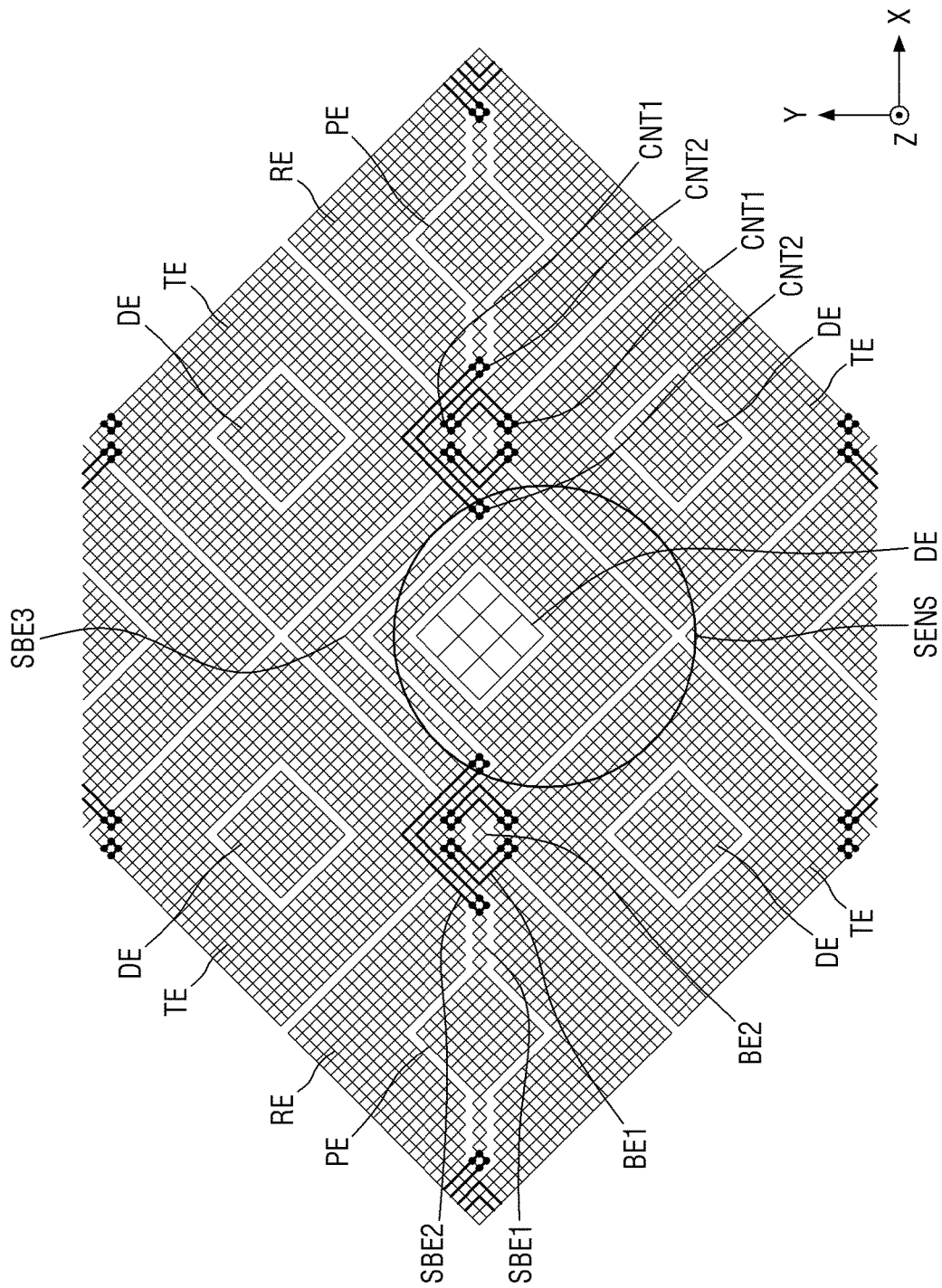
FIG. 17 is a plan view illustrating exemplary driving electrodes, exemplary sensing electrodes, exemplary proximity sensing electrodes, and exemplary dummy patterns at the second sensing area of FIG. 7.

FIG. 17 is a plan view illustrating exemplary driving electrodes, exemplary sensing electrodes, exemplary proximity sensing electrodes, and exemplary dummy patterns at (e.g., in or on) the second sensing area of FIG. 7.

The embodiment of FIG. 17 may be different from the embodiment of FIG. 13 in that, at (e.g., in or on) the second sensing area TSA2, the dummy patterns DE may overlap with a sensor SENS, instead of the proximity sensing electrodes PE.

Referring to FIG. 17, at (e.g., in or on) the second sensing area TSA2, the proximity sensing electrodes PE do not overlap with the sensor SENS in the third direction (e.g., the Z-axis direction). At (e.g., in or on) the second sensing area TSA2, a dummy pattern DE may overlap with the sensor SENS in the third direction (e.g., the Z-axis direction).

The dummy patterns DE may be surrounded (e.g., around a periphery thereof) by the sensing electrodes RE. The dummy patterns DE may be electrically floated. For example, no voltages may be applied to the dummy patterns DE.

The dummy pattern DE that overlaps with the sensor SENS may be disposed between a pair of adjacent proximity sensing electrodes PE (e.g., adjacent in the first direction or the X-axis direction). Accordingly, the third bridge BE3 may further include a third sub-bridge SBE3. In the case where the dummy pattern DE is between the pair of adjacent proximity sensing electrodes PE (e.g., adjacent in the first direction or the X-axis direction), the third sub-bridge SBE3 may be disposed to bypass the dummy pattern DE, and thus, may not be connected to the dummy pattern DE. FIG. 17 illustrates that the third sub-bridge SBE3 bypasses the dummy pattern DE at (e.g., on) the upper side of the dummy pattern DE, but the present disclosure is not limited thereto. For example, in another embodiment, the third sub-bridge SBE3 may bypass the dummy pattern DE at (e.g., on) the lower side of the dummy pattern DE. The third sub-bridge SBE3 may overlap with the sensor SENS.

For example, the third sub-bridge SBE3 may include at least one bent portion (e.g., may be bent at least once) to bypass the dummy pattern DE. FIG. 17 illustrates that the third sub-bridge SBE3 is bent in the shape of an angle bracket (e.g., "<" or ">"), but the shape of the third sub-bridge SBE3 is not limited thereto.

As illustrated in FIG. 17, the third sub-bridge SBE3 may be formed at (e.g., in or on) the same layer, and may include the same material, as that of the proximity sensing electrodes PE, and may be connected to the proximity sensing electrodes PE (e.g., via the second sub-bridge SBE2).

At (e.g., in or on) the second sensing area TSA2, the density of the dummy pattern DE that overlaps with the sensor SENS may be less than (e.g., may be smaller than) the density of the dummy patterns DE that do not overlap with the sensor SENS. For example, at (e.g., in or on) the second sensing area TSA2, the mesh hole size of the dummy pattern DE that overlaps with the sensor SENS may be greater than (e.g., may be larger than) the mesh hole size of the dummy patterns DE that do not overlap with the sensor SENS. In this case, at (e.g., in or on) the second sensing area TSA2, the density of the dummy pattern DE that overlaps with the sensor SENS may be less than (e.g., may be smaller than) the density of the proximity sensing electrodes PE. For example, at (e.g., in or on) the second sensing area TSA2, the mesh hole size of the dummy pattern DE that overlaps with the sensor SENS may be greater than (e.g., may be larger than) the mesh hole size of the proximity sensing electrodes PE. Further, at (e.g., in or on) the second sensing area TSA2, the density of the dummy pattern DE that overlaps with the sensor SENS may be less than (e.g., may be smaller than) the density of the driving electrodes TE and the density of the sensing electrodes RE. For example, at (e.g., in or on) the second sensing area TSA2, the mesh hole size of the dummy pattern DE that overlaps with the sensor SENS may be greater than (e.g., may be larger than) the mesh hole sizes of the driving electrodes TE and the sensing electrodes RE. Accordingly, because the transmittance of the sensing unit SENL of the display panel 300 that overlaps with the sensor SENS may be enhanced, the degradation of the sensing capability of the sensing unit SENL may be prevented or reduced, even when the sensor SENS is disposed at the bottom of the display panel 300.

As described above with reference to FIG. 9, because the presence of a proximity input from the user may be detected by applying the sensing driving signal TD to a plurality of columns of driving electrodes TE concurrently (e.g., simultaneously or at the same time), and sensing the voltage charged in the second mutual capacitance Cm2 via a plurality of rows of proximity sensing electrodes PE, the second mutual capacitance Cm2 may be greater than the first mutual capacitance Cm1. Accordingly, even when one of the proximity sensing electrodes PE is replaced with a dummy pattern DE, the degradation of the performance of proximity sensing may be prevented or reduced.

In another embodiment, at (e.g., in or on) the second sensing area TSA2, the dummy patterns DE may have the same or substantially the same density as each other. For example, at (e.g., in or on) the second sensing area TSA2, the dummy patterns DE may have the same or substantially the same mesh hole size as each other (e.g., irrespective of whether or not the dummy pattern DE overlaps with the sensor SENS). In this example, at (e.g., in or on) the second sensing area TSA2, the density of the proximity sensing electrodes PE may be less than (e.g., may be smaller than) the density of the dummy patterns DE. For example, at (e.g., in or on) the second sensing area TSA2, the mesh hole size of the proximity sensing electrodes PE may be greater than (e.g., may be larger than) the mesh hole size of the dummy patterns DE. Further, at (e.g., in or on) the second sensing area TSA2, the density of the proximity sensing electrodes PE may be less than (e.g., may be smaller than) the density of the driving electrode TE and the density of the sensing electrodes RE. For example, at (e.g., in or on) the second sensing area TSA2, the mesh hole size of the proximity sensing electrodes PE may be greater than (e.g., may be larger than) the mesh hole sizes of the driving electrodes TE and the sensing electrodes RE.

In another embodiment, at (e.g., in or on) the second sensing area TSA2, the density of the dummy patterns DE may be the same or substantially the same as the density of the proximity sensing electrodes PE. For example, at (e.g., in or on) the second sensing area TSA2, the mesh hole size of the dummy patterns DE may be the same or substantially the same as the mesh hole size of the proximity sensing electrodes PE. In this example, at (e.g., in or on) the second sensing area TSA2, each of the density of the dummy pattern DE and the density of the proximity sensing electrodes PE may be less than (e.g., may be smaller than) the density of the driving electrode TE and the density of the sensing electrodes RE. For example, at (e.g., in or on) the second sensing area TSA2, the mesh hole sizes of the dummy patterns DE and the proximity sensing electrodes PE may be greater than (e.g., may be larger than) the mesh hole sizes of the driving electrodes TE and the sensing electrodes RE.

As illustrated in FIG. 17, because the density of the dummy electrode DE that overlaps with the sensor SENS is less than (e.g., is smaller than) the density of the driving electrodes TE and/or the sensing electrodes RE at (e.g., in or on) the second sensing area TSA2, the transmittance of the sensing unit SENL of the display panel 300 that overlaps with the sensor SENS may be enhanced, and as a result, the degradation of the sensing capability of the sensing unit SENL may be prevented or reduced, even when the sensor SENS is disposed at the bottom of the display panel 300.

Figure 18:
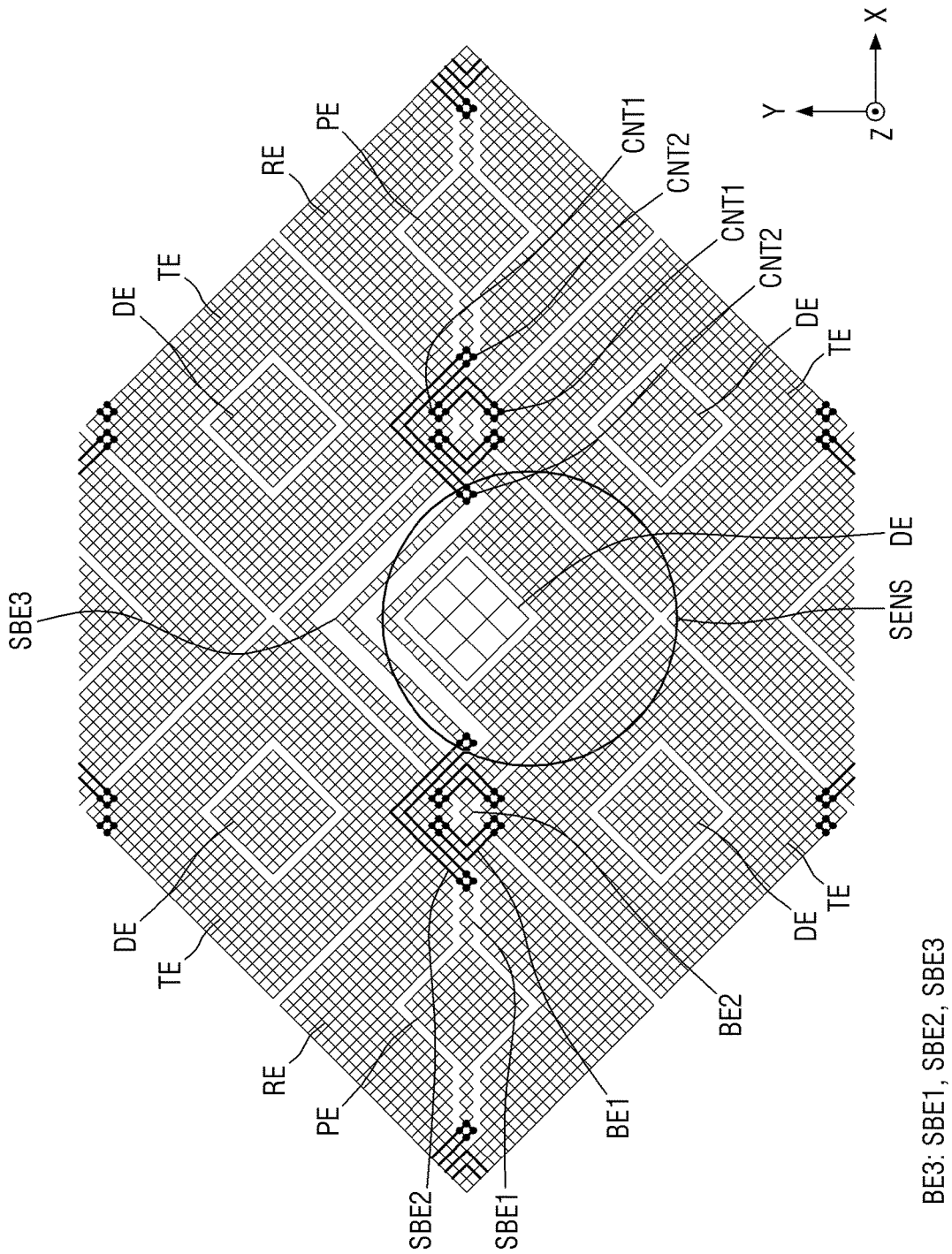
FIG. 18 is a plan view illustrating exemplary driving electrodes, exemplary sensing electrodes, exemplary proximity sensing electrodes, and exemplary dummy patterns at the second sensing area of FIG. 7.

FIG. 18 is a plan view illustrating exemplary driving electrodes, exemplary sensing electrodes, exemplary proximity sensing electrodes, and exemplary dummy patterns at (e.g., in or on) the second sensing area of FIG. 7.

The embodiment of FIG. 18 may be different from the embodiment of FIG. 17 in that the distance between the third sub-bridge SBE3 and the sensing electrodes RE in FIG. 18 may be greater than a maximum length of the mesh holes of each of the sensing electrodes RE.

Referring to FIG. 18, the distance between the third sub-bridge SBE3 and the sensing electrodes RE may be greater than the maximum length of the mesh holes of each of the sensing electrodes RE. Further, the distance between the third sub-bridge SBE3 and the sensing electrodes RE may be greater than the maximum length of the mesh holes of each of driving electrodes TE, the maximum length of the mesh holes of the third sub-bridge SBE3, and the maximum length of the mesh holes of each of proximity sensing electrodes PE. Accordingly, the transmittance of the sensing unit SENL of the display panel 300 that overlaps with a sensor SENS may be enhanced, and as a result, the degradation of the sensing capability of the sensing unit SENL may be prevented or reduced, even when the sensor SENS is disposed at the bottom of the display panel 300.

Figure 19:
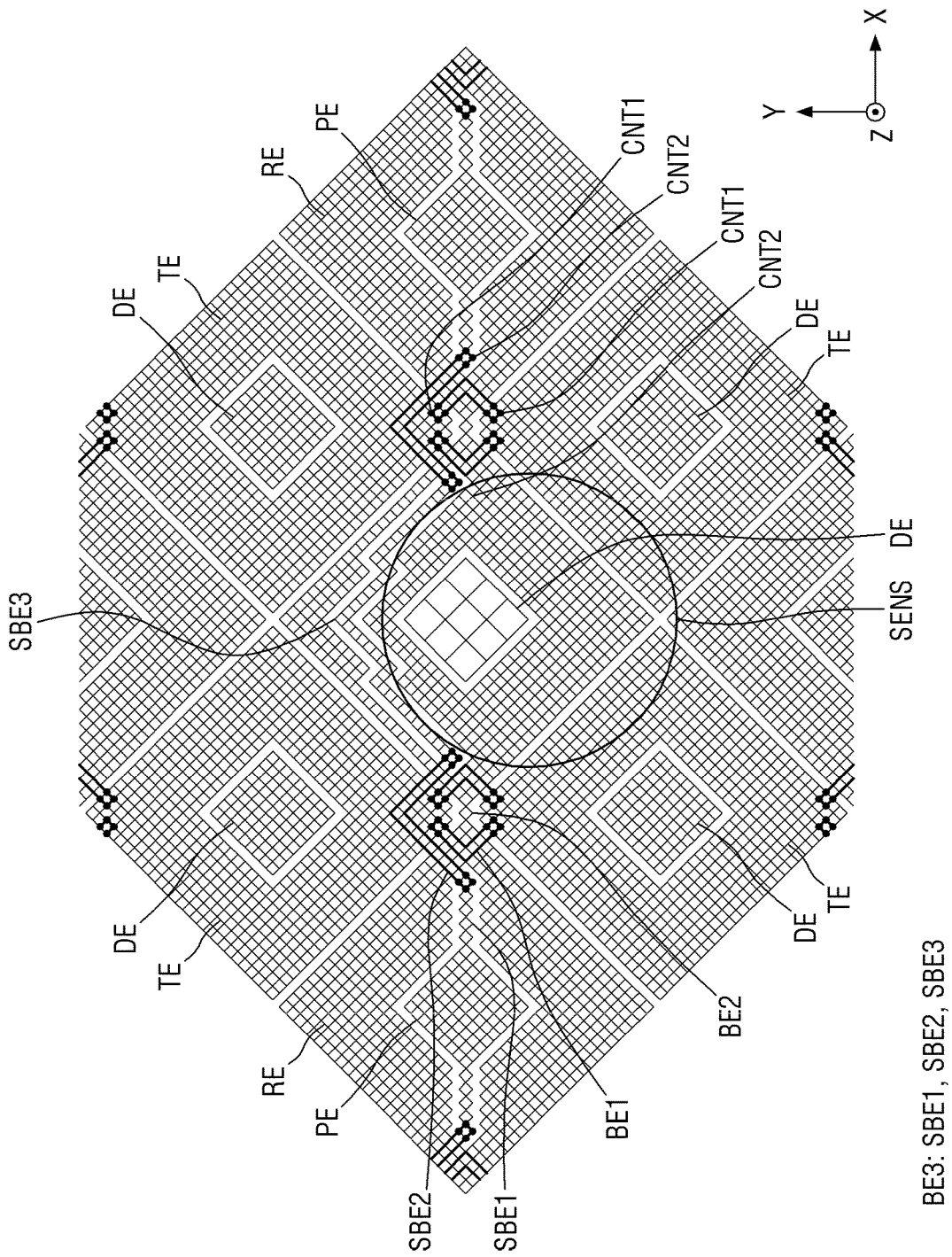
FIG. 19 is a plan view illustrating exemplary driving electrodes, exemplary sensing electrodes, exemplary proximity sensing electrodes, and exemplary dummy patterns at the second sensing area of FIG. 7.

FIG. 19 is a plan view illustrating exemplary driving electrodes, exemplary sensing electrodes, exemplary proximity sensing electrodes, and exemplary dummy patterns at (e.g., in or on) the second sensing area of FIG. 7.

The embodiment of FIG. 19 may be different from the embodiment of FIG. 17 in that the third sub-bridge SBE3 does not overlap with a sensor SENS.

Referring to FIG. 19, the third sub-bridge SBE3 may not overlap with the sensor SENS, and may bypass a dummy pattern DE.

Figure 20:
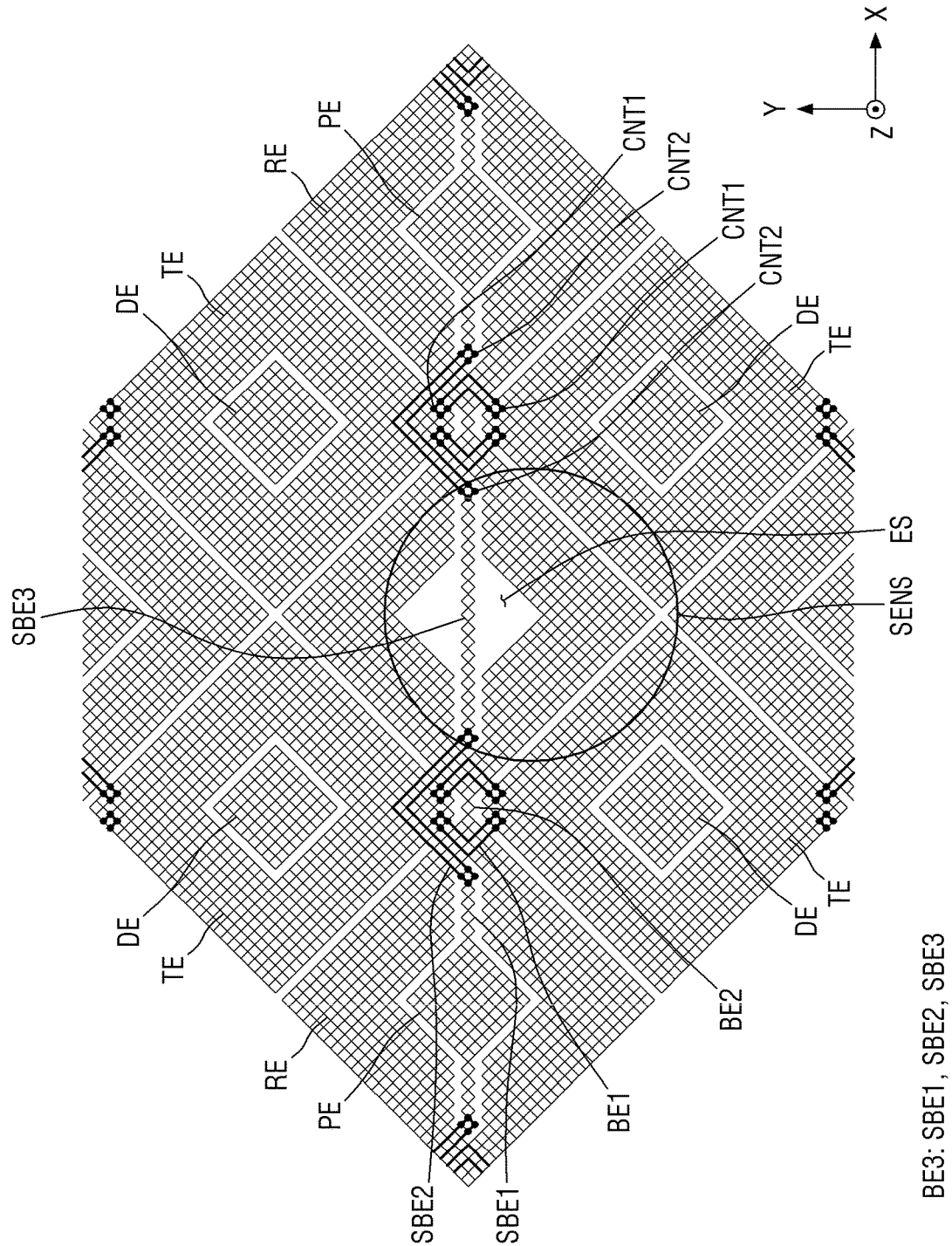
FIG. 20 is a plan view illustrating exemplary driving electrodes, exemplary sensing electrodes, exemplary proximity sensing electrodes, and exemplary dummy patterns at the second sensing area of FIG. 7.

FIG. 20 is a plan view illustrating exemplary driving electrodes, exemplary sensing electrodes, exemplary proximity sensing electrodes, and exemplary dummy patterns at (e.g., in or on) the second sensing area of FIG. 7.

The embodiment of FIG. 20 may be different from the embodiment of FIG. 13 in that, at (e.g., in or on) the second sensing area TSA2, an empty space ES surrounded (e.g., around a periphery thereof) by a sensing electrode RE may overlap with the sensor SENS, instead of a proximity sensing electrode PE.

Referring to FIG. 20, at (e.g., in or on) the second sensing area TSA2, the proximity sensing electrodes PE and the dummy patterns DE may not overlap with the sensor SENS in the third direction (e.g., the Z-axis direction). At (e.g., in or on) the second sensing area TSA2, the empty space ES may overlap with the sensor SENS in the third direction (e.g., the Z-axis direction). Accordingly, the transmittance of the sensing unit SENL of the display panel 300 that overlaps with the sensor SENS may be enhanced, and as a result, the degradation of the sensing capability of the sensing unit SENL may be prevented or reduced, even when the sensor SENS is disposed at the bottom of the display panel 300.

The empty space ES that overlaps with the sensor SENS may be disposed between a pair of adjacent proximity sensing electrodes PE (e.g., adjacent in the first direction or the X-axis direction). In this case, the third bridge BE3 may further includes a third sub-bridge SBE3.

In the case where the empty space ES is between the pair of adjacent proximity sensing electrodes PE (e.g., adjacent in the first direction or the X-axis direction), the third sub-bridge SBE3 may be disposed to extend across the empty space ES.

As illustrated in FIG. 20, the third sub-bridge SBE3 may be formed at (e.g., in or on) the same layer, and may include the same material, as that of the proximity sensing electrodes PE, and may be connected to the proximity sensing electrodes PE (e.g., via the second sub-bridge SBE2).

Figure 21:
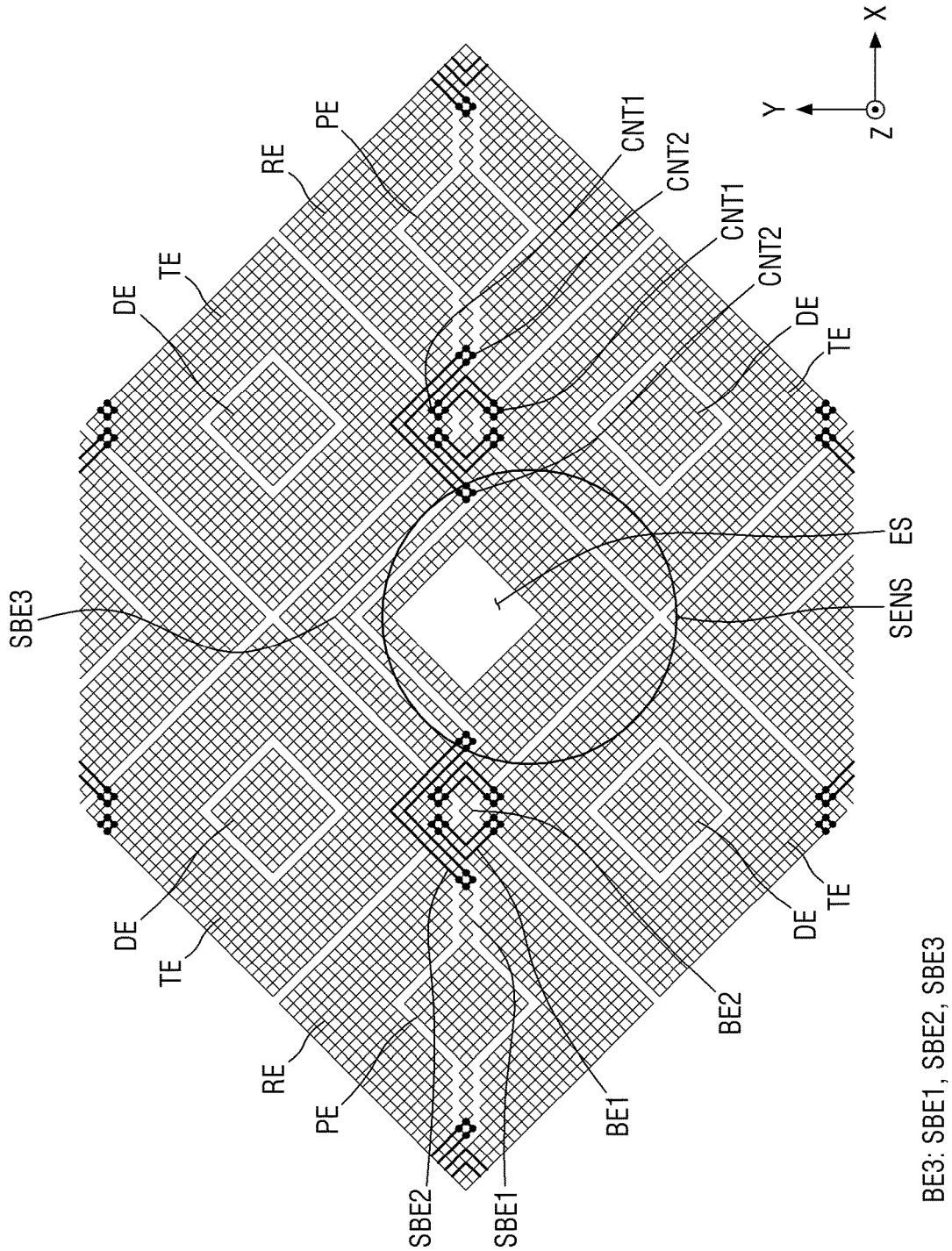
FIG. 21 is a plan view illustrating exemplary driving electrodes, exemplary sensing electrodes, exemplary proximity sensing electrodes, and exemplary dummy patterns at the second sensing area of FIG. 7.

FIG. 21 is a plan view illustrating exemplary driving electrodes, exemplary sensing electrodes, exemplary proximity sensing electrodes, and exemplary dummy patterns at (e.g., in or on) the second sensing area of FIG. 7.

The embodiment of FIG. 21 may be different from the embodiment of FIG. 17 in that, at (e.g., in or on) the second sensing area TSA2, an empty space ES surrounded (e.g., around a periphery thereof) by a sensing electrode RE may overlap with the sensor SENS, instead of the proximity sensing electrode PE.

Referring to FIG. 21, at (e.g., in or on) the second sensing area TSA2, the proximity sensing electrodes PE and the dummy patterns DE may not overlap with the sensor SENS in the third direction (e.g., the Z-axis direction). At (e.g., in or on) the second sensing area TSA2, the empty space ES may overlap with the sensor SENS in the third direction (e.g., the Z-axis direction). Accordingly, the transmittance of the sensing unit SENL of the display panel 300 that overlaps with the sensor SENS may be enhanced, and as a result, the degradation of the sensing capability of the sensing unit SENL may be prevented or reduced, even when the sensor SENS is disposed at the bottom of the display panel 300.

Figure 22:
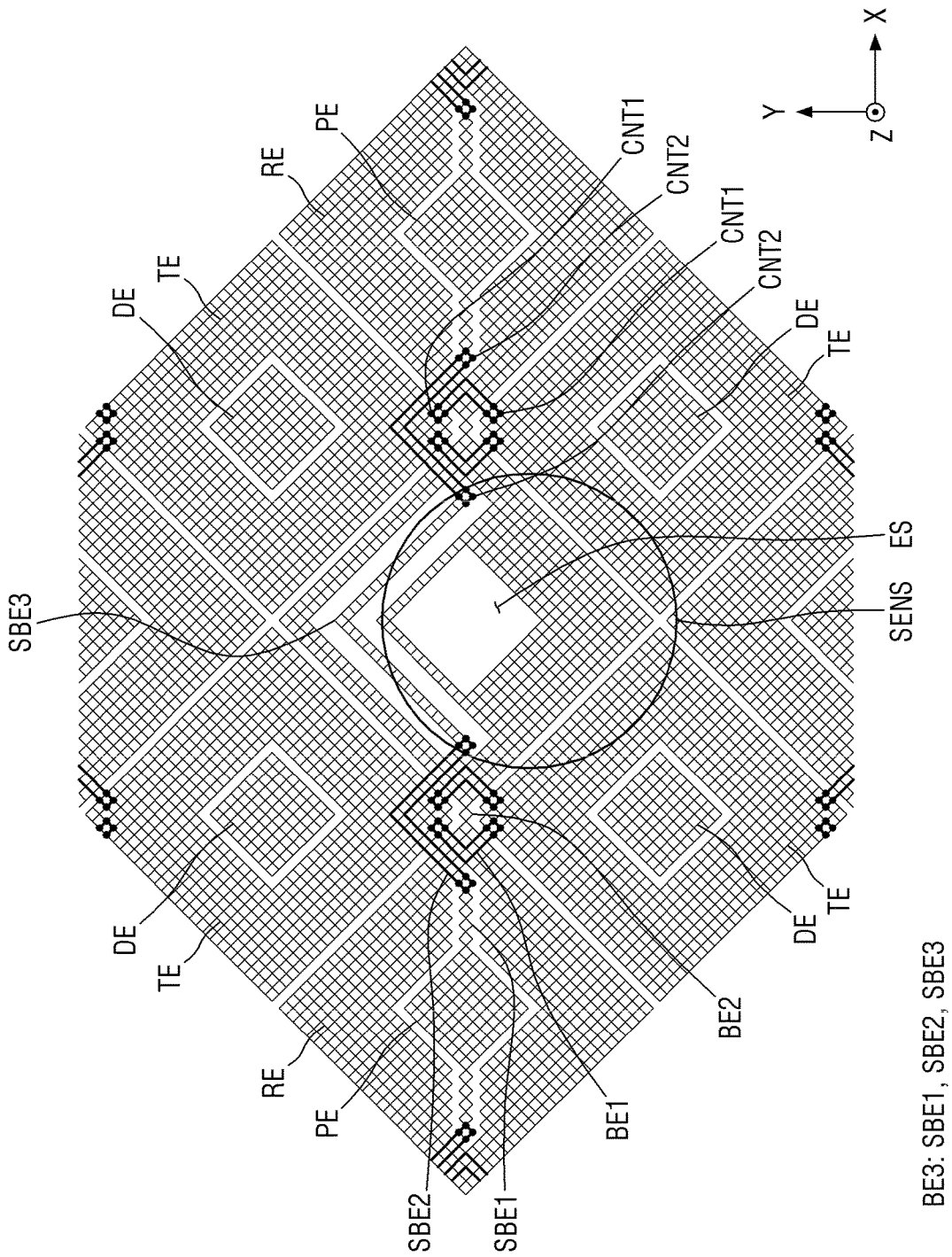
FIG. 22 is a plan view illustrating exemplary driving electrodes, exemplary sensing electrodes, exemplary proximity sensing electrodes, and exemplary dummy patterns at the second sensing area of FIG. 7.

FIG. 22 is a plan view illustrating exemplary driving electrodes, exemplary sensing electrodes, exemplary proximity sensing electrodes, and exemplary dummy patterns at (e.g., in or on) the second sensing area of FIG. 7.

The embodiment of FIG. 22 may be different from the embodiment of FIG. 18 in that, at (e.g., in or on) the second sensing area TSA2, an empty space ES surrounded (e.g., around a periphery thereof) by a sensing electrode RE overlaps with the sensor SENS, instead of the proximity sensing electrode PE.

Referring to FIG. 22, at (e.g., in or on) the second sensing area TSA2, the proximity sensing electrodes PE and the dummy patterns DE may not overlap with the sensor SENS in the third direction (e.g., the Z-axis direction). At (e.g., in or on) the second sensing area TSA2, the empty space ES may overlap with the sensor SENS in the third direction (e.g., the Z-axis direction). Accordingly, the transmittance of the sensing unit SENL of the display panel 300 that overlaps with the sensor SENS may be enhanced, and as a result, the degradation of the sensing capability of the sensing unit SENL may be prevented or reduced, even when the sensor SENS is disposed at the bottom of the display panel 300.

Figure 23:
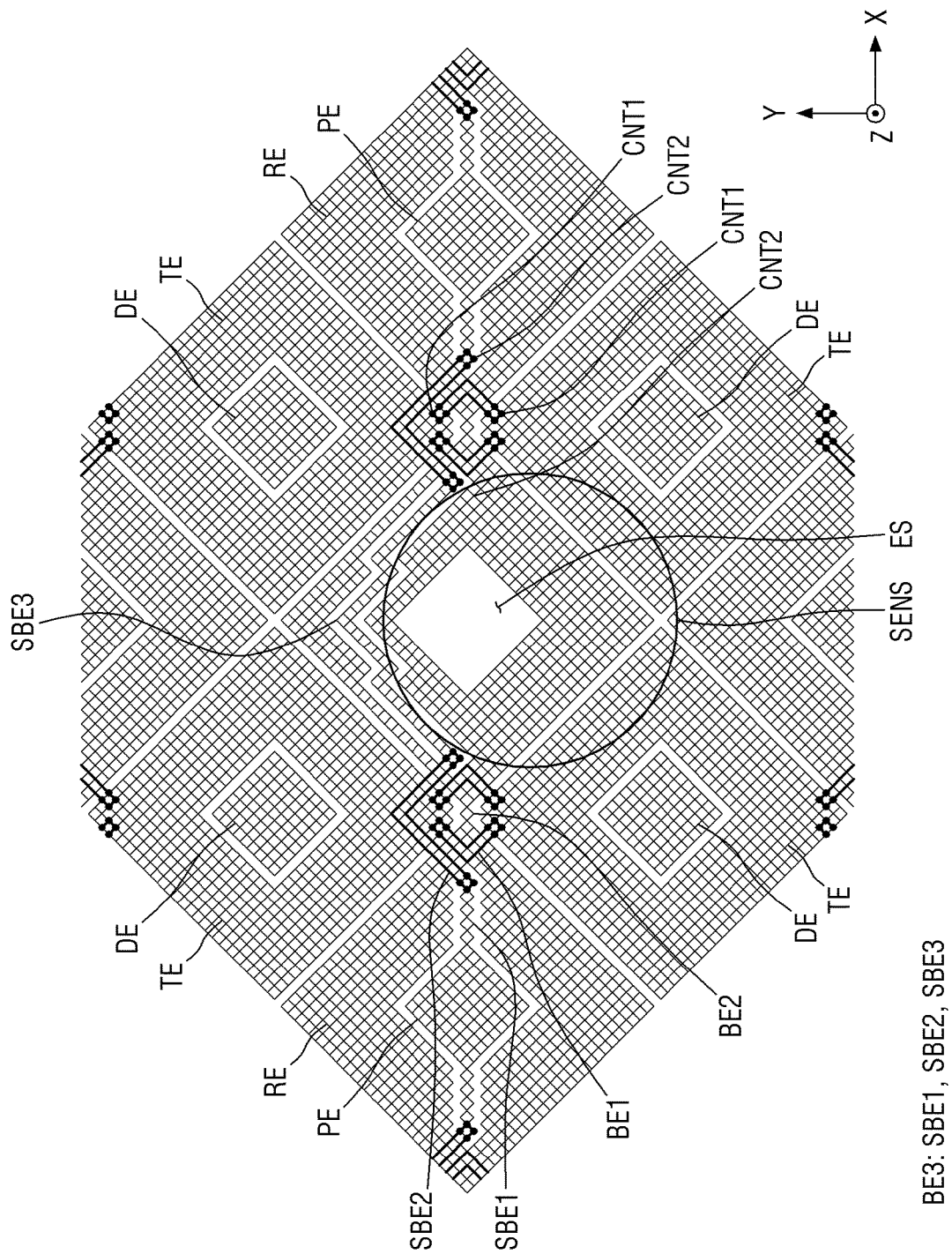
FIG. 23 is a plan view illustrating exemplary driving electrodes, exemplary sensing electrodes, exemplary proximity sensing electrodes, and exemplary dummy patterns at the second sensing area of FIG. 7.

FIG. 23 is a plan view illustrating exemplary driving electrodes, exemplary sensing electrodes, exemplary proximity sensing electrodes, and exemplary dummy patterns at (e.g., in or on) the second sensing area of FIG. 7.

The embodiment of FIG. 23 may be different from the embodiment of FIG. 19 in that, at (e.g., in or on) the second sensing area TSA2, an empty space ES surrounded (e.g., around a periphery thereof) by a sensing electrode RE overlaps with a sensor SENS, instead of the proximity sensing electrode PE.

Referring to FIG. 23, at (e.g., in or on) the second sensing area TSA2, the proximity sensing electrodes PE and the dummy patterns DE may not overlap with the sensor SENS in the third direction (e.g., the Z-axis direction). At (e.g., in or on) the second sensing area TSA2, the empty space ES may overlap with the sensor SENS in the third direction (e.g., the Z-axis direction). Accordingly, the transmittance of the sensing unit SENL of the display panel 300 that overlaps with the sensor SENS may be enhanced, and as a result, the degradation of the sensing capability of the sensing unit SENL may be prevented or reduced, even when the sensor SENS is disposed at the bottom of the display panel 300.

Figure 24:
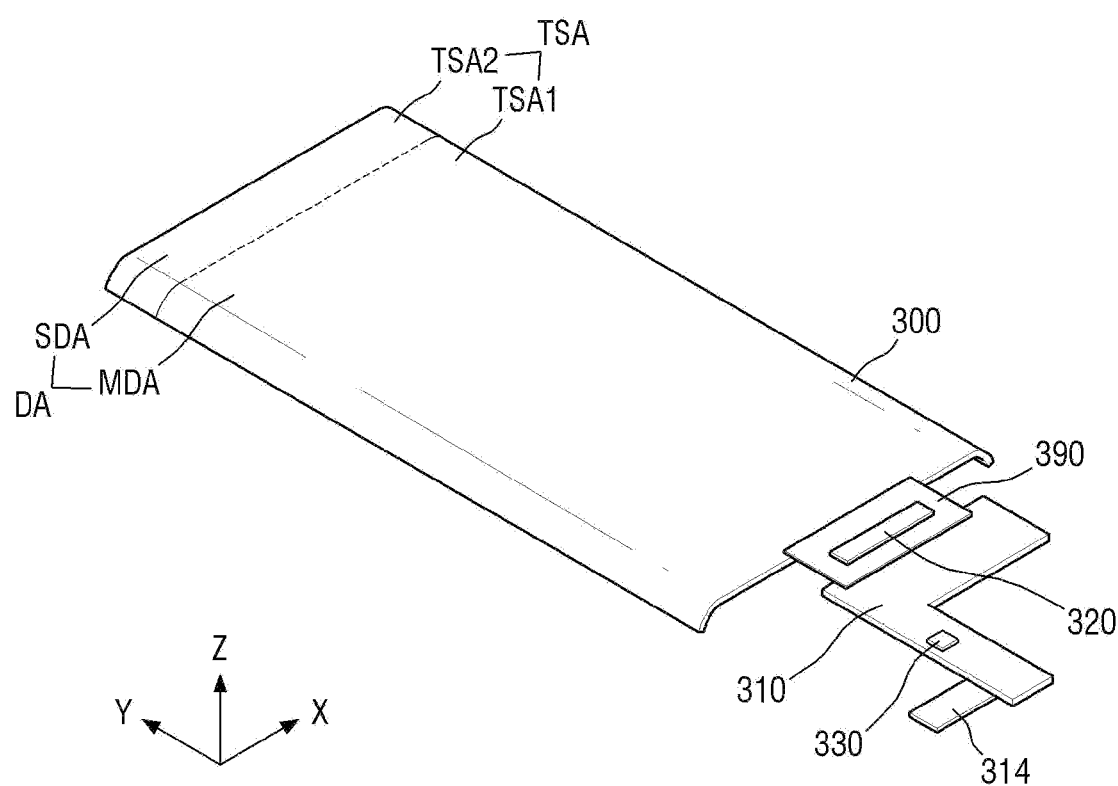
FIG. 24 is a perspective view illustrating a display panel and a display driving unit of a display device according to another embodiment of the present disclosure.

FIG. 24 is a perspective view illustrating a display panel and a display driving unit (e.g., a display driver) of a display device according to another embodiment of the present disclosure.

Referring to FIG. 24, a main display area MDA may include subpixels PX1, PX2, and PX3, and a non-emission part NEA (e.g., as illustrated in FIG. 5), and a sub-display area SDA may include subpixels PX1, PX2, and PX3, a non-emission part NEA, and transmissive parts TA (e.g., as illustrated in FIG. 6). Because the sub-display area SDA includes the transmissive parts TA, sensors 740, 750, 760, and 770, which overlap with the sub-display area SDA in the third direction (e.g., the Z-axis direction), may receive light from the top surface of a display panel 300 through the transmissive parts TA.

As illustrated in FIG. 7, a first sensing area TSA1, which overlaps with the main display area MDA, may include sensor electrodes TE and RE and dummy patterns DE, and a second sensing area TSA2, which overlaps with the sub-display area SDA, may include sensor electrodes TE and RE, dummy patterns DE, and proximity sensing electrodes PE. At (e.g., in or on) the second sensing area TSA2, the density of a proximity sensing electrode PE or a dummy pattern DE that overlaps with a sensor SENS may be lowered, or the proximity sensing electrode PE or the dummy pattern DE may be omitted, thereby improving the transmittance of a sensing unit (e.g., a sensing circuit or a sensing layer) SENL of the display panel 300 that overlaps with the sensor SENS.

Because the sub-display area SDA includes the transmissive parts TA, the pixels per inch (PPI) of the sub-display area SDA may be lower than the PPI of the main display area MDA. PPI refers to the number of pixels that fit on a 1-inch area, such that the higher the PPI of a display device, the higher the quality of an image displayed by the display device. In order to reduce the noticeability (e.g., the viewability) of any decrease in the quality of an image, the sub-display area SDA may be disposed at (e.g., in or on) one side of the display area DA, for example, at (e.g., in or on) the upper side of the display area DA as illustrated in FIG. 24, because it may be more difficult to display a high-quality image at (e.g., in or on) the sub-display area SDA than at (e.g., in or on) the main display area MDA.

However, the location of the sub-display area SDA is not limited thereto. For example, in various embodiments, the sub-display area SDA may be disposed at (e.g., in or on) the lower side, the left side, and/or the right side of the display area DA.

Figure 25:
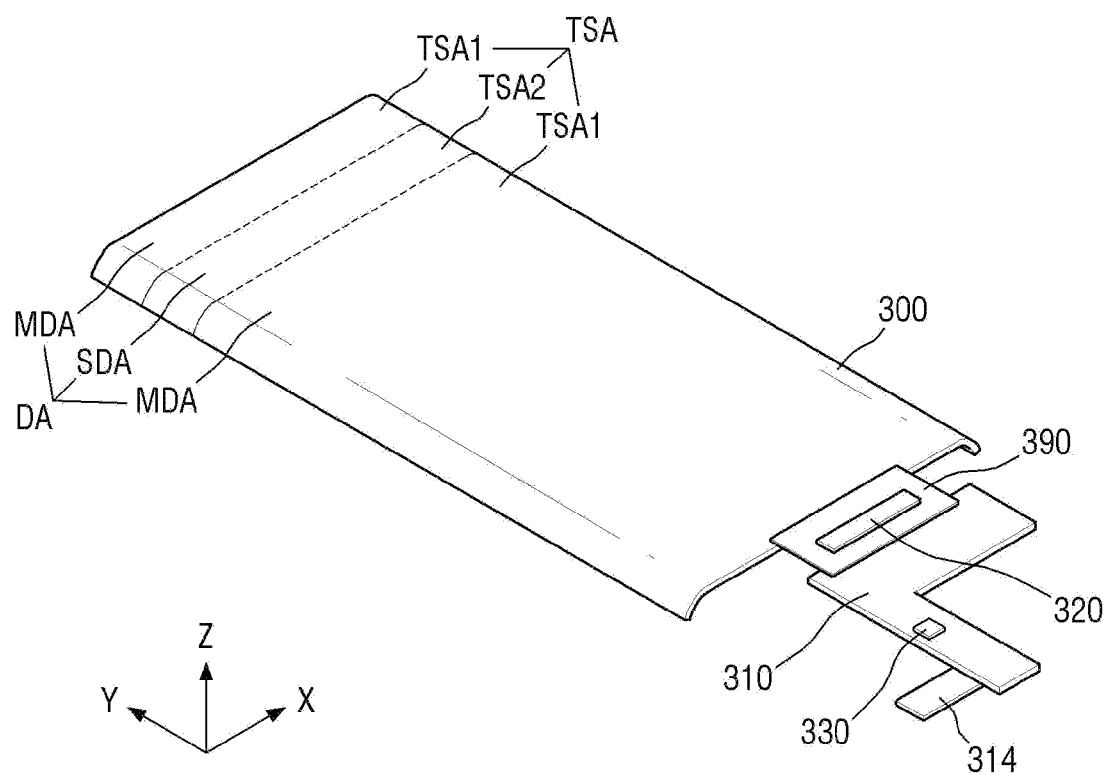
FIG. 25 is a perspective view illustrating a display panel and a display driving unit of a display device according to another embodiment of the present disclosure.

In another embodiment, as illustrated in FIG. 25, the sub-display area SDA may be disposed between a plurality of main display areas MDA.

Figure 26:
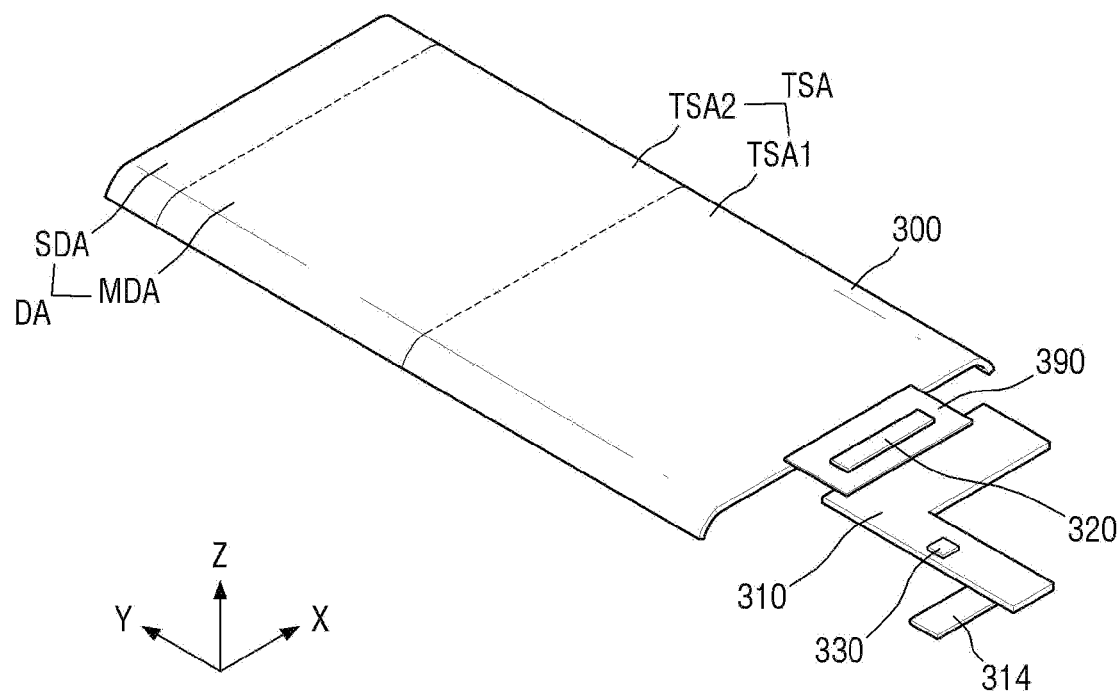
FIG. 26 is a perspective view illustrating a display panel and a display driving unit of a display device according to another embodiment of the present disclosure.

In another embodiment, as illustrated in FIG. 26, the sub-display area SDA may be disposed at (e.g., in or on) one side of the display area DA, and the sensing area TSA may be divided into two equal sub-sensing areas (e.g., the first and second sensing areas TSA1 and TSA2) along the second direction (e.g., the Y-axis direction). In this case, because second mutual capacitance between driving electrodes TE and proximity sensing electrodes PE may be formed on half of the top surface of the display panel 300, the presence of a proximity input from a user may be detected from the half of the top surface of the display panel 300 according to (e.g., based on) the second mutual capacitance.

Figure 27:
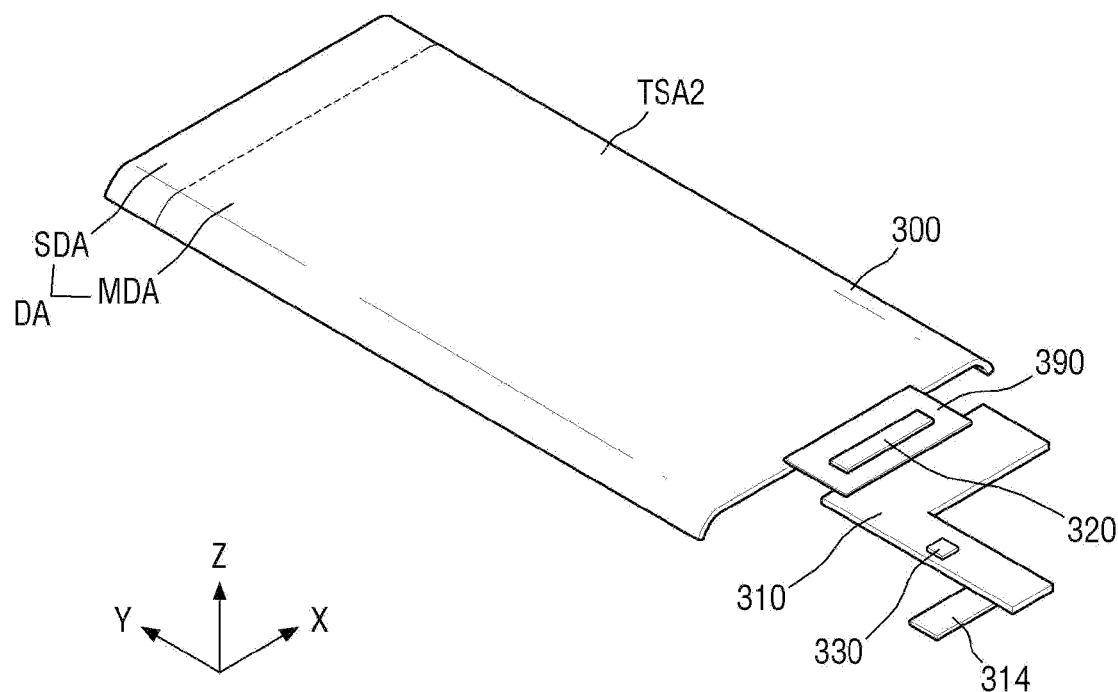
FIG. 27 is a perspective view illustrating a display panel and a display driving unit of a display device according to another embodiment of the present disclosure.

In another embodiment, as illustrated in FIG. 27, the second sensing area TSA2 may be disposed to overlap with the main display area MDA and the sub-display area SDA, and the first sensing area TSA1 may be omitted (e.g., may not be provided). In this case, because the second mutual capacitance may be formed on an entire top surface of the display panel 300, the presence of a proximity input from a user may be detected from the entire top surface of the display panel 300 according to (e.g., based on) the second mutual capacitance.

Figure 28:
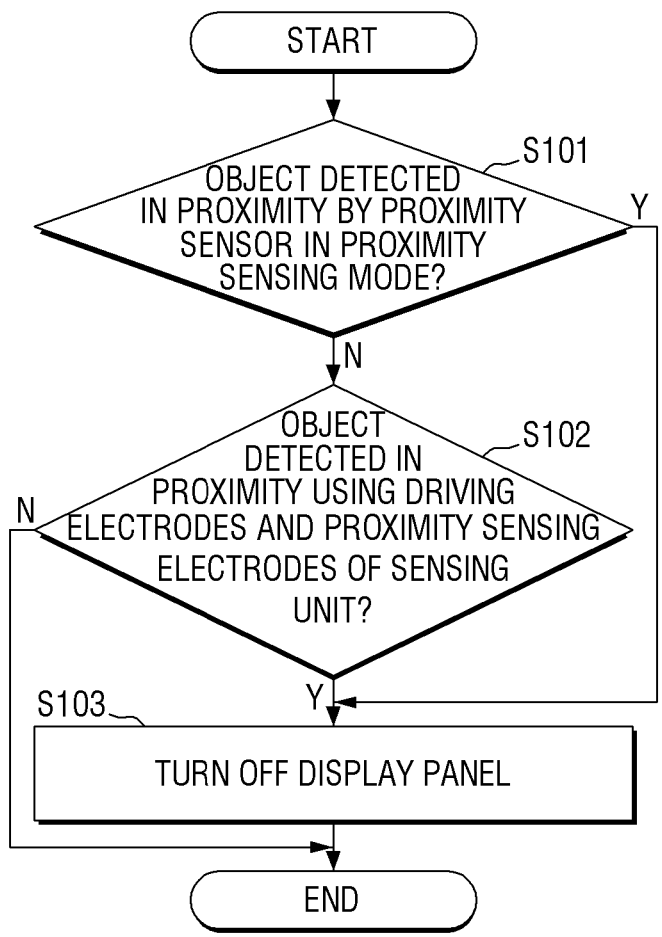
FIG. 28 is a flowchart illustrating a method of driving a display device according to an embodiment of the present disclosure.

FIG. 28 is a flowchart illustrating a method of driving a display device according to an embodiment of the present disclosure.

Referring to FIG. 28, in a proximity sensing mode, a determination is first made as to whether an object is within (e.g., whether there exists an object in) the proximity of the top surface of a display device 10 in accordance with a proximity sensor signal from a proximity sensor 740.

The proximity sensor 740 includes a light source, which outputs light, and a light receiver, which receives light reflected from an object, and the proximity sensor 740 may determine whether an object is within the proximity of the top surface of the display device 10 according to (e.g., based on) the amount of light reflected from the object. For example, if the amount of light received by the light receiver is less than (e.g., is smaller than) a first threshold value, the proximity sensor 740 may determine that the object is within the proximity of the top surface of the display device 10. Thus, if the amount of light received by the light receiver is less than (e.g., smaller than) the first threshold value, the proximity sensor 740 may output a proximity sensor signal having a first logic level, and if the amount of light received by the light receiver is greater than the first threshold value, the proximity sensor 740 may output a proximity sensor signal having a second logic level.

A main processor 710 may determine whether the object is within the proximity of the top surface of the display device 10 according to (e.g., based on) the proximity sensor signal from the proximity sensor 740 (S101). In the case where it is determined that the object is within the proximity of the top surface of the display device 10 (e.g., YES at S101), the main processor 710 may block digital video data and timing signals from being provided to a display driving unit (e.g., a display driver) 320 to drive a display panel 300. As a result, the display 300 may be turned off (S103).

In the proximity sensing mode, if the proximity sensor 740 does not detect the object, a determination is then made as to whether an object is within (e.g., whether there exists an object in) the proximity of the display device 10 by using the sensor electrodes TE and RE and the proximity sensing electrodes PE of a sensing unit (e.g., a sensing circuit or a sensing layer) SENL of the display panel 300.

In the case where a determination is made that no object is within the proximity of the top surface of the display device 10 according to (e.g., based on) the proximity sensor signal from the proximity sensor 740 (e.g., NO at S101), the main processor 710 may determine whether an object is within the proximity of the top surface of the display device 10 according to (e.g., based on) second mutual capacitance between the sensor electrodes TE and RE and the proximity sensing electrodes PE of the sensing unit SENL of the display panel 300. The main processor 710 may receive proximity sensing data from a sensing driving unit (e.g., a sensing driver) 330 by driving the sensing driving unit 330 (e.g., as illustrated in FIG. 9). The main processor 710 may determine whether an object is within the proximity of the top surface of the display device 10 according to (e.g., based on) the proximity sensing data (S102). For example, the main processor 710 may determine whether an object is within the proximity of the top surface of the display device 10 by comparing the proximity sensing data with a second threshold value.

In the case where it is determined that an object is within the proximity of the top surface of the display device 10 (e.g., YES at S102), the main processor 710 may block the digital video data and the timing signals from being provided to the display driving unit 320 to drive the display panel 300. As a result, the display 300 may be turned off (S103). On the other hand, in the case where no object is detected using the proximity sensing data (e.g., NO at S102), the method may end (or may repeat at S101).

In the case where the proximity sensor 740 overlaps with a display area DA of the display panel 300 (e.g., as illustrated in FIG. 28), the sensing capability of the proximity sensor 740 may be lowered, but the display device 10 may determine whether an object is within the proximity of the top surface of the display device 10 using not only the proximity sensor 740, but also by using the sensing unit SENL of the display panel 300. Accordingly, a decrease (e.g., any decrease) in the sensing capability of the proximity sensor 740 may be compensated for by the sensing unit SENL of the display panel 300.

Although some example embodiments have been described, those skilled in the art will readily appreciate that various modifications are possible in the example embodiments without departing from the spirit and scope of the present disclosure. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A sensing circuit comprising:
   a plurality of sensing electrodes arranged along a first direction and electrically connected to each other, a space being adjacent to a first sensing electrode of the plurality of sensing electrodes;
   a plurality of driving electrodes arranged along a second direction crossing the first direction and electrically connected to each other;
   a first proximity sensing electrode adjacent to a second sensing electrode of the plurality of sensing electrodes, the first proximity sensing electrode being located at one side of the space;
   a second proximity sensing electrode adjacent to a third sensing electrode of the plurality of sensing electrodes, the second proximity sensing electrode being located at an other side of the space; and
   a first bridge comprising a first end connected to the first proximity sensing electrode and a second end connected to the second proximity sensing electrode,
   wherein the first sensing electrode surrounds around a periphery of the space.

2. The sensing circuit of claim 1, wherein the first bridge does not overlap the space.

3. The sensing circuit of claim 1, wherein the first bridge bypasses the space.

4. The sensing circuit of claim 1, wherein the first bridge comprises:
   a first sub-bridge extending from the first proximity sensing electrode;
   a second sub-bridge connected to the first sub-bridge through a first contact hole; and
   a third sub-bridge connected to the second sub-bridge through a second contact hole.

5. The sensing circuit of claim 4, wherein the third sub-bridge does not overlap the space.

6. The sensing circuit of claim 4, wherein the third sub-bridge bypasses the space.

7. The sensing circuit of claim 4, wherein the first sub-bridge is adjacent to the second sensing electrode and spaced apart from the second sensing electrode, and
   wherein the second sub-bridge overlaps a first driving electrode of the plurality of driving electrodes.

8. The sensing circuit of claim 1, wherein a first capacitance is formed between the first sensing electrode and a first driving electrode adjacent to the first sensing electrode from among the plurality of driving electrodes.

9. The sensing circuit of claim 1, wherein a second capacitance is formed between the second sensing electrode and the first proximity sensing electrode and between the third sensing electrode and the second proximity sensing electrode.

10. A sensing circuit comprising:
    a plurality of sensing electrodes arranged along a first direction and electrically connected to each other, a space being adjacent to a first sensing electrode of the plurality of sensing electrodes;
    a plurality of driving electrodes arranged along a second direction crossing the first direction and electrically connected to each other;
    a first proximity sensing electrode adjacent to a second sensing electrode of the plurality of sensing electrodes, the first proximity sensing electrode being located at one side of the space;
    a second proximity sensing electrode adjacent to a third sensing electrode of the plurality of sensing electrodes, the second proximity sensing electrode being located at an other side of the space; and
    a first bridge comprising a first end connected to the first proximity sensing electrode and a second end connected to the second proximity sensing electrode,
    wherein the first bridge overlaps the space.

11. The sensing circuit of claim 10, wherein the first bridge comprises:
   a first sub-bridge extending from the first proximity sensing electrode;
   a second sub-bridge connected to the first sub-bridge through a first contact hole; and
   a third sub-bridge connected to the second sub-bridge through a second contact hole.

12. The sensing circuit of claim 11, wherein the first bridge further comprises:
   a fourth sub-bridge extending from the second proximity sensing electrode; and
   a fifth sub-bridge connected to the fourth sub-bridge, and wherein the third sub-bridge connects the second sub-bridge and the fifth sub-bridge.

13. The sensing circuit of claim 11, wherein the third sub-bridge overlaps the space.

14. The sensing circuit of claim 11, wherein the first sub-bridge is adjacent to the second sensing electrode and spaced apart from the second sensing electrode, and
   wherein the second sub-bridge overlaps a first driving electrode of the plurality of driving electrodes.

15. A display device comprising:
   a substrate;
   a display circuit on a first surface of the substrate, the display circuit including a main display area and a sub-display area;
   a sensing circuit on the display circuit, the sensing circuit including a first sensing area overlapping with the main display area, and a second sensing area overlapping with the sub-display area; and
   a sensor on a second surface of the substrate opposite to the first surface of the substrate,
   wherein the sensing circuit comprises:
   a plurality of sensing electrodes arranged along a first direction and electrically connected to each other, a space being adjacent to a first sensing electrode of the plurality of sensing electrodes in the second sensing area; and
   a plurality of driving electrodes arranged along a second direction crossing the first direction and electrically connected to each other.

16. The display device of claim 15, wherein the sensor overlaps the space.

17. The display device of claim 15,
   wherein the sensing circuit further comprises:
   a first proximity sensing electrode adjacent to a second sensing electrode of the plurality of sensing electrodes, the first proximity sensing electrode being located at one side of the space;
   a second proximity sensing electrode adjacent to a third sensing electrode of the plurality of sensing electrodes, the second proximity sensing electrode being located at an other side of the space; and
   a first bridge comprising a first end connected to the first proximity sensing electrode and a second end connected to the second proximity sensing electrode.

18. The display device of claim 17, wherein the first bridge overlaps the space.

19. The display device of claim 17, wherein the first bridge does not overlap the space.

20. The display device of claim 17, wherein the first bridge bypasses the space.

* * * * *